(12) United States Patent
Futatsuyama

(10) Patent No.: US 7,590,007 B2
(45) Date of Patent: Sep. 15, 2009

(54) NONVOLATILE SEMICONDUCTOR MEMORY DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/013,017

(22) Filed: Jan. 11, 2008

(65) Prior Publication Data

US 2008/0205139 A1     Aug. 28, 2008

(30) Foreign Application Priority Data

Jan. 11, 2007 (JP) .............................. 2007-003483
Jul. 6, 2007 (JP) .............................. 2007-178974
Jan. 9, 2008 (JP) .............................. 2008-002537

(51) Int. Cl.
     *G11C 11/34* (2006.01)
(52) U.S. Cl. .............................. 365/185.22; 365/185.19
(58) Field of Classification Search ............ 365/185.22, 365/185.19, 185.03
     See application file for complete search history.

(56) References Cited

U.S. PATENT DOCUMENTS

| | | | |
|---|---|---|---|
| 6,172,911 B1 * | 1/2001 | Tanaka et al. .......... | 365/185.22 |
| 6,243,290 B1 | 6/2001 | Kurata et al. | |
| 6,643,188 B2 | 11/2003 | Tanaka et al. | |
| 7,139,198 B2 * | 11/2006 | Guterman et al. ...... | 365/185.22 |
| 7,403,425 B2 * | 7/2008 | Aritome ................. | 365/185.22 |
| 7,480,182 B2 * | 1/2009 | Kim et al. .............. | 365/185.22 |
| 2005/0157552 A1 | 7/2005 | Hemink et al. | |

FOREIGN PATENT DOCUMENTS

JP     2003-196988     7/2003

* cited by examiner

*Primary Examiner*—Anh Phung
(74) *Attorney, Agent, or Firm*—Oblon, Spivak, McClelland, Maier & Neustadt, P.C.

(57) ABSTRACT

A nonvolatile semiconductor memory device includes a memory cell array including a plurality of memory cells each having a plurality of threshold levels corresponding to a plurality of programming data respectively; a voltage generator circuit which generates a plurality of programming voltage pulses and a plurality of verify voltage pulses which are applied to said nonvolatile memory cells; a counter circuit which counts the number of times said programming voltage pulse is applied to corresponding said nonvolatile memory cell; a storage circuit which stores data corresponding to said plurality of verify voltage pulses which are set for each of corresponding said threshold levels and the number of times said programming voltage pulse is applied, the number of times said programming voltage pulse is applied being standards for switching a plurality of said verify voltage pulses; a comparison circuit which compares the number of times said programming voltage pulse is applied with said standards and generates a comparison result; a control circuit which controls said plurality of verify voltage pulses step by step based on said comparison result.

20 Claims, 37 Drawing Sheets memory cell to be programmed    memory cell affected by GIDL

FIG. 7
(a)
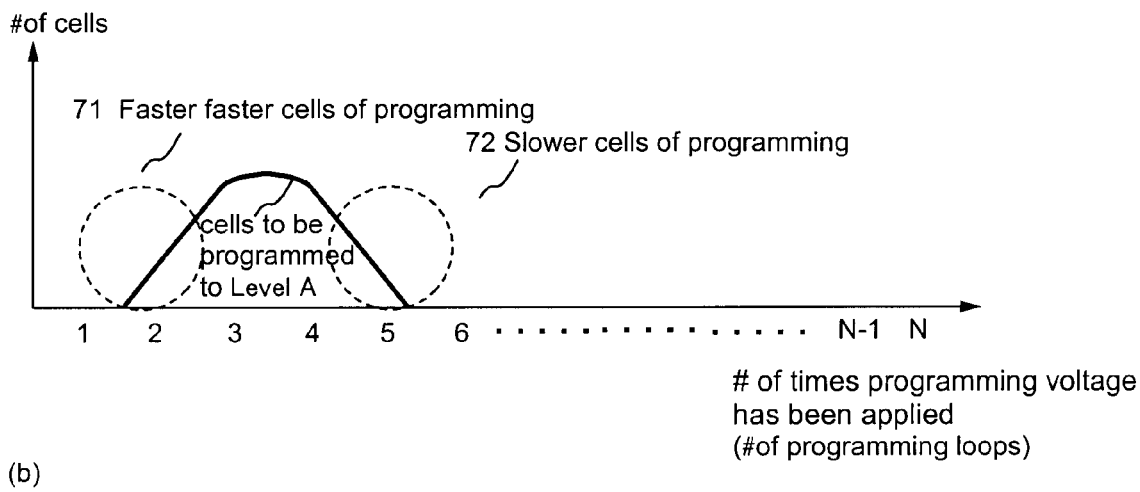
(b)
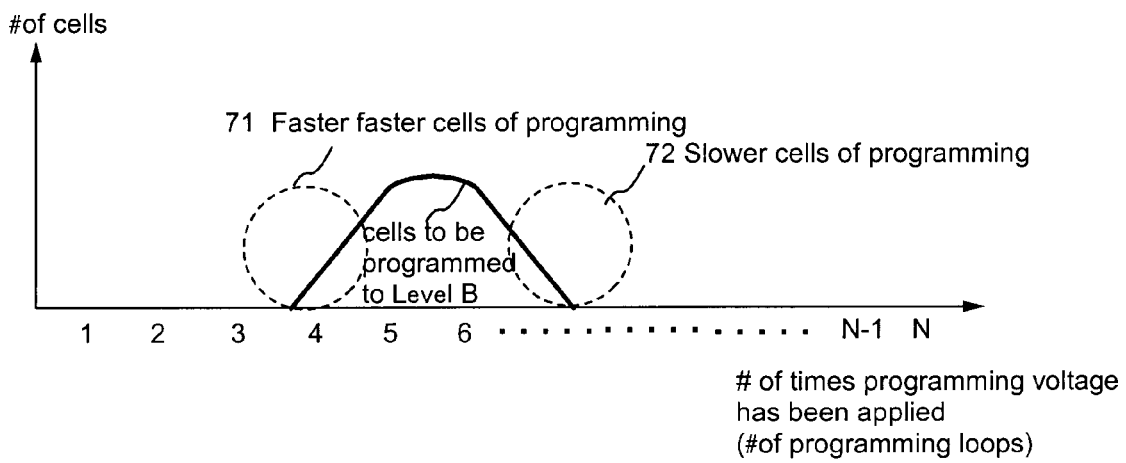
(c)
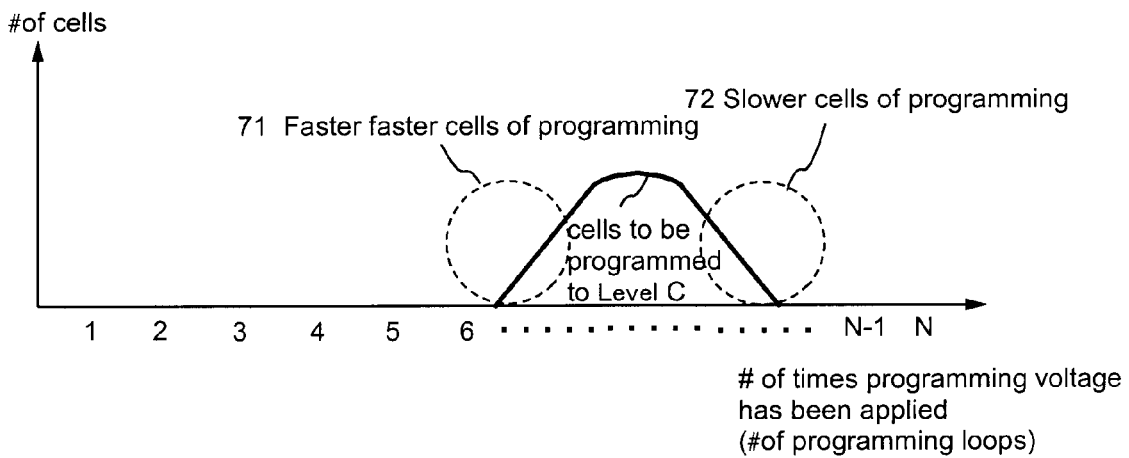

FIG.9
(a)
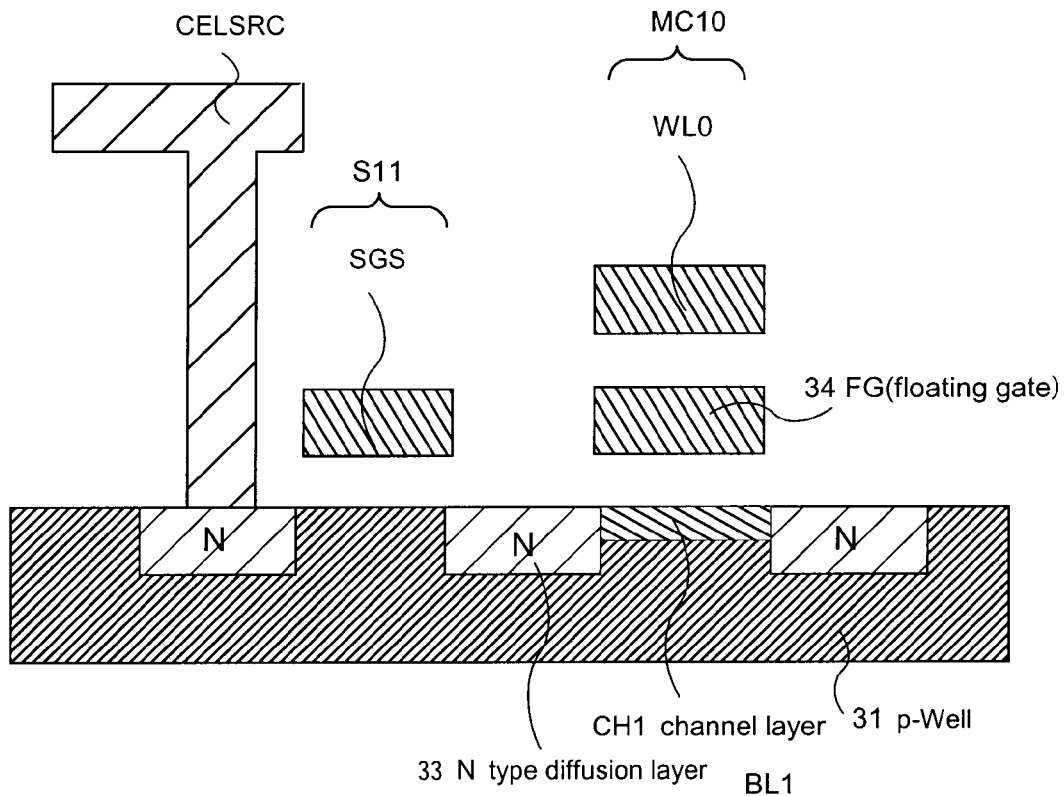
(b)
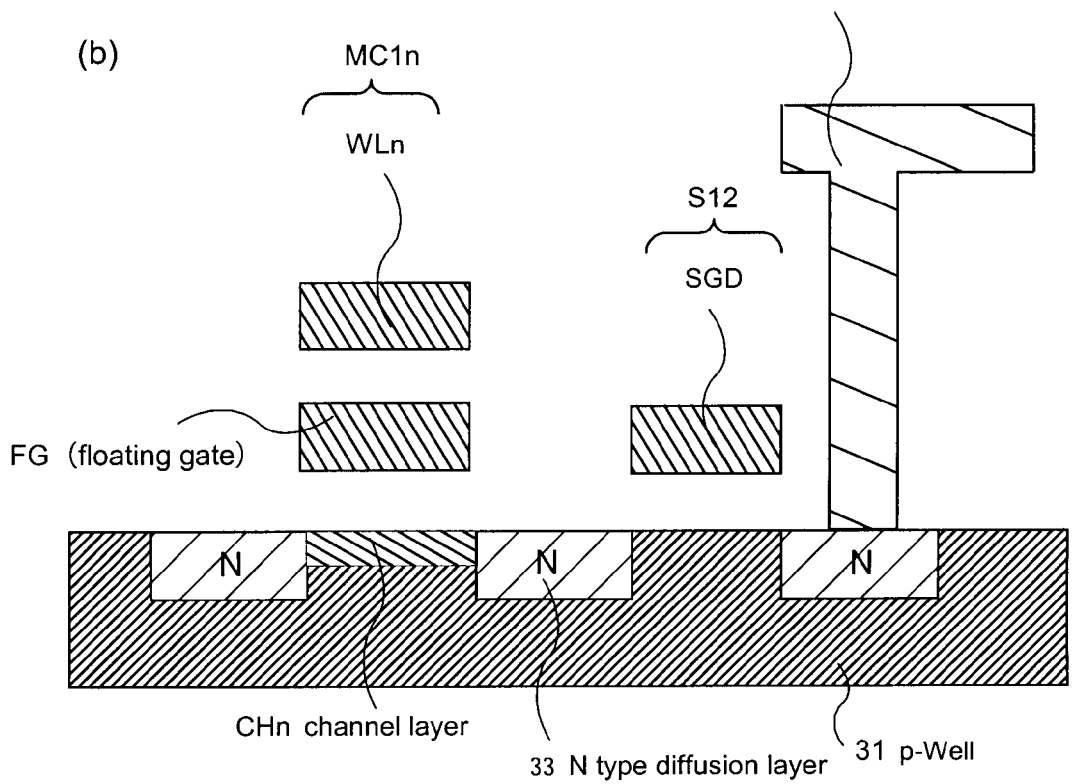

FIG.10
(a)
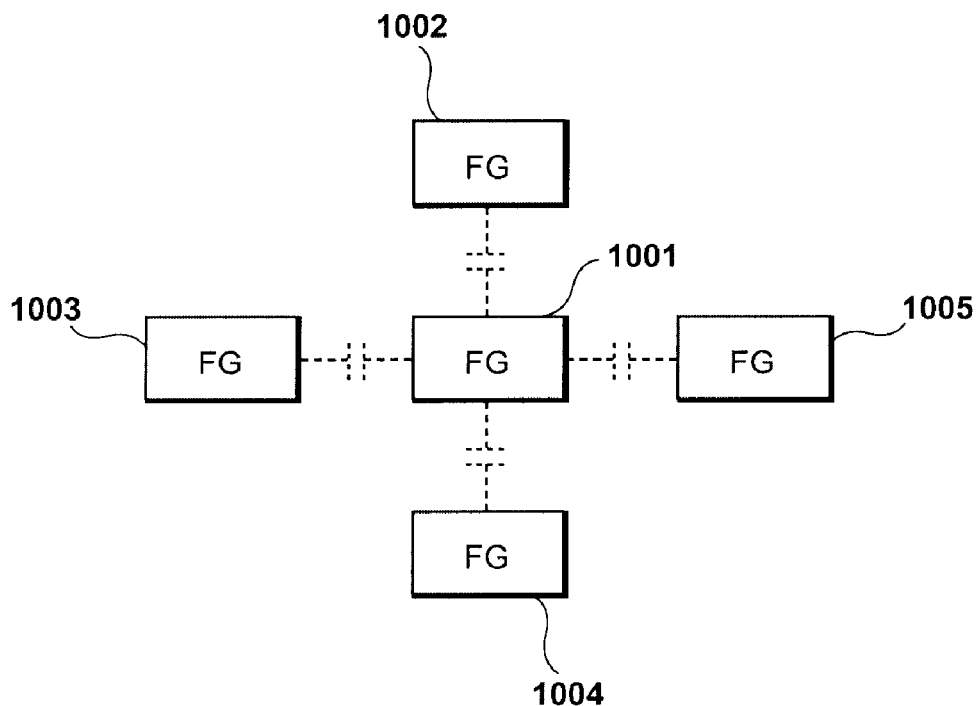
(b)
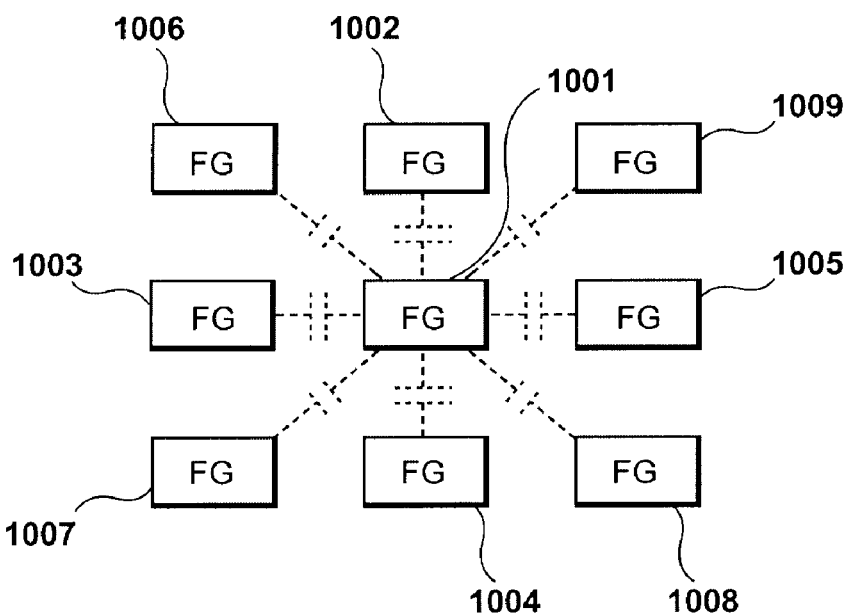

FIG.12
(a)
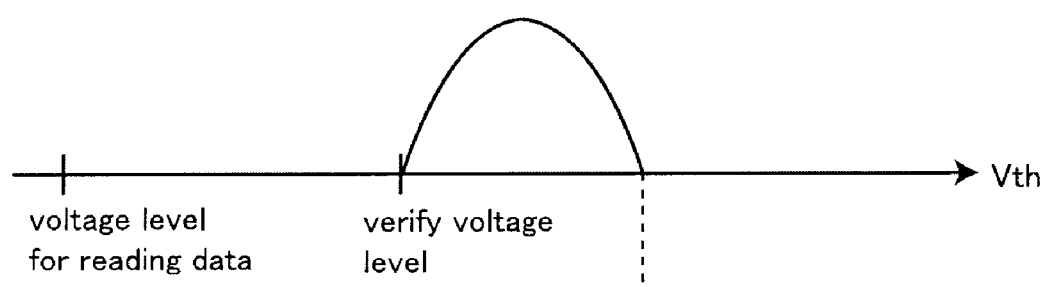
voltage level for reading data | verify voltage level | Vth
(b)
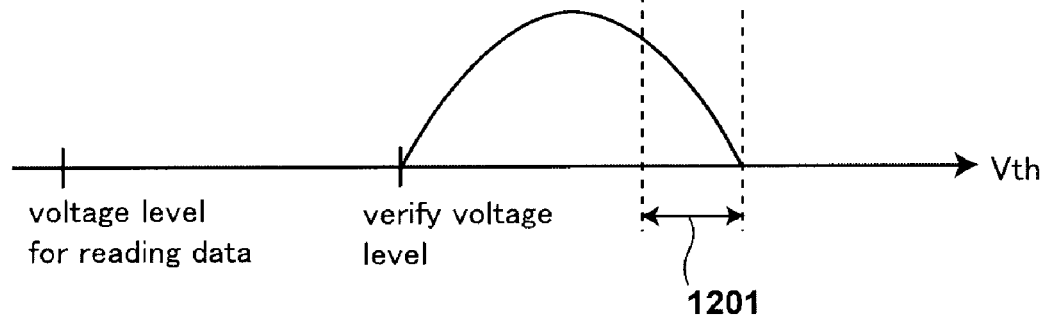
voltage level for reading data | verify voltage level | 1201 | Vth

FIG.15
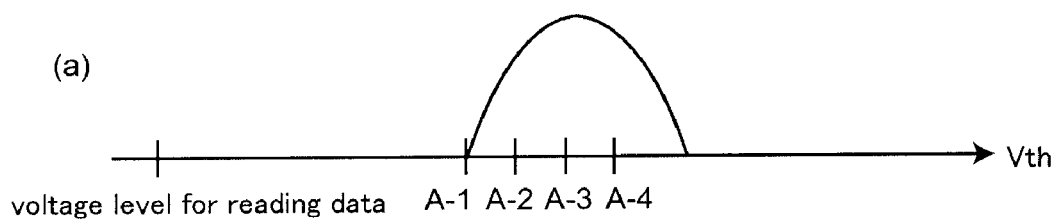
(a) voltage level for reading data   A-1 A-2 A-3 A-4   → Vth
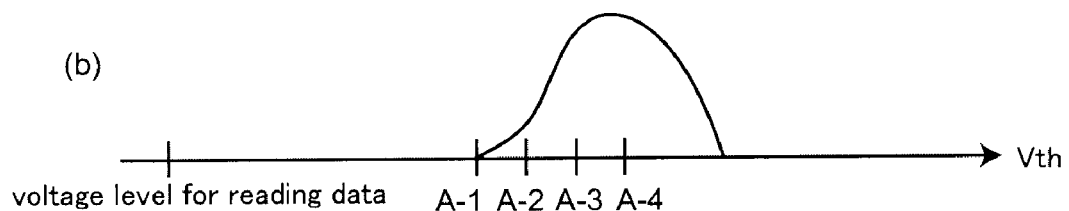
(b) voltage level for reading data   A-1 A-2 A-3 A-4   → Vth
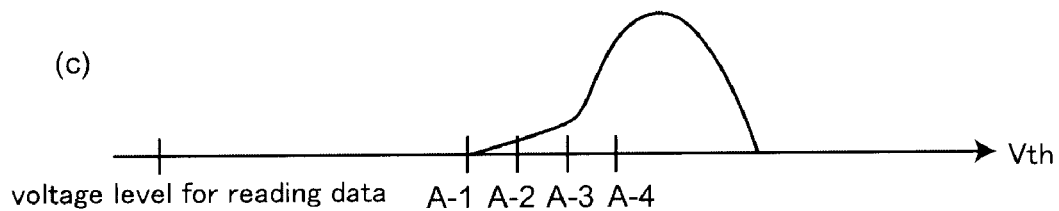
(c) voltage level for reading data   A-1 A-2 A-3 A-4   → Vth
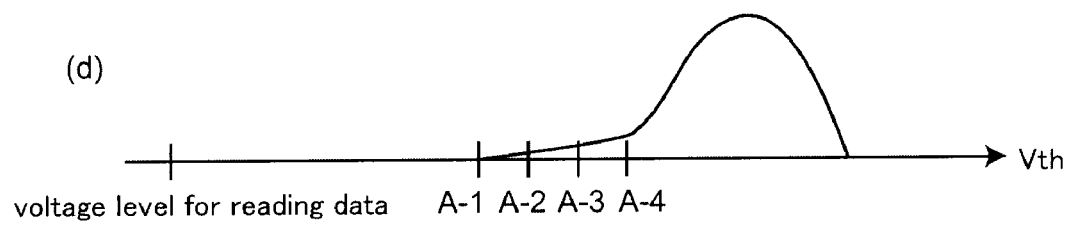
(d) voltage level for reading data   A-1 A-2 A-3 A-4   → Vth
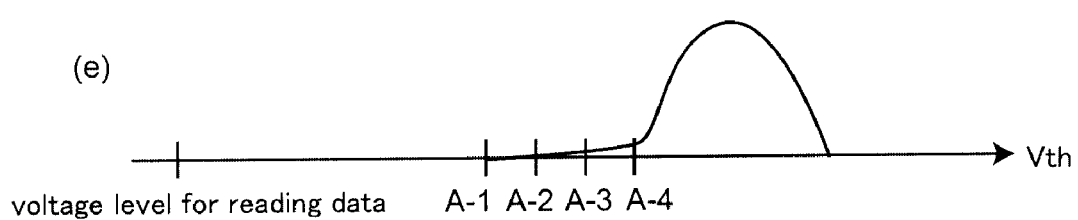
(e) voltage level for reading data   A-1 A-2 A-3 A-4   → Vth memory cell to be programmed

FIG.17
(a)
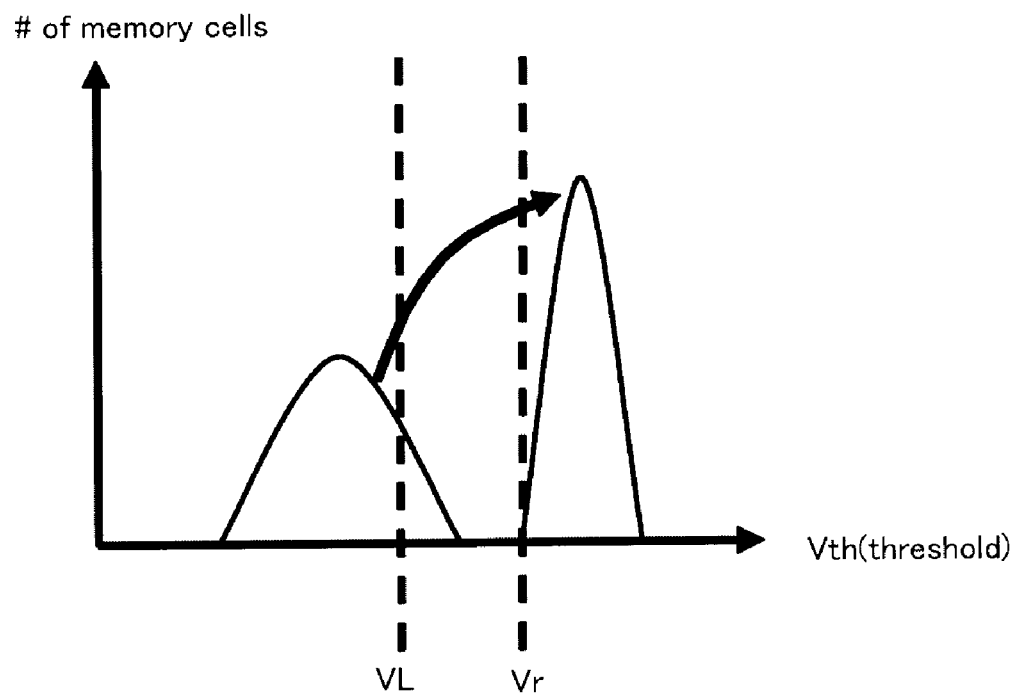
(b)
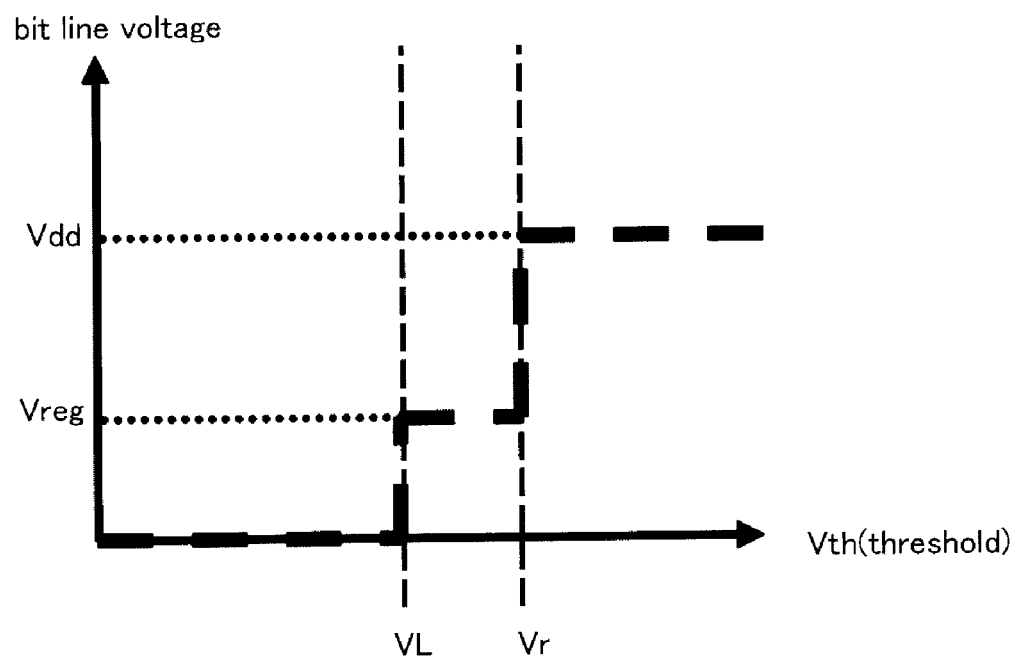

FIG.22
(a)
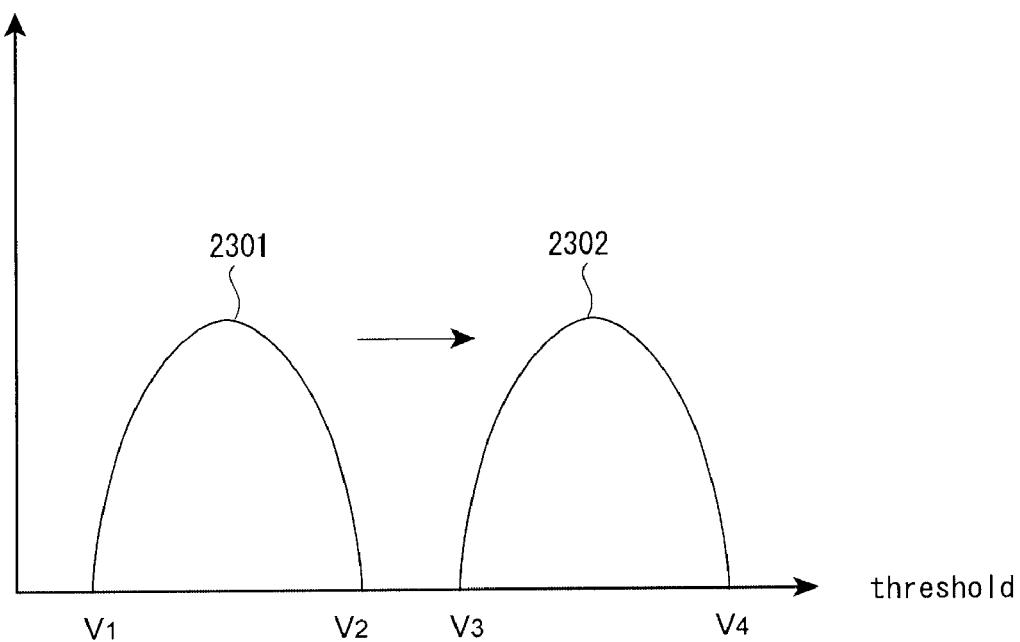
(b)
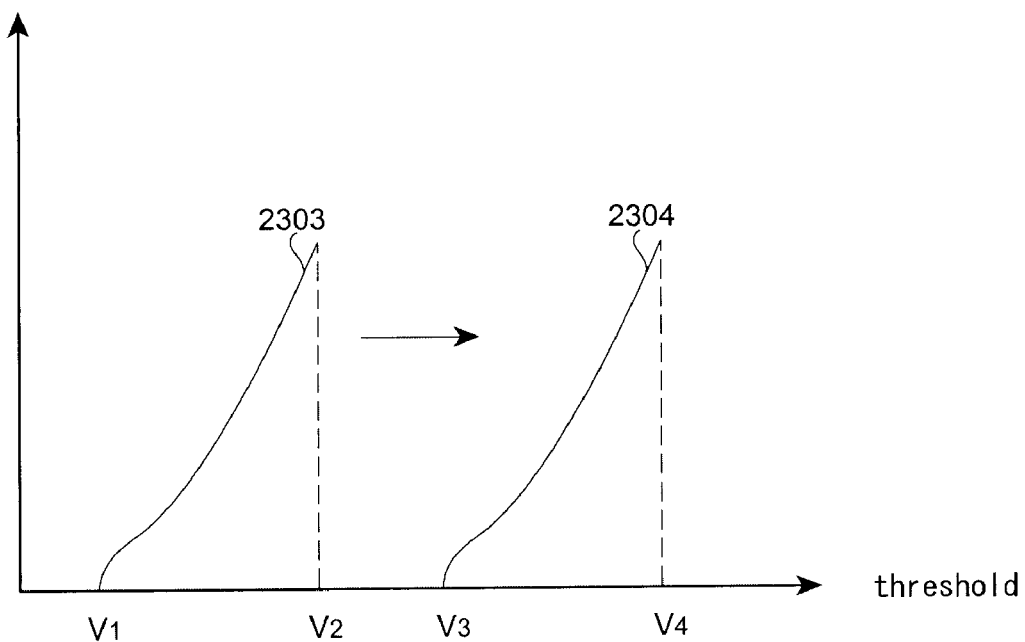

(a)

| | BL0 | BL1 | BL2 | ... | BLn |
|---|---|---|---|---|---|
| bit line voltage | 0 | Vreg | 0 | ... | Vdd |

(b)

NONVOLATILE SEMICONDUCTOR MEMORY DEVICE

CROSS REFERENCE TO RELATED APPLICATIONS

This application is based upon and claims the benefit of priority from the prior Japanese Patent Applications No. 2007-003483, filed on Jan. 11, 2007, No. 2007-178974, filed on Jul. 6, 2007, and No. 2008-002537, filed on Jan. 9, 2008, the entire contents of which are incorporated herein by reference.

BACKGROUND OF THE INVENTION

1. Field of the Invention

This invention relates to a nonvolatile semiconductor memory device constructed using electrically reprogrammable nonvolatile memory cells.

2. Description of the Related Art

A NAND type flash memory has been proposed which uses an EEPROM (Electronically Erasable and Programmable Read Only Memory) as an electrically reprogrammable nonvolatile semiconductor memory device. In recent years, as disclosed by U.S. Pat. No. 6,643,188, various multi bit memory methods have been proposed in which one nonvolatile memory cell (below sometimes referred to as "memory cell") memorizes multi bit data in order to realize further large capacity flash memories.

In the above stated multi bit memory method, a memory cell threshold is used so that a wide voltage region is separated into many parts from a low voltage region over a high voltage region. In the case of setting a threshold in a higher voltage region, there is a need to perform programming using a higher programming voltage.

In a case where a high voltage region is set as a threshold in a memory cell which is to be programmed and where programming of a memory cell which is adjacent on the same word line as this memory cell, has already finished, when the threshold of the memory cell to which programming has already finished (that is, the above stated adjacent memory cell) is located in a low voltage region and a high voltage programming voltage is applied to the word line of the memory cell to be programmed, the following phenomenon occurs. That is, because a high voltage is also applied for a long time to the word line of the adjacent memory cell in which programming has already finished, the threshold which is located in a low voltage region of an adjacent memory cell receives an effect and is shifted to a higher voltage region. In addition, capacitive coupling between the floating gate of a memory cell and the floating gate of an adjacent memory cell which is to be programmed caused by a reduction in the design rules in recent years can no longer be ignored. Also because of this, there are also cases where the threshold of a memory cell in which programming has finished shifts to a higher voltage region. When the threshold of this adjacent memory cell shifts to a higher voltage region and the threshold moves into another threshold range which does not corresponds to the data value which is originally programmed, a programming error occurs.

BRIEF SUMMARY OF THE INVENTION

The present invention provides a nonvolatile semiconductor memory device having a multi bit memory method and arranged with a means for reducing programming errors.

That is, a nonvolatile semiconductor memory device related to one embodiment of the present invention is arranged with a memory cell array including a plurality of electrically reprogrammable nonvolatile memory cells each having a plurality of threshold levels corresponding to a plurality of programming data respectively; a voltage generator circuit which generates a plurality of programming voltage pulses and a plurality of verify voltage pulses which are applied to said nonvolatile memory cells; a counter circuit which counts the number of times said programming voltage pulse is applied to corresponding said nonvolatile memory cell; a storage circuit which stores data corresponding to said plurality of verify voltage pulses which are set for each of corresponding said threshold levels and the number of times said programming voltage pulse is applied, the number of times said programming voltage pulse is applied being standards for switching a plurality of said verify voltage pulses; a comparison circuit which compares the number of times said programming voltage pulse is applied with said standards and generates a comparison result; a control circuit which controls said plurality of verify voltage pulses step by step based on said comparison result.

In other embodiment of the present invention, the nonvolatile semiconductor memory device is arranged with a memory cell array including a plurality of electrically reprogrammable nonvolatile memory cells each having a plurality of threshold levels corresponding to a plurality of programming data respectively; a voltage generator circuit which generates a plurality of verify voltage pulses of a first programming method and a verify voltage pulse of a second programming method, said plurality of verify voltage pulses being applied to corresponding said nonvolatile memory cells; a counter circuit which counts the number of times said programming voltage pulse is applied to corresponding said nonvolatile memory cell; a storage circuit which stores a first data corresponding to said plurality of verify voltage pulses of said first programming method, and the number of times said programming voltage pulse of said first programming method is applied, said first data being set for each of corresponding said threshold levels, and said number of times being standards for switching a plurality of said verify voltage pulses; a comparison circuit which outputs a first comparison result, said result showing a comparison of the number of times said programming voltage pulse is applied for each corresponding said threshold level with said standards of said first programming method, and; a control circuit which controls said plurality of verify voltage pulses of said first programming method step by step based on said first comparison result, and the voltage of a bit line in said memory cell array based on a verification result of the first programming method.

In other embodiment of the present invention, a nonvolatile semiconductor memory device is arranged with a memory cell array including a plurality of electrically reprogrammable nonvolatile memory cells each having a plurality of threshold levels corresponding to a plurality of programming data respectively; a voltage generator circuit which generates a verify voltage pulse of a first programming method and a plurality of verify voltage pulses of a second programming method, said plurality of verify voltage pulses being applied to corresponding said nonvolatile memory cells; a counter circuit which counts the number of times said programming voltage pulse is applied to corresponding said nonvolatile memory cell; a storage circuit which stores a data corresponding to said plurality of verify voltage pulses of said second programming method, and the number of times said programming voltage pulse of said second programming method is applied, said data being set for each of corresponding said threshold levels, and said number of times being standards for switching a plurality of said verify voltage pulses; a comparison circuit which outputs a comparison result, said result showing a comparison of the number of times said programming voltage pulse is applied for each corresponding said threshold level with said standards of said second programming method, and; a control circuit which controls said plurality of verify voltage pulses of said second programming method step by step based on said comparison result, and the voltage of a bit line in said memory cell array based on a verification result of the first programming method.

BRIEF DESCRIPTION OF THE DRAWINGS

FIG. 7($a$) is a diagram which shows a distribution of the number of times a programming voltage is applied when a programming voltage is applied corresponding to Level A, ($b$) is a diagram which shows a distribution of the number of times a programming voltage is applied when a programming voltage is applied corresponding to Level B, and ($c$) a diagram which shows a distribution of the number of times a programming voltage is applied when a programming voltage is applied corresponding to Level C.

FIG. 9($a$) is schematic cross section drawing of a memory cell which is adjacent to SGS; and ($b$) is a schematic cross section drawing of a memory cell which is adjacent to SGD.

FIG. 10($a$) is a drawing which explains the capacitance between opposing sides of a floating gate and an adjacent memory cell, ($b$) is a drawing which explains the capacitance between opposing sides of a floating gate and an adjacent memory cell in a diagonal direction.

FIG. 12 is a drawing which explains a change in threshold caused by the effects of capacitance between opposing faces.

FIG. 15 is a drawing which shows one example of a threshold distribution of a memory cell at the time of programming data using four verify voltages.

FIG. 17($a$) is a drawing which shows a shift of a threshold level by a programming method of one embodiment of this invention; and ($b$) is a drawing which shows a bit line voltage which is controlled from 0V to a middle voltage Vreg and between 0V and Vdd in a programming method of one embodiment of this invention.

FIG. 22($a$) is an example drawing which shows a shift of memory cell threshold levels and ($b$) is an example drawing which shows a shift of memory cell threshold levels using a σ plot.

DETAILED DESCRIPTION OF THE INVENTION

Figure 1:
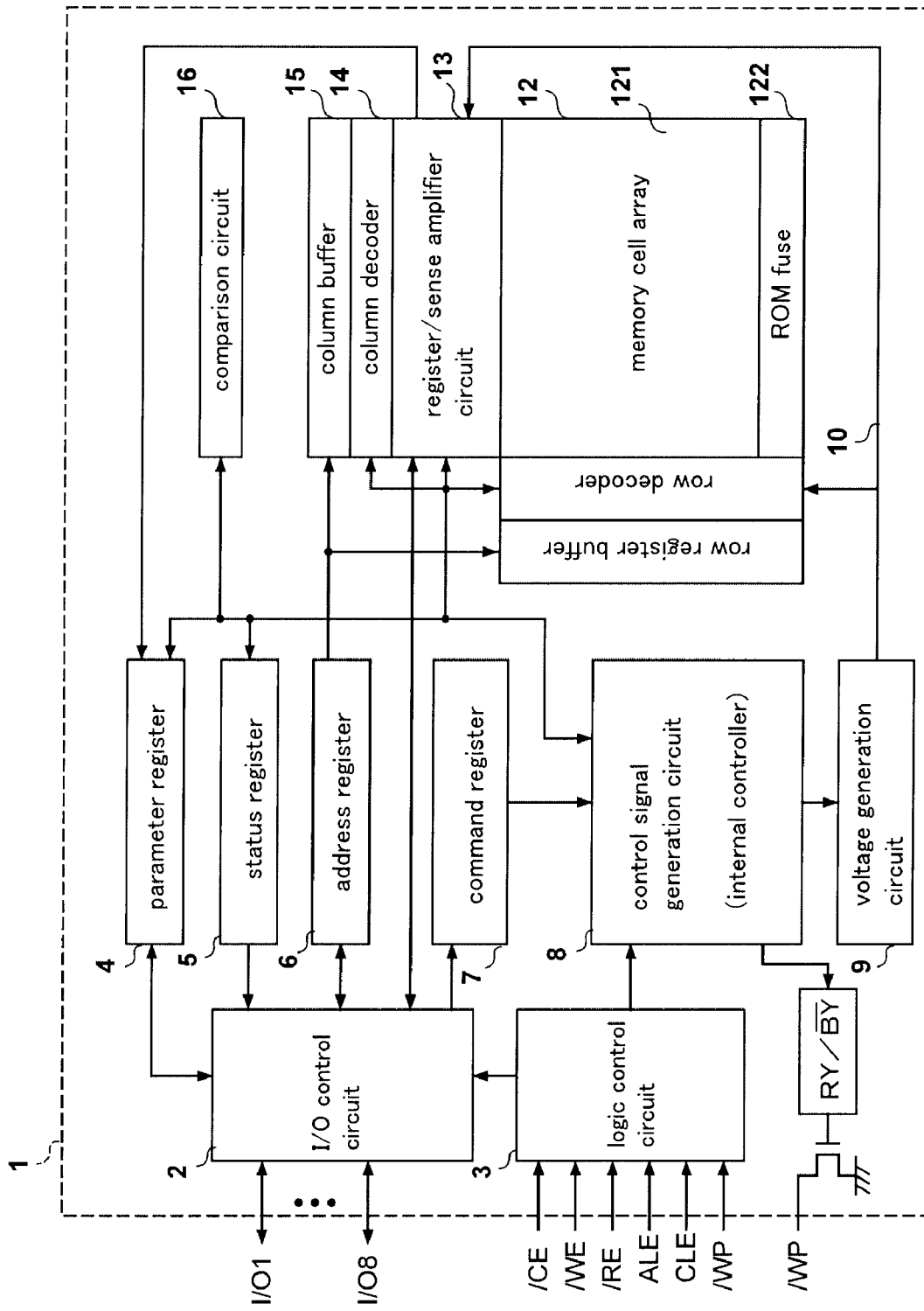
FIG. 1 is a drawing which shows the construction of a function block of a memory chip of a NAND type flash memory related to one embodiment of the present invention.

The preferred embodiments of the present invention are explained below in detail while referring to the drawings. However, it is possible to realize the present invention with many different examples and the present invention should not be interpreted to be limited by these embodiments.

Figure 2:
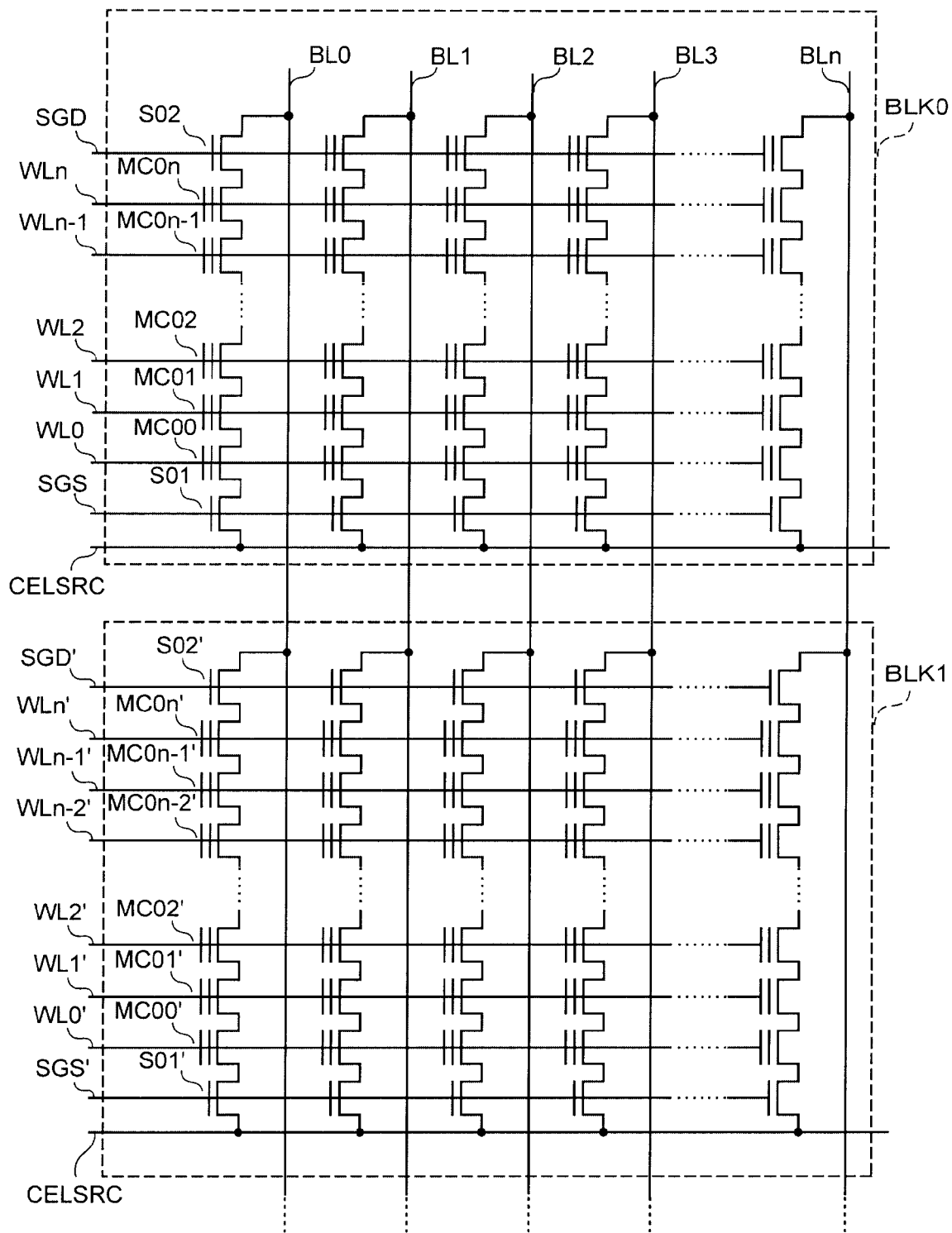
FIG. 2 is drawing which shows a series of memory cells in a memory cell array.

FIG. 1 shows a function block diagram of a memory chip of a NAND type flash memory related to one embodiment of the present invention. FIG. 2 is a drawing which shows a series of memory cells in a memory cell array 12. As is shown in FIG. 2, the memory cell array 12 is formed by a plurality of NAND cell units arranged in series. Each NAND cell unit includes a plurality of electrically reprogrammable nonvolatile memory cells (for example, MC00-MC0n) and selection gate transistors (for example, S01, S02) for connecting a source line CELSRC and a bit line BL to each end of the memory cells respectively.

Control gates of the memory cells MC00-MC0n are each connected to a different word line WL0-WLn respectively. The selection gate transistors S01, S02 are connected selection gate lines SGS, SGD which are parallel to a word line.

A group of NAND cell units which share a word line forms a block, which is a unit for data erasure. As is shown in FIG. 2, a plurality of blocks BLK0, BLK1, ... are arranged in series in a bit line direction.

A low decoder 10 includes a word line drive circuit which selects a word line of the memory cell array 12 and drives a word line.

A column decoder 14 selects a bit line. A sense amp circuit 13 is connected to a bit line of the memory cell array 12 and includes a function for programming and reading data via a sense amp circuit which temporarily stores input and output data, and a data latch function which stores data to be programmed and read.

At the time of data reading, the data which is read by the sense amplifier 13 is output to an external input/output terminal I/O1-I/O8 via an I/O control circuit 2.

At the time of data programming, the programming data which is supplied from an external controller to the input/output terminal I/O1-I/O8 is loaded into the sense amplifier circuit 13 via the I/O control circuit 2.

A command which is supplied from the input/output terminal I/O1-I/O8 via the I/O control circuit 2 is latched in a command register 7 and is decoded by a control signal generator circuit 8 (internal controller). External control signals such as chip enable signal /CE, write enable signal /WE, read enable signal /RE, address latch enable signal ALE and command latch enable signal CLE, are supplied to the control signal generator circuit 8 via a logic controller circuit 3. The control signal generator circuit 8 controls for each operation mode the sequence of data programming, data erasure and data reading based on an external control signal and command.

A status register 5 is arranged for notifying the various states within the chip. The status register 5 includes, for example, a ready/busy register, which stores data showing whether the chip is in a ready or busy state, a programming status register, which stores data showing a programming pass or failure, a programming error status register, which stores data showing whether there is a programming error (pass or failure of verifying data programming), and an over-programming status register, which stores data showing whether there is an over-programming (pass or failure of verifying over-programming).

A ROM fuse 122 is formed, for example, by a memory cell having the same construction as a memory cell within the memory cell array 12. The ROM fuse 122 may also be formed in a different region to the memory cell array 12. Alternatively, the ROM fuse 122 may be formed in one part/area within the memory cell array 12. In FIG. 1, the memory cell array 12 is divided into a first memory region 121 and a second memory region. This first memory region 121 stores normal data and the second memory region of the ROM fuse 122 stores differently to the first memory region 121 parameters for controlling the operation of the chip. Further, the ROM fuse 122 may be formed with a metal fuse.

The memory cell array 12 and the row decoder 10 require various high voltages Vpp (programming voltage Vpgm, verify voltage Vr, programming pass voltage Vpass, read pass voltage Vread etc.) in accordance to an operation mode. A voltage generator circuit 9 is arranged in order to generate these high voltages Vpp. This voltage generator circuit 9 is controlled by the control signal generator circuit 8.

Figure 3:
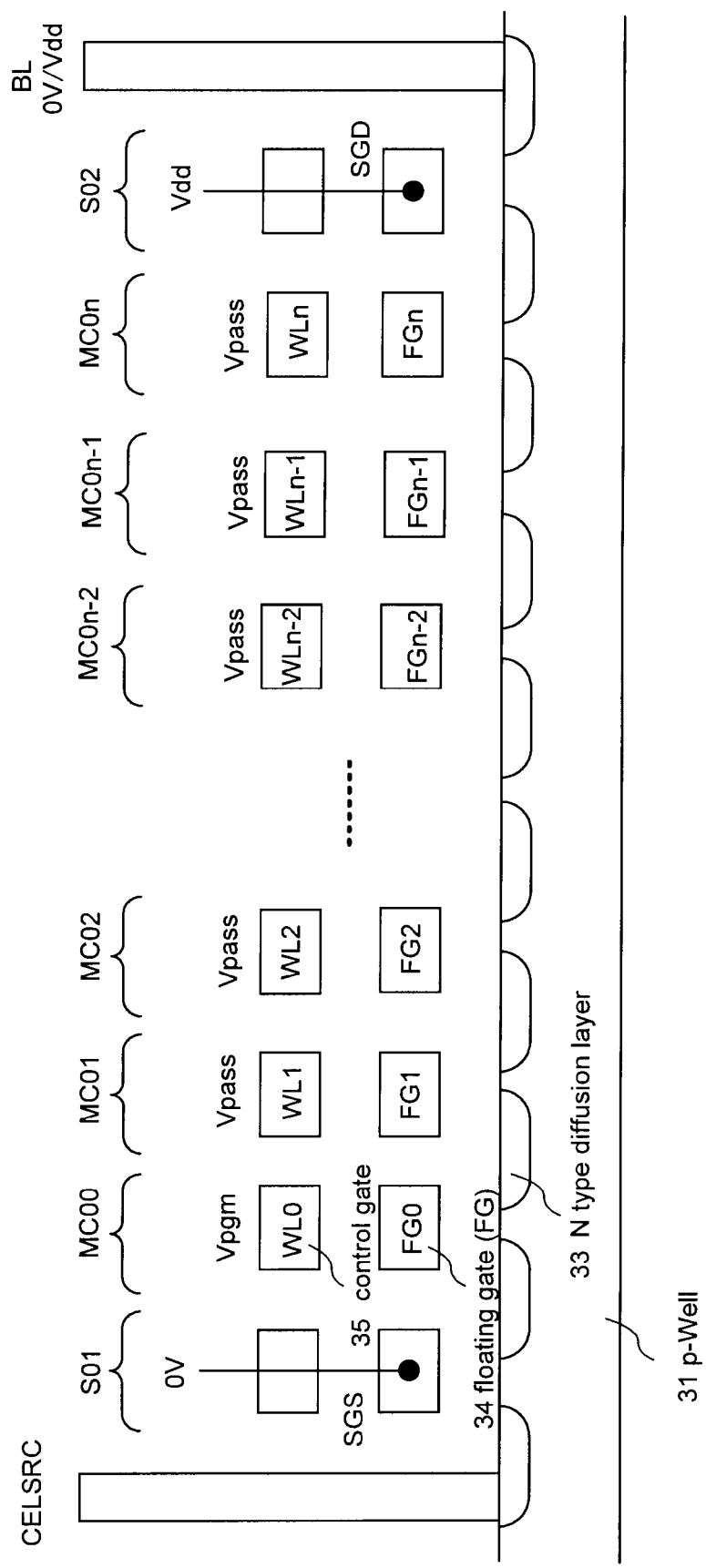
FIG. 3 is a cross section drawing which shows one example of the structure of a memory cell of a NAND type flash memory.

Next, the programming operation of a memory cell in the NAND type flash memory is explained. FIG. 3 is a cross section diagram which shows one example of the structure of a memory cell part of the NAND type flash memory. As shown in FIG. 3, a memory cell part of the NAND type flash memory is formed by a plurality of memory cells MC00-MC0n, which are connected in series, and two selection gate transistors S01 and S02. The selection gate transistor S02 is connected to a bit line BL and the selection gate transistor S01 is connected to a common source line CELSRC of the memory cell array. One memory cell comprises a source and a drain formed from an N type diffusion layer, which is formed on a p type well (p-well), a control gate 35 which is connected to a word line, and a floating gate (FG) 34. The amount of electrons which are injected into this floating gate (FG) 34 is controlled by changing a data programming voltage Vpgm, which is applied to a word line, and the length of time in which this voltage is applied. The memory cell threshold (Vt) changes according to the amount of electrons injected into the floating gate (FG) 34. Therefore, the memory cell threshold (Vt) is controlled by using a programming voltage Vpgm.

Figure 4:
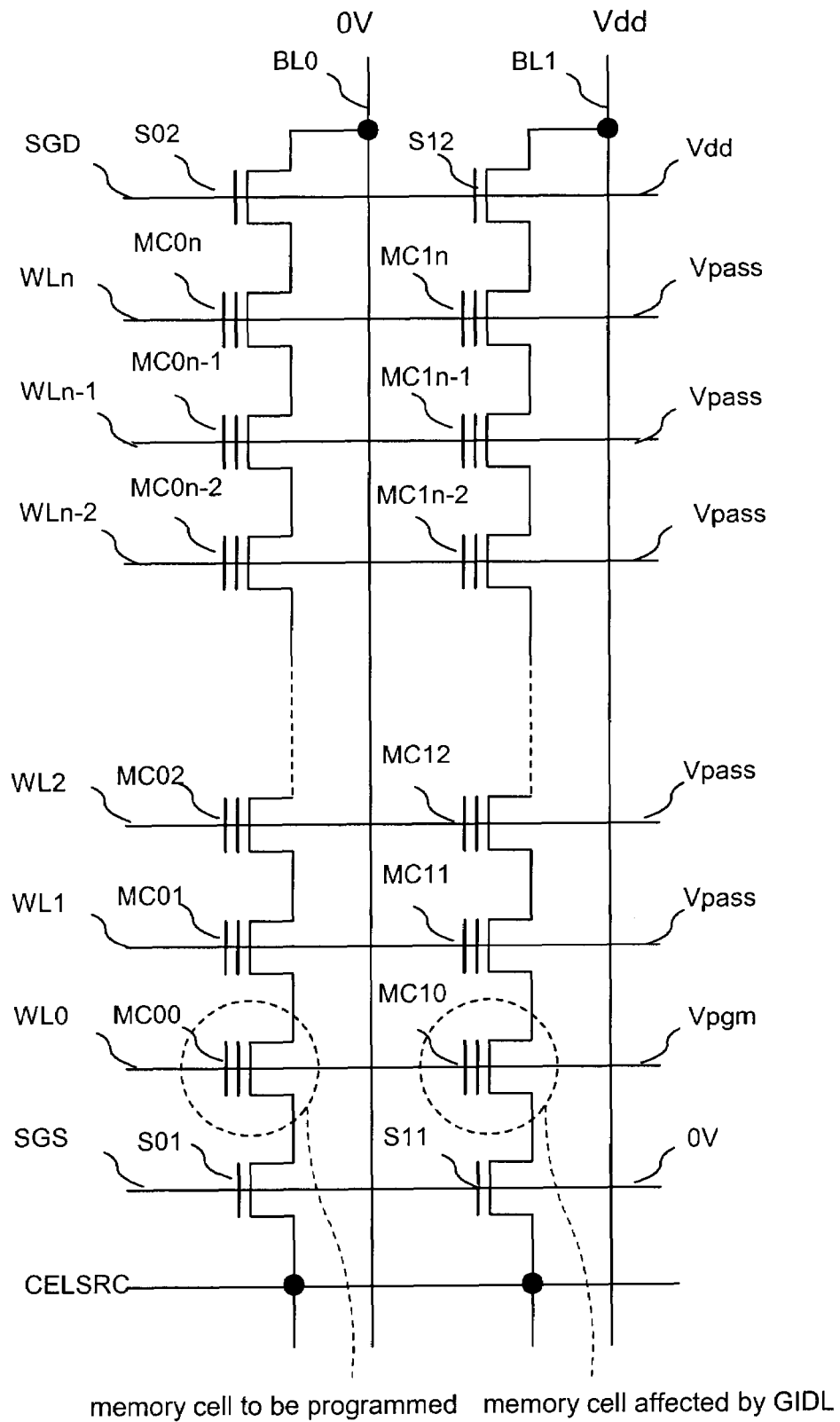
FIG. 4 is a circuit diagram which shows one example of the voltage application conditions in a case where a word line WL0 is selected to program a data.

FIG. 4 is a drawing which shows one example of the conditions of a voltage application to a NAND cell unit at the time of a data programming operation. A data programming voltage Vpgm is applied to a selected word line, WL0 for example, to program a data. A plurality of memory cells are arranged in series for one word line WL0. Data programming is performed to memory cells connected for one word line at a time. In the present specification, such one word line is sometimes called "a selected word line."

Other non-selected word lines WL1-WLn, to which memory cells not to be programmed, other than WL0 are applied with a pass voltage Vpass.

The programming voltage Vpgm is applied to the selected word line WL0 at a voltage of about 14V-20V for example, in steps using a pulse method so that a threshold of a memory cell to which a data is to be programmed fits within a threshold range corresponding to the data The selection gate transistor S02, which is adjacent to the bit line BL0, has a normal transistor construction. That is, the selection gate transistor S02 doesn't have a floating gate (FG). A voltage slightly lower than a power supply voltage Vdd is applied to the gate electrode of the selection gate transistor S02. The selection transistor S01, which is adjacent to the source line CELSRC side, has the same construction as the selection gate transistor S02, which is adjacent to the bit line BL0. The voltage of the gate electrode of the selection gate transistor S01 is controlled to 0V.

As is shown in FIG. 4, the voltage of the bit line BL0, to which a memory cell to be programmed is connected, is controlled to 0V by a sense amplifier circuit. Then, when the threshold of a memory cell connected to the selected word line is detected to be set within a predetermined threshold range, the bit line voltage is controlled so that it becomes a power supply voltage Vdd by a sense amplifier circuit the same as the bit line BL1 shown in FIG. 4.

During data programming, 0V applied to the bit line BL0 is transferred to the memory cell just before the selection gate transistor S01. As a result, the voltage of the channel of the memory cell MC00 to be programmed becomes 0V and when a programming voltage Vpgm is applied to the selected word line WL0, a voltage difference of Vpgm occurs between the selected word line WL0 and the channel. Fowler Nordheim (FN) tunneling current is generated by this voltage difference and the electrons are injected into the floating gate (FG) 34. The distribution of the threshold (Vt) of the memory cell MC00 shifts to a positive direction. The other non-selected word lines WL1-WLn, to which memory cells not to be programmed are connected, other than WL0 are applied with a pass voltage Vpass, which hardly generates at all Fowler Nordheim (FN) tunneling current. As a result, the distribution of the thresholds (Vt) of the memory cell which is connected to a non-selected word line hardly changes.

Alternatively, after data programming to a memory cell has finished or when programming to a memory cell is not performed, the bit line voltage is controlled to become a power supply voltage Vdd by a sense amplifier circuit the same as the bit line BL1 in FIG. 4. In addition, a voltage slightly lower than Vdd is applied to the gate electrode of the selection gate transistor S12. As a result, the selection gate transistor S12 becomes in a CUT-OFF state. As a result of this, the channel of the memory cells MC10-MC1n becomes a floating state. In this state, when Vpass or Vpgm is applied to the word lines WL0-WLn, the channel voltage of the memory cells MC10-MC1n rises to about 8V for example. Consequently, the voltage difference between the selected word line WL0 and the channel does not become large. That is, an FN tunneling current does not flow and the distribution of the thresholds (Vt) of memory cells hardly changes.

A data programming method, in which the programming operation of multi-bit data is performed by finely dividing the range thresholds of memory cells in a memory chip of the above stated NAND type flash memory, is explained below.

The amount of electrons which are injected into the floating gate (FG) 34 shown in FIG. 3 can be changed by controlling the programming voltage applied to a selected word line and the length of time this voltage is applied. The threshold of a memory cell changes according to the amount of electrons injected into the floating gate (FG) 34. Programming multi-bit data can be realized by changing the threshold voltage (Vt) of a memory cell according to the data to be programmed. In the case of programming data to a memory cell, there is a need to accurately control the threshold of a memory cell in accordance with the data to be programmed. As one method for controlling the threshold, a programming method in which a voltage applied to a control gate electrode of a memory cell is gradually increased is used. This type of programming method is called a step-up programming method.

Figure 5:
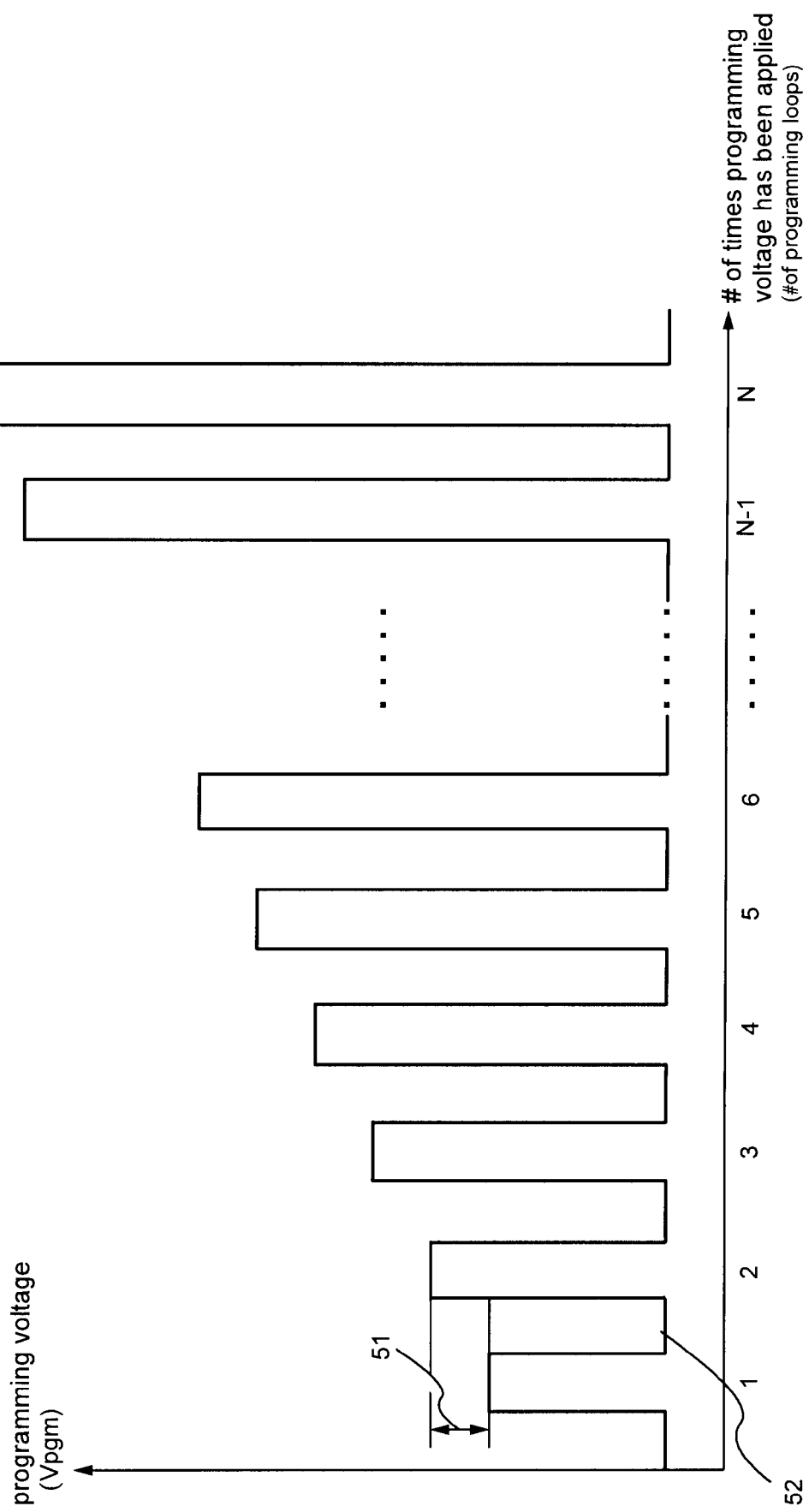
FIG. 5 is a drawing which shows one example of a step-up programming method.

FIG. 5 is a drawing which shows one example of a step-up programming method. FIG. 5 shows that a programming voltage (Vpgm) is applied to one selected word line in steps in the shape of a pulse. The vertical axis corresponds to the programming voltage (Vpgm) and the horizontal axis corresponds to the number of times (herein called the number of programming loops) a programming voltage (Vpgm) pulse is applied to the selected word line. The height 51 of each step up of Vpgm is set as 0.2V for example. The initial programming pulse voltage is set as 14V for example. Then, the programming voltage pulse is stepped-up by 0.2V. A verify operation is performed in the pause 52 between the pulses. A verify voltage is applied to a selected word line during the pause 52 although not shown in the drawing.

The verify voltage which is applied at the time of verify operation is set as a voltage which is equivalent to the lowest value of the threshold distribution. In the case of a multi-bit memory method, the threshold distribution range is set in accordance with the data to be programmed and the verify voltage is set as a voltage equivalent to the lowest level of each threshold distribution. During a programming operation, when the threshold level of a memory cell to be programmed exceeds a verify voltage, programming to that memory cell is finished. As a result, the voltage of a bit line which is connected to a NAND cell unit which includes that memory cell is controlled from 0V to Vdd.

Figure 6:
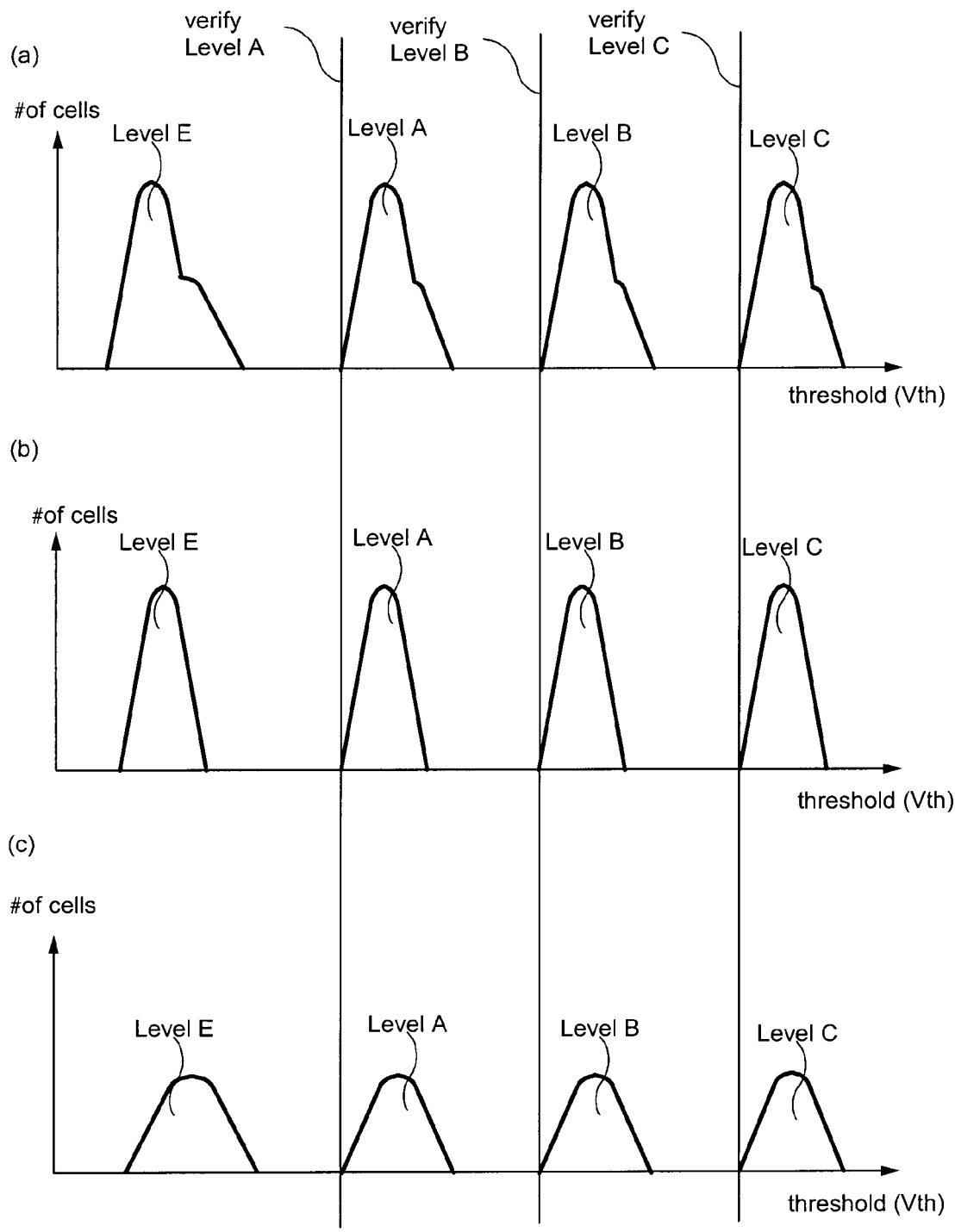
FIG. 6($a$) is a drawing which shows a threshold distribution over an entire memory cell, ($b$) is a drawing which shows a threshold distribution of a memory cell which is not adjacent to SGS and SGD, and ($c$) is a drawing which shows a threshold distribution of a memory cell which is adjacent to SGS and SGD.

As an example of multi-bit data programming, the case in which the number of data to be programmed in a memory cell is 4 is explained below. FIG. 6(*a*)-(*c*) are drawings which show the threshold distribution of memory cells in the case of programming 4 valued data. In the present specification, four groups of memory cell threshold distributions are called Level E, Level A, Level B, and Level C in order from a low threshold level to a high threshold level. A verify voltage corresponding to Level A is called verify Level A, a verify voltage corresponding to Level B is called verify Level B and a verify voltage corresponding to Level C is called verify Level C.

FIG. 7(*a*) is a diagram which shows the distribution of the number of programming loops when a plurality of memory cells are applied with a pulse shaped programming voltage until the threshold level exceeds verify Level A corresponding to Level A. FIG. 7(*b*) is a diagram which shows the distribution of the number of programming loops when a plurality of memory cells are applied with a pulse shaped programming voltage until the threshold level exceeds verify Level B corresponding to Level B. FIG. 7(c) is a diagram which shows the distribution of the number of programming loops when a plurality of memory cells are applied with a pulse shaped programming voltage until the threshold level exceeds verify Level C corresponding to Level C.

Before a data programming operation, all the memory cells within a selected block are set in an erasure state. As a result, all the memory cells are in the lowest threshold voltage state Level E. When a memory cell is to be left in a threshold voltage state Level E, data programming operation is not performed and the memory cell remains in the erasure state. In the step-up programming method, data programming operation is, for example, performed in ascending order from low threshold level data. For example, in the case where the threshold range of one memory cell is divided into four groups, data programming operations are performed in order of level A, level B, and level C.

However, because the thickness of a gate oxide film and/or the coupling ratio is different for each memory cell, memory cells cannot be set within the same threshold level range by a predetermined number of programming loops. For example, there is a variation as such that when the threshold level of a certain memory cell is to be set at more than 1.0V, three pulse application is enough for one memory cell but six pulse application is necessary for another memory cell. The left side 71 of each distribution in FIG. 7(a)-(c) corresponds to the memory cells that require a few number of pulse applications (i.e. data programming is quickly completed for these cells). The right side 72 of each distribution in FIG. 7(a)-(c) corresponds to the memory cells that require a larger number of pulse applications (i.e., data programming is slowly completed for those cells).

Data programming is performed on memory cells connected in series to one word line at a time. The data programming voltage Vpgm is applied as pulse voltages in steps to a selected word line to which memory cells to be programmed are connected. Therefore, among the memory cells connected to one selected word line, programming is completed quickly for memory cells on the left side distribution in FIG. 7(a), and to this type of memory cells, the programming voltage Vpgm is applied for several times after data programming for such memory cells is completed. As a result, the threshold level of this type of memory cells shifts easily to a higher voltage. Such phenomena occur in particular when the memory cells of this type are adjacent to the selection gate transistor.

Figure 8:
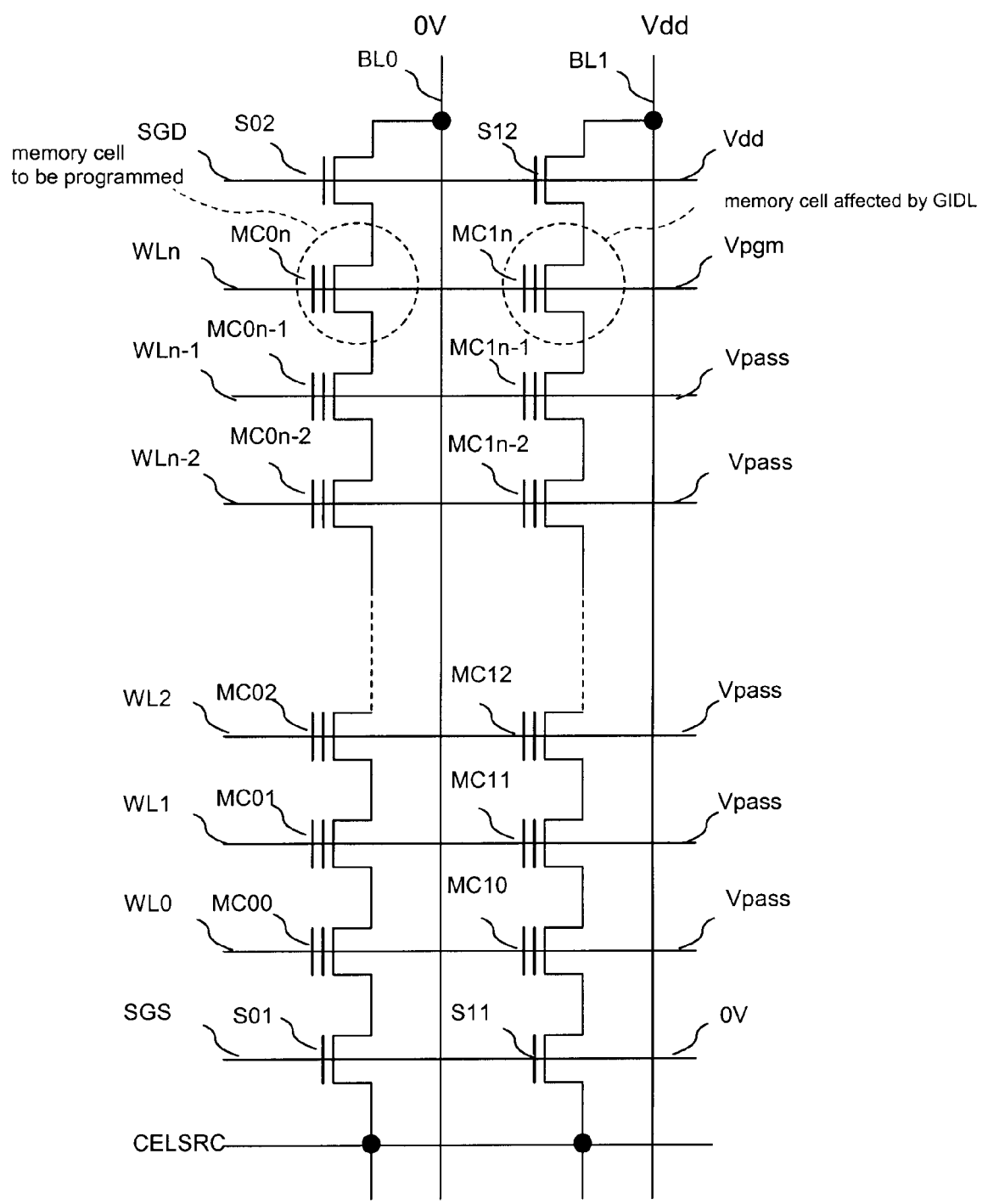
FIG. 8 is a circuit diagram which shows one example of the voltage application conditions in a case where a word line WLn is selected to program a data.

One example of such shifting of a threshold level to a higher voltage is explained below. FIG. 4 is a circuit diagram which shows one example of the application conditions of a voltage in the case where a word line WL0 is selected. FIG. 8 is circuit diagram which shows one example of the application conditions of a voltage in the case where a word line WLn is selected. As explained below, the memory cell MC10 shown in FIG. 4 and the memory cell MC1*n* shown in FIG. 8 are memory cells in which the threshold level easily shifts to a higher voltage.

First, the shifting of the threshold level of the memory cell MC10 to a higher voltage is explained referring to FIG. 4 and FIG. 9(a). FIG. 9(a) is a schematic cross sectional diagram of the source line CELSRC, the selection gate transistor S11, and the memory cell MC10 in the case where the word line WL0 is selected.

Suppose that the memory cell MC10 shown in FIG. 4 has been set at a desired threshold level and the data programming operation is completed. Then Vdd is applied to the bit line BL1. This is because the bit line BL1 connected via a selected gate transistor to memory cells to which programming is completed is applied with Vdd. The gate line SGS of the selection gate transistor S11 which is connected to the source line CELSRC is 0V. Because of this, the selection gate transistor S11 is in a CUT-OFF state. Therefore, among the N type diffusion layers of the selection gate transistor S11 the layer of which is connected to the source line CELSRC (CELSRC side diffusion layer) becomes 0V which is the voltage of the source line CELSRC. Note that 0V is one example of a voltage of CELSRC. Even in the case where the voltage of CELSRC is Vdd, which is higher than 0V, for example, the same phenomenon occurs as explained later.

In FIG. 9(a) the drain of the selection gate transistor S11 and the source of the memory cell MC10 share an N type diffusion layer 33. Because the channel layer CH1 of the memory cell MC10 is in a floating state and is affected by Vpgm, which is applied to WL0, the channel voltage of the memory cell MC10 rises to about 8V, for example. The voltage of the CELSRC side diffusion layer is 0V. As a result, a voltage difference occurs between the CELSRC side diffusion layer of the selection gate transistor S11 and the channel layer CH1 of the memory cell MC10, electrons are accelerated towards the CH1 from the CELSRC, the electron-hole pairs are generated at the edge part of the selection gate transistor S11 side of the N type diffusion layer 33 and these holes flow to the cell p-Well 31. This phenomenon is called GIDL (Gate Induced Drain Leakage). In addition, the electrons of the electron-hole pairs are pulled by the programming voltage Vpgm, which is applied to the control gate WL0 of the memory cell MC10 and the electrons are injected at a certain probability into the floating gate FG of the memory cell MC10. By this, in the memory cell MC10, to which a data programming operation has already been completed and because electrons are further injected into this floating gate FG, the threshold level shifts to a high direction. In the worst case, a wrong data may be programmed to the memory cell if the threshold level range which is initially set shifts into a range of another data.

Similarly, the shifting of the threshold level of memory cell MC10 to a higher voltage is explained referring to FIG. 8 and FIG. 9(b). FIG. 9(b) is a schematic cross section diagram of bit line BL1, selection gate transistor S12, and memory cell MC1*n* in the case where the word line WLn is selected.

Suppose that the memory cell MC1*n* shown in FIG. 8 has been set at a target threshold level and the data programming operation is completed. Then Vdd is applied to the bit line BL1. Because the gate line SGD of the selection gate transistor S12 is applied with a voltage slightly lower than Vdd, the selection gate transistor S12 is in a CUT-OFF state. As a result, because the bit line BL1 is connected to the selection gate transistor S12 the voltage of the bit line BL1 is Vdd.

In FIG. 9(b) the drain of the selection gate transistor S12 and the source of the memory cell MC1*n* share an N type diffusion layer. The channel layer CHn of the memory cell MC1*n* is in a floating state and is affected by Vpgm. The channel voltage of the memory cell MC1*n* rises to about 8V, for example. The N type diffusion layer BL1 of the drain side is Vdd. As a result, a voltage difference occurs between the N type diffusion layer BL1 of the drain side of the selection gate transistor S12 and the channel layer CHn of the memory cell MC1*n*, electrons are accelerated towards the N type diffusion layer 33 from the drain side N type diffusion layer BL1, the electron-hole pairs are formed at the edge part of the selection gate transistor S12 side of the N type diffusion layer 33 and these holes begin to flow to the cell p-Well 31 by a similar mechanism as the GIDL stated above. In addition, the electrons of the electron-hole pairs are pulled by the programming voltage Vpgm which is applied to the control gate WLn of the memory cell MC1n and at a certain probability, the electrons are injected into the floating gate FG of the memory cell MC10. By this, in the memory cell MC1n to which the data programming operation has already completed and because electrons are further injected into this floating gate FG, the threshold level shifts to a higher direction. In the worst case, a wrong data may be programmed to the memory cell if the threshold level range which is initially set shifts into a range of another data.

FIG. 6(a) is a drawing which shows the threshold distribution of memory cells of the memory cell array 121. FIG. 6(b) is a drawing which shows the threshold distribution of memory cells which are not adjacent to SGS or SGD (the memory cells which are connected to the word line WL1 through to WLn-1 shown in FIG. 4 and FIG. 8). FIG. 6(c) is a drawing which shows the threshold distribution of memory cells which are adjacent to SGS or SGD (the memory cells which are connected to the word line WL0, WLn shown in FIG. 4 and FIG. 8).

Comparing the threshold level distribution of memory cells which are adjacent to SGS and SGD shown in FIG. 6(c) and the threshold level distribution of memory cells which are not adjacent to SGS and SGD shown in FIG. 6(b), the threshold level distribution shown in FIG. 6(c) is shifted to a higher voltage than the threshold level distribution shown FIG. 6(b). As a result, the threshold level distribution of all the memory cells shown in FIG. 6(a) shifts to a higher voltage than the threshold level distribution shown in FIG. 6(b).

In addition, there are cases in which the threshold level distribution of memory cells shifts to a higher voltage regardless of whether or not a memory cell is adjacent to SGS and SGD, due to capacitance between opposing faces of a floating gate and an adjacent memory cell.

FIG. 10 is a drawing which explains the capacitance between opposing faces of a floating gate and adjacent memory cells. In FIG. 10(a) the floating gate (FG) 1001 is surrounded by the floating gates 1002, 1003, 1004 and 1005. When design rules are shortened with the aim of increasing memory capacity size, the distance between the floating gate 1001 and the adjacent floating gates 1002, 1003, 1004 and 1005 becomes smaller. As a result, there occurs a capacitive coupling between the floating gates. The cause of this capacitive coupling is called capacitance between opposing faces. Therefore, when the design rules are shortened, the capacitance between opposing faces between the floating gates 1001, 1002, 1003, 1004 and 1005 can no longer be ignored. In addition, the difficulty in forming a thin layer of insulation film which is formed between a floating gate and a control gate or between a floating gate and a channel layer of a memory cell is one reason why capacitance between opposing faces can not be ignored.

In FIG. 10(a), the condenser signs between the floating gates 1001, 1002, 1003, 1004 and 1005, schematically show the existence of this capacitance between opposing faces which can not be ignored. For example, when data is programmed to a memory cell which includes the floating gate 1001 and electrons are injected into the floating gate 1001, the potential of the floating gate 1001 decreases. This change in the potential of the floating gate 1001 also affects the adjacent floating gates 1002, 1003, 1004 and 1005 due to capacitance between opposing faces and the potential of each floating gate also decreases. As a result, this is the same as the amount of electrons increasing in the floating gates 1002, 1003, 1004 and 1005 which are adjacent to the floating gate 1001 and the threshold level of the memory cell which includes the floating gates 1002, 1003, 1004 and 1005 shifts to a higher voltage.

The more the amount of electrons injected to the floating gate of a memory cell which is adjacent to this memory cell, the more profound are the effects and the threshold level of the memory cell shifts to an even higher voltage. In addition, the higher the ratio of the capacitance between opposing faces between the floating gates to the overall capacitance of the floating gates, the threshold level of a memory cell further shifts to a higher voltage. In this way, the phenomenon whereby the threshold level increases due to surrounding memory cells is sometimes called memory cell interference.

In addition, as scaling-down technology of a semiconductor device progresses, the influence of capacitance between opposing faces between floating gates of opposite angles also increases as shown in FIG. 10(b). That is, in addition to the memory cell interference caused by the floating gates 1002, 1003, 1004, 1005 which are located above, below, left and right of the floating gate 1001, an increase in the threshold level also occurs easily by memory cell disturbance of the floating gates 1006, 1007, 1008 and 1009 which are located in a diagonal direction to the floating gate 1001.

Figure 11:
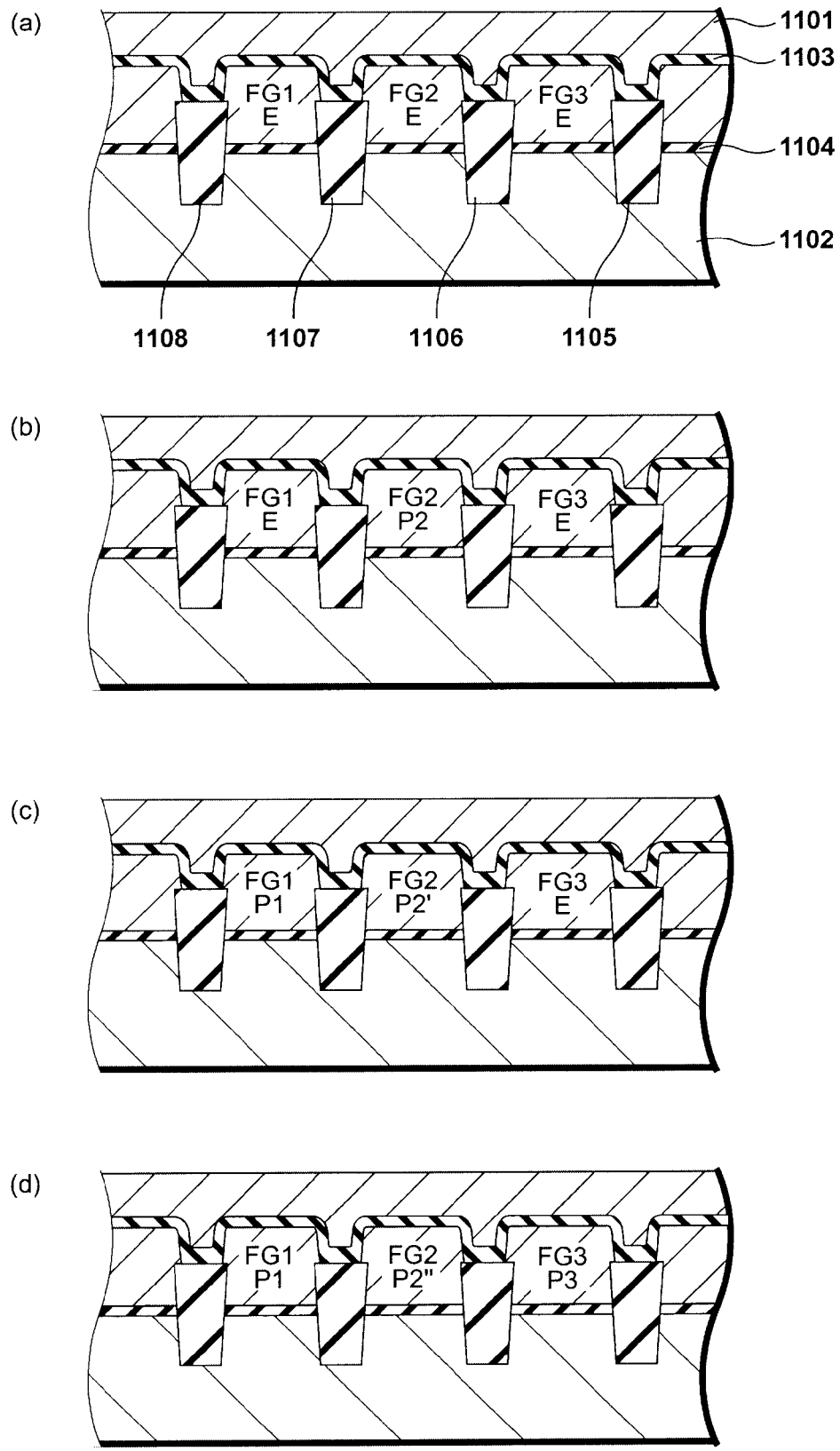
FIG. 11 is a cross section diagram which shows a memory array in a word line direction of a NAND type flash memory.

FIG. 11 shows a cross section of a memory cell array in a parallel direction to a word line of a NAND type flash memory. In FIG. 11(a) the cross section shows the structure of a floating gate cells. That is, there is a region 1101 which combines a word line and a control gate and below this there is an active region 1102. A floating gate which exists in the part which is enclosed by an ONO layer 1103, an insulation layer 1104, shallow trench isolation layers 1105, 1106, 1107 and 1108, between the region 1101 and the active region 1102.

Next, the three floating gates FG1, FG2 and FG3 shown in FIG. 11(a) to (d) are focused on. FIG. 11(a) supposes that all the memory cells are in a state where a data erasure process has taken place. In order to show this state, "E" is attached to each of the floating gates FG1, FG2 and FG3. "E" can be interpreted as showing that the threshold level of a memory cell is at its lowest level.

Next, it is supposed that data has been programmed to a memory cell which includes the floating gate FG2. Then, as shown in FIG. 11(b), the threshold level of a memory cell which includes the floating gate FG2 is presumed to be set at P2.

Next, data is programmed so that the threshold level of the memory cell which includes the floating gate FG1 becomes higher than its original threshold level or especially than the threshold level of the memory cell which includes the floating gate FG2. As shown in FIG. 11 (c), the threshold level of the memory cell which includes the floating gate FG1 is set at P1. In this case, because capacitance between opposing faces exists between the floating gates FG1 and FG2, the threshold level of the memory cell which includes the floating gate FG2 increases and changes to P2'.

Furthermore, data is programmed so that the threshold level of the memory cell which includes the floating gate FG3 becomes higher than its original threshold level or especially than the threshold level of the memory cell which includes the floating gate FG2. As shown in FIG. 11(d), the threshold level of the memory cell which includes the floating gate FG3 is set at P3. In this case, the floating gate is affected by capacitance between opposing faces between the floating gates FG2 and FG3. As a result, the threshold level of the memory cell which includes the floating gate FG2 further increases and becomes P2".

Memory cell interference of memory cells which are lined in a word line direction is explained as above referring to FIG.

11. Further, it is also possible to similarly explain memory cell interference of memory cells which are lined in a bit line direction.

FIG. 12 is a drawing which explains the change in threshold level of a memory cell due to capacitance between opposing faces explained above. FIG. 12(a) shows the distribution in the threshold level of memory cells immediately after programming using a certain verify level. FIG. 12(b) shows that in the case where programming is subsequently performed to memory cells adjacent to these memory cells, the distribution in the overall distribution level of these memory cells shifts to a higher voltage due to the effects of capacitance between opposing faces. If a different read level exists in the interval 1201, programming errors occur in the data which are programmed in these memory cells.

A shift of a threshold level due to capacitance between opposing faces is not generated only in memory cells which includes a floating gate structure. For example, this phenomenon can occur even in a charge trap type memory cell which includes a MONOS (Metal Oxide Nitride Oxide Semiconductor) structure for example.

In one aspect of the present invention, even a shift in a threshold level occurs as shown in FIG. 6(c), FIG. 12(b), etc., a programming method is disclosed in which a verify voltage at each programming loops steps up at the time of programming so that programming errors decrease.

First Embodiment

In the first embodiment of the present invention, a verify voltage is not set as a voltage which is equivalent to one minimum value of a threshold level distribution but a multi level verify voltages are used as a plurality of voltages which are lower than a minimum value of a threshold level and the verify voltages are switched during the programming loops. Below, an example of a method for programming 4 valued data is explained. Furthermore, the first embodiment of this invention is not limited to a method for programming 4 valued data (2 bit data) but can also be used for programming the other multi-level data such as 8 or 16. In addition, the first embodiment of this invention is not only a method for programming data to memory cells which are connected to a bit lines on the same word line but also a programming method for multiple programming of memory cells on the same word line such as the bit line shield method. Furthermore, it is not only a method for programming to memory cells on the same word line, data of all threshold levels not in an erasure state, but also a method for programming first data of a specified threshold level and subsequently data of all other threshold levels later.

FIG. 13(a) is a drawing which shows that a programming voltage (Vpgm) is applied each time in a pulse shape to a selected word line with its voltage level stepping up each time. FIG. 13(b) is a drawing which shows that a verify voltage is applied to a selected word line during a verify read operation which takes place after each trailing edge of pulse of the above stated programming voltage (Vpgm) has come and until the next leading edge of pulse of Vpgm comes. A voltage is applied as a verify voltage corresponding to each threshold level Level A, Level B and Level C.

In the example shown in FIG. 13(b), a verify voltage which corresponds to each threshold level is set as follows. That is, for Level A, a verify voltage is set in 4 steps, for example, from a first verify voltage to a fourth verify voltage. Then, the first verify voltage (A-1) is used after each of the first to the third application of the programming voltage Vpgm pulse, the second verify voltage (A-2) is used after each of the fourth to the sixth application of the programming voltage Vpgm pulse, the third verify voltage (A-3) is used during the seventh to the tenth application of the programming voltage Vpgm pulse and the fourth verify voltage (A-4) is used after the eleventh application of the programming voltage Vpgm pulse.

For Level B, a verify voltage is divided into 3 steps, from a first verify voltage to a third verify voltage. The first verify voltage (B-1) is used after each of the first to the sixth application of the programming voltage Vpgm pulse, the second verify voltage (B-2) is used after each of the seventh to the ninth application of the programming voltage Vpgm pulse and the third voltage (B-3) is used after the tenth application of the programming voltage Vpgm pulse.

For Level C, a verify voltage is divided into 2 steps, a first verify voltage and a second verify voltage. The first verify voltage (C-1) is used after each of the first to the tenth application of the programming voltage Vpgm pulse and the second voltage (C-2) is used after the eleventh application of the programming voltage Vpgm pulse.

Furthermore, the first embodiment of the present invention is not limited to the methods shown in FIGS. 13(a) and (b). For example, a number of variations can be provided. Only one verify voltage may be provided with each of Level B and Level C. Alternatively only one verify voltage may be provided only with Level C (while Level B is divided into steps). Furthermore, they may be divided into more steps than stated above.

Next, the structure of a means for realizing the method shown in FIGS. 13(a) and (b) is explained referring to the block diagram in FIG. 1. For example, initial setting data related to a programming operation is stored in the ROM fuse 122 shown in FIG. 1. The number of threshold levels, data related to verify voltages according to each threshold level, settings for switching verify voltages according to each threshold level, the number of step-ups of the programming voltage Vpgm which switches the verify voltages according to a threshold level and the verify voltage are all data which is stored as initial setting data. In the present specification, the number of step-ups of the programming voltage Vpgm which becomes the trigger for switching a verify voltage according to a threshold level is called the number of step-ups for switching a verify voltage.

The initial setting data related to these programming operations which are stored in the ROM fuse 122 may be programmed before the memory is shipped or, for example, loaded into a data register/controller circuit 13 via an input/output terminal I/O1-I/O8, I/O control circuit from an external controller (not shown in the diagram) and programmed to the ROM fuse 122.

When a power supply is switched on, a power on reset circuit (not shown in the drawings) operates and the control signal generator circuit 8 automatically controls the reading of the initial setting data which includes the above stated number of steps for switching a verify voltage to the data register/sense amplifier 13. The data related to the number of steps for switching a verify voltage is transferred to a parameter register 4, stored and further transferred to the control signal generator circuit 8. This parameter register 4 may be included inside the control signal generator circuit 8.

In the example shown in FIGS. 13(a) and (b), the data related to the number of steps for switching a verify voltage which is transferred to the parameter register 4 from the ROM fuse 122 is as follows. For the threshold level Level A, because a verify voltage is switched when the number of step-ups is 3, 6 and 10, data which shows 3, 6 and 10 values is transferred to the parameter register 4. For the threshold level Level B, because a verify voltage is switched when the number of step-ups is 6 and 9, data which shows 6 and 9 values is transferred to the parameter register 4. For the threshold level Level C, because a verify voltage is switched when the number of step-ups is 10, data which shows 10 values is transferred to the parameter register 4. This data related to the number of step-ups for switching a verify voltage is transferred to the comparison circuit 16. The data may also be stored in the comparison circuit 16. This comparison circuit 16 may also be included inside the control signal generator circuit 8.

Alternatively, the data corresponding to the verify voltages of each of the threshold levels Level A, B and C which is stored in the ROM fuse 122 is transferred to the control signal generator circuit 8 via the parameter register 4 and stored. When the data corresponding to the verify voltages of each of the threshold levels Level A, B and C is explained using the example shown in FIG. 13(b), for the threshold level Level A, the data shows that when 4 verify voltages are switched, the first verify voltage is A-1 (for example 0.1V), the second verify voltage is A-2 (for example 0.3V), the third verify voltage is A-3 (for example 0.5V) and the fourth verify voltage is A-4 (for example 0.7V). For the threshold level Level B, the data shows that when 3 verify voltages are switched, the first verify voltage is B-1 (for example 1.5V), the second verify voltage is B-2 (for example 1.6V) and the third verify voltage is B-3 (for example 1.7V). For the threshold level Level C, the data shows that when 2 verify voltages are switched, the first verify voltage is C-1 (for example 2.6V) and the second verify voltage is C-2 (for example 2.7V).

A counter circuit (not shown in the drawings) is arranged in the control signal generator circuit 8, and stores a value which counts the number of pulses (counting either the number of leading edges or trailing edges of pulses) when a programming voltage which is produced by the voltage generator circuit 9, is stepped up. This count value is transferred to the comparison circuit 16 and may also be stored.

With regards to each of the threshold levels Level A, B and C, the comparison circuit 16 compares the count value with data related to the number of step-ups for switching a verify voltage and transfers the comparison result to the control signal generator circuit 8. The control signal generator circuit 8 generates a signal which controls a verify voltage based on this comparison result. The voltage generator circuit 9 generates a verify voltage based on the control signal which is transferred from the control signal generator circuit 8.

The amount by which a threshold level shifts due to the GIDL phenomenon becomes larger as the threshold level of a memory cell becomes lower, and the amount by which a threshold level shifts due to the GIDL phenomenon becomes smaller as the threshold level of a memory cell becomes higher. Consequently, in the above example, it is preferred that the step-up height of a verify voltage with regards to Level A be larger than the height of a verify voltage with regards to Level B, and the step-up height of a verify voltage with regards to Level C be smaller than the height of a verify voltage with regards to Level B.

The relationship between a verify voltage with regards to each of the threshold levels Level A, B and C and the number of times a programming voltage Vpgm pulse is applied is shown in table 1. Further, the count value given in table 1 is only an example and not limited to this. The number of times a verify voltage is switched, the value of each verify voltage and the number of step-ups for switching a verify voltage can all be varied.

TABLE 1

| | | first | second | third | fourth |
|---|---|---|---|---|---|
| Level A verify | verify voltage | A-1 | A-2 | A-3 | A-4 |
| | program loop number | 1-3 | 4-6 | 7-10 | 11 or more |
| Level B verify | verify voltage | B-1 | B-2 | B-3 | |
| | program loop number | 1-6 | 7-9 | 10 or more | |
| Level C verify | verify voltage | C-1 | C-2 | | |
| | program loop number | 1-10 | 11 or more | | |

The control signal generator circuit 8 controls the voltage generator circuit 9 according to a threshold level by the result gained by comparing the count value with the number of step-ups generated by the comparison circuit 16 as shown below. While the number of step-ups is 2 or less, the control signal generator circuit 8 controls the voltage generator circuit 9 so that a first verify voltage (A-1, B-1, C-1) of each of the threshold levels Level A, B and C is generated.

While the number of step-ups is between 3 and 5, the control signal generator circuit 8 controls the voltage generator circuit 9 so that a second verify voltage (A-2) is generated for the threshold level Level A and a first verify voltage (B-1, C-1) for each of the threshold levels Level B and C is generated.

While the number of step-ups is between 6 and 8, the control signal generator circuit 8 controls the voltage generator circuit 9 so that a third verify voltage (A-3) is generated for the threshold level Level A, a second verify voltage (B-2) is generated for the threshold level Level B and a first verify voltage (C-1) is generated for the threshold level Level C.

When the number of step-ups is 9, the control signal generator circuit 8 controls the voltage generator circuit 9 so that a third verify voltage (A-3) is generated for the threshold level Level A, a third verify voltage (B-3) is generated for the threshold level Level B and a first verify voltage (C-1) is generated for the threshold level Level C.

When the number of step-ups is 10 or more, the control signal generator circuit 8 controls the voltage generator circuit 9 so that a fourth verify voltage (A-4) is generated for the threshold level Level A, a third verify voltage (B-3) is generated for the threshold level Level B and a second verify voltage (C-2) is generated for the threshold level Level C.

Figure 20:
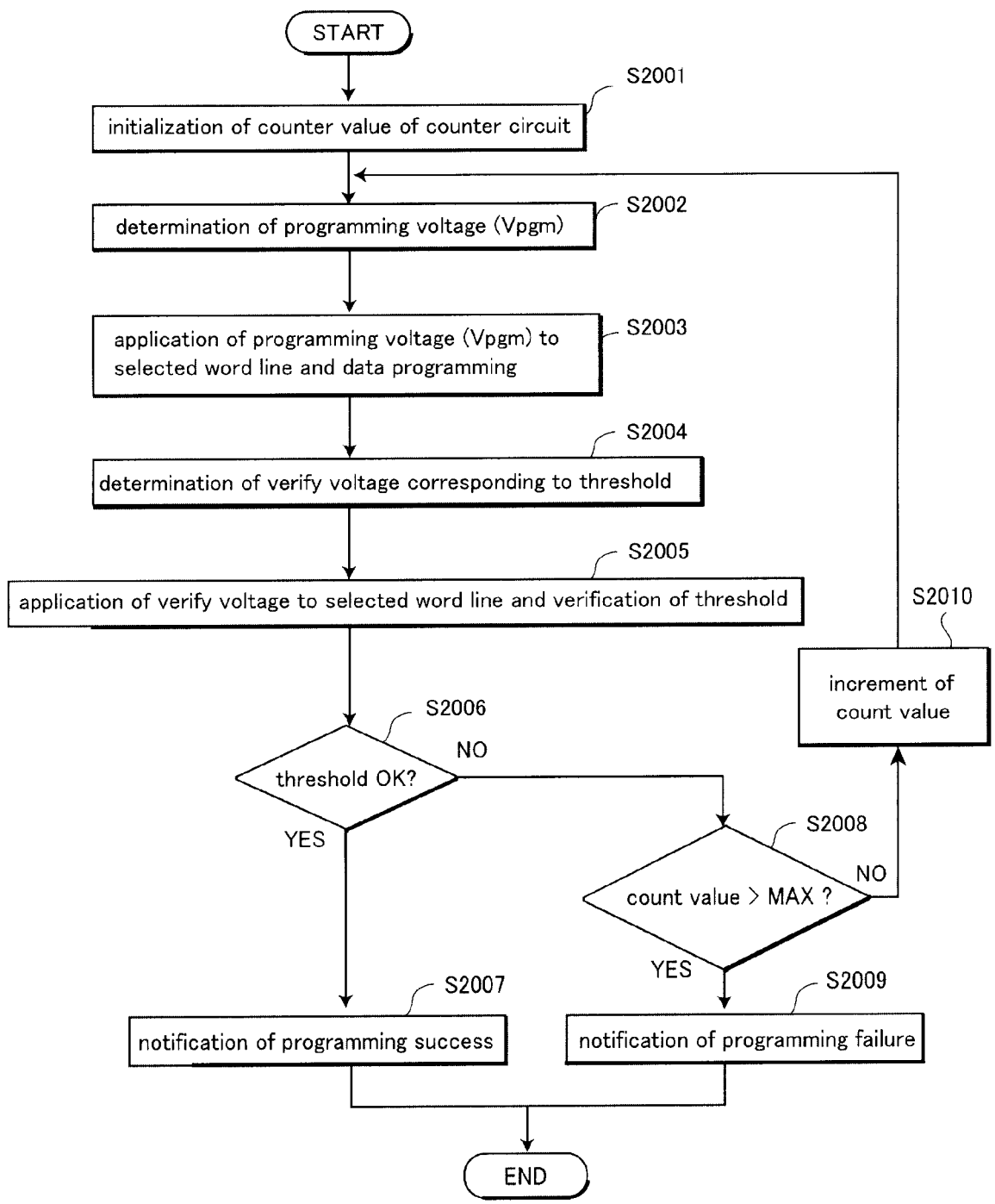
FIG. 20 is a flowchart which explains the operation of a nonvolatile semiconductor memory device related to one embodiment of the present invention.

FIG. 20 shows a flowchart which explains the process flow when data is programmed to a memory cell in a nonvolatile semiconductor memory device related to a first embodiment of this invention. The count value of the counter circuit is initialized as a process in step S2001. For example, the value of the counter circuit is initialized to 1. The value of a programming voltage (Vpgm) is set as a process in step S2002. Because a programming voltage is stepped up as stated above the value of a programming voltage is set by the count value of the counter circuit. The programming voltage (Vpgm) which is decided by step S2002 is applied to a selected word line and data is programmed as a process in step S2003.

Next, the value of a verify voltage corresponding to a threshold level is decided as a process in step S2004. That is, the verify voltage is decided depending on the threshold level of a memory cell in which data is programmed for either Level E, A, B or C and the comparison result obtained by the comparison circuit which uses the count value of the counter circuit. In addition, the verify voltage may be decided by considering the location of the selected word line. The location of the selected word line means, for example, whether the selected word line is adjacent to SGS or SGD, or how many other word lines there are between the selected word line and SGS/SGD.

Then, the verify voltage which is decided in step S2004 is applied to the selected word line and verification of the threshold level is performed as a process in step S2005. At this time, if a plurality of memory cells to which a plurality of thresholds are to be set are connected to the selected word line, a plurality of verify voltages may be applied corresponding to each threshold level in an ascending order and the verification performed.

In step S2006, the verification result is referred to and a judgment is made whether the threshold levels of all the memory cells connected to the selected word line are values corresponding to the data to be programmed. If this judgment is affirmative the process shifts to step S2007, an external device which is connected to the nonvolatile semiconductor memory device is notified of the success of the programming and the process is completed.

If the judgment result in step S2006 is negative, the processing goes to step S2008 and a MAX, which is a parameter which shows the maximum number of loops stored in a ROM fuse area for example, is compared with the count value of the counter circuit. If the count value exceeds this MAX the processing goes to step S2009 and a notification of programming failure is made and the process is completed. If the count value does not exceed this MAX the count value is incremented in the process step S2010 and the processing returns to step S2002.

The first embodiment of the present invention shown above may be applied depending on the positional relationship of a memory cell and a selection gate transistor which shows whether a memory cell is adjacent to a selection gate transistor and how many other memory cells exist between a certain memory cell and a selection gate transistor. The positional relationship between a memory cell and a selection gate transistor can be stated as the positional relationship between a word line which is connected to this memory cell and SGS/SGD. Consequently, a verify voltage may be changed depending on the positional relationship between a word line and SGS, SGD.

That is, the first embodiment of the present invention shown above may be limited to programming data to memory cells connected to the word line WL0, which is adjacent to SGS as shown in FIG. 4 and which is easily affected by GIDL, while the remaining word lines WL1-WLn may be programmed using a normal verify voltage, i.e., using one verify voltage level.

In addition, the first embodiment of the present invention may be limited to the word lines WL0 and WLn, which are adjacent to SGS/SGD shown in FIG. 4 and FIG. 8 and which are easily affected by GIDL, while the remaining word lines WL1-WLn-1 may be programmed using one normal verify voltage.

Figure 13:
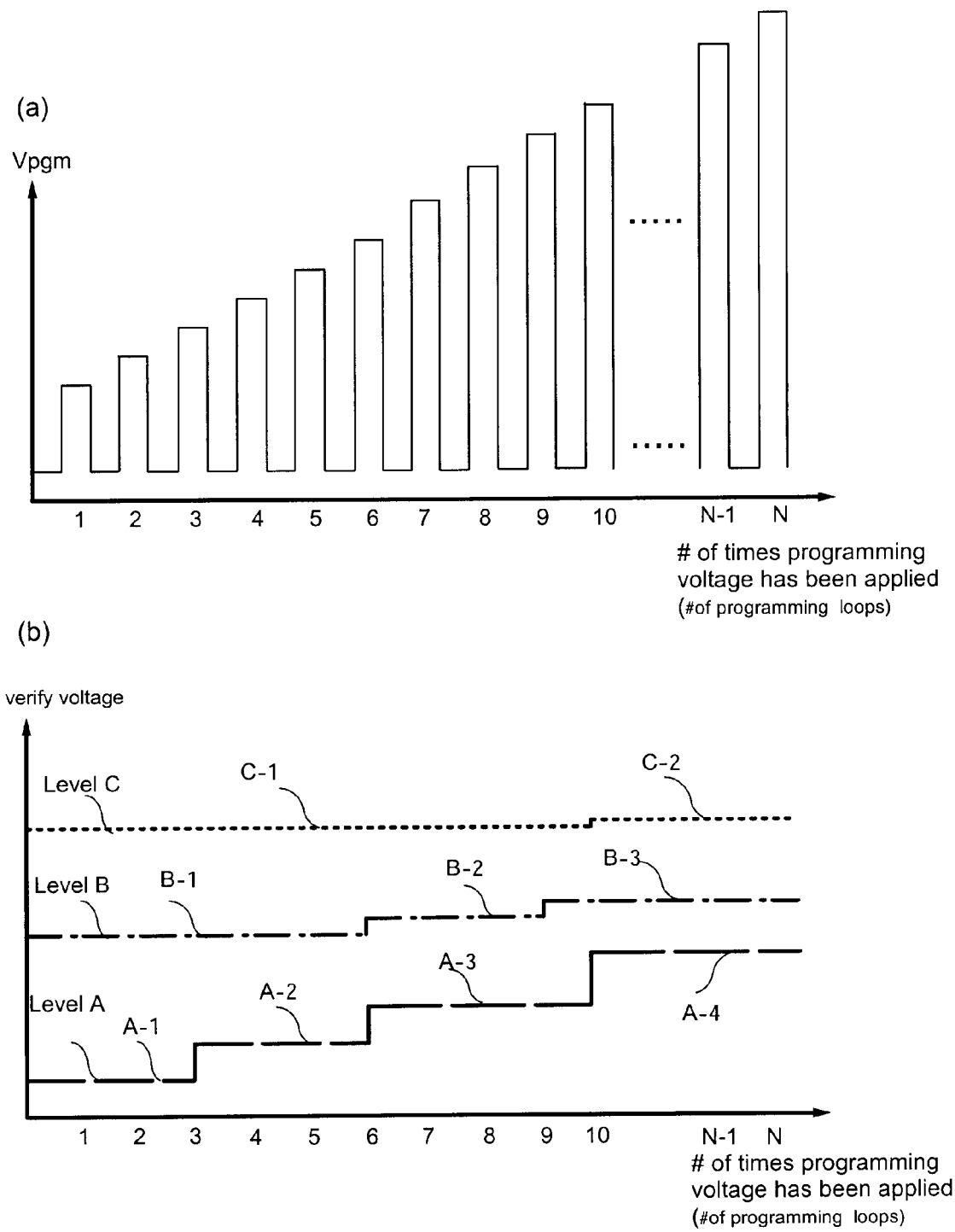
FIG. 13($a$) is a drawing which shows a step-up programming method related to one embodiment of this invention, and ($b$) is a drawing which shows an example of a verify voltage change related to one embodiment of this invention.
Figure 14:
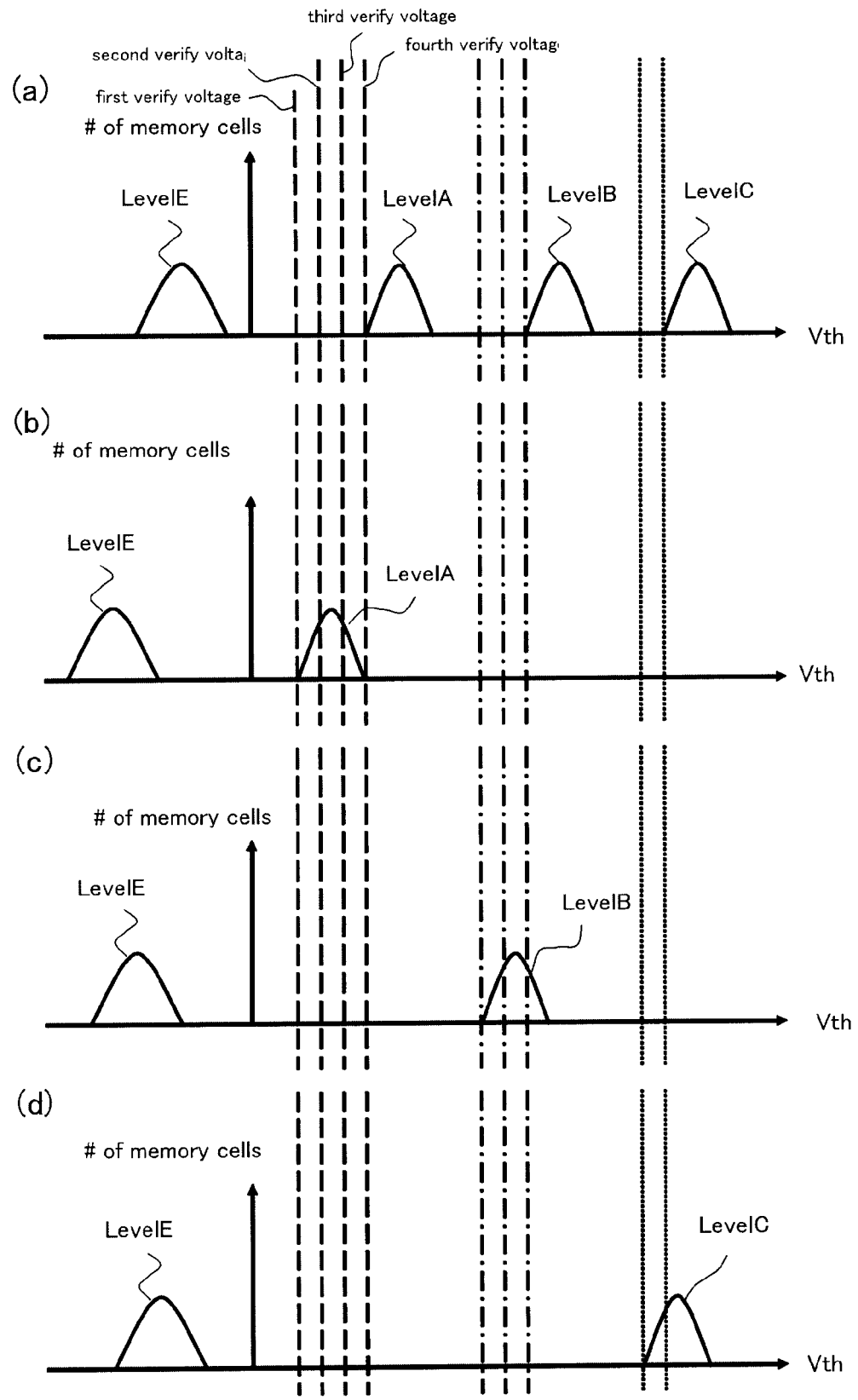
FIG. 14($a$) is a drawing which shows the entire threshold distribution of memory cells after all programming has finished according to one embodiment of the present invention, ($b$) is a drawing which shows a threshold distribution of a memory cell immediately after programming with a first verify voltage of Level A has finished according to one embodiment of the present invention, ($c$) is a drawing which shows a threshold distribution of a memory cell immediately after programming with a first verify voltage of Level B has finished according to one embodiment of the present invention, and ($d$) is a drawing which shows threshold distribution of a memory cell immediately after programming with a first verify voltage of Level C has finished according to one embodiment of the present invention.

FIG. 14(b) is a drawing which shows the threshold distribution of memory cells in which Level A threshold level data is to be programmed immediately before (immediately after programming 3 step-ups in FIG. 13(b)) a Level A first verify voltage (A-1) is switched to a second verify voltage (A-2) regarding to the memory cells on the word line WL0, which is adjacent to SGS, according to the first embodiment of this invention.

FIG. 14(c) is a drawing which shows the threshold distribution of memory cells in which Level B threshold level data is to be programmed immediately before (immediately after programming 6 step-ups in FIG. 13(b)) a Level B first verify voltage (B-1) is switched to a second verify voltage (B-2) regarding to memory cells on the word line WL0, which is adjacent to SGS according to the first embodiment of this invention.

In addition, FIG. 14(d) is a drawing which shows the threshold distribution of memory cells in which Level C threshold level data is to be programmed immediately before (immediately after programming 10 step-ups in FIG. 13(b)) a Level C first verify voltage (C-1) is switched to a second verify voltage (C-2) regarding to memory cells on the word line WL0, which is adjacent to SGS according to the first embodiment of this invention. Furthermore, regarding to the memory cells to which data corresponding to the threshold level E is to be programmed, the threshold distribution of memory cells in the erasure state is also shown.

FIG. 14(a) is a drawing which shows the threshold distribution of memory cells after data programming has finished to all memory cells connected to the word line WL0, which is adjacent to SGS. The threshold distribution of memory cells connected to the word line WLn, which is adjacent to SGD, is similar to FIG. 14(a).

According to the first embodiment of the present invention explained above, the threshold levels of memory cells to which data programming requires a small number of pulses for data programming distributes in a voltage range lower than the target threshold distribution as shown in FIG. 14(b). However, when the threshold levels of the memory cells are shifted to a higher voltage by GIDL, the threshold levels of the memory cells to which data programming requires a small number of pulses for data programming move into the target threshold distribution as shown in FIG. 14(a). In addition, in the case where data programming is performed in order from the memory cell closer to SGS towards the memory cell which is closer to SGD, data programming to the memory cells connected to the word line WL0 is completed before programming of the memory cells connected to the word line WLn and because the amount of shift of the threshold distribution becomes large, regarding each verify level corresponding to Level A, B and C, it is preferred that the verify voltage level for a memory cell on the word line WL0, which is adjacent to SGS, be set lower than the verify voltage for a memory cell on the word line WLn which is adjacent to SGD.

In addition, the first embodiment of the present invention may be applied not only to a memory cell which is close to SGS/SGD and which is easily affected by GIDL but also to memory cells connected to any word line.

That is, in the case of programming periphery memory cells (for example, MC1n-2, MC0n-1, etc. in FIG. 8) after a memory cell (for example, MC0n-2 in FIG. 8) has been programmed, the threshold level of the memory cell MC0n-2 in FIG. 8 sometimes shifts to a higher voltage due to capacitance between opposing faces. Consequently, as explained in the first embodiment of the present invention, by programming using a plurality of verify voltages, it is possible to offset this shift in the threshold level due to programming to periphery memory cells.

FIG. 15 is a drawing which explains a shift of the threshold distribution of memory cells in the case where a memory cell connected to any word line is programmed using the above stated (A-1), (A-2), (A-3), (A-4) as a plurality of verify voltages.

FIG. 15(a) shows a threshold distribution immediately after programming with the lowest (A-1) as a verify voltage. Then, if a sufficient threshold level can be obtained, the programming process is completed. In addition, If a sufficient threshold level can not be obtained at (A-1), the second lowest (A-2) is next used as a verify voltage. Furthermore, the distribution shown in FIG. 15(b) is left-right unsymmetrical and one reason why the bottom of the left side is pulled in a low threshold level direction is because a memory cell is judged to exist in which a sufficient threshold level has been obtained using (A-1) as a verify voltage.

Similarly, if a sufficient threshold level can not be obtained with (A-2) as a verify voltage then (A-3) is used as a verify voltage and the threshold distribution obtained is shown in FIG. 15(d). If a sufficient threshold level can not be obtained with (A-3) as a verify voltage then (A-4) is used as a verify voltage and the threshold distribution obtained is shown in FIG. 15(e).

The case where (A-1), (A-2), (A-3) and (A-4) is used as a verify voltage is explained, however, the same is the case when programming using the other verify voltages (B-1), (B-2), (B-3), (C-1), (C-2). In addition, the number of verify voltages is not limited to the number shown here. An appropriate number can be adopted.

In addition, depending on the state of programming periphery memory cells, there may be memory cells which are not affected by memory cell interference and the threshold of such memory cells may continue to be a low verify voltage. This is another reason for the unsymmetrical threshold distribution where one side is pulled in a low threshold level direction. However, generally, the number of such memory cells the thresholds of which continue to be a low verify voltage due to programming to periphery memory cells is considered to be exponentially reduced as the data programming process progresses.

In addition, even though memory cells the thresholds of which continue to be a low verify voltage exist and this may cause programming errors, it is possible to resolve such errors in the following way. That is, data which has been input by an I/O controller circuit 2 is made to be redundant by the addition of error correction codes by the data register/sense amplifier circuit 13 for example, and then programmed. Then, if error correction is carried out at the time of reading by an ECC (Error Correction Circuit) (not shown in the drawings) attached to the memory chip, it is possible to reduce the number of read errors.

In addition, the verify voltage which is used in programming data to a memory cell in which data programming becomes complete earlier may be set slightly lower than the verify voltage which is used in programming data to a memory cell in which programming becomes completed later. Alternatively, the verify voltage which is used in programming data to a memory cell in which programming becomes completed later may be set higher than the verify voltage which is used in programming data to a memory cell in which programming becomes completed earlier. In this way, the threshold of a memory cell in which programming becomes completed later is set higher than the threshold level of a memory cell in which programming becomes complete earlier.

These verify voltages are stored in the ROM fuse region 122 for example and are read and controlled by the control signal generator circuit 8.

The present embodiment can be applied not only to a memory cell connected to a word line which is adjacent to a selection gate transistor but also to a memory cell which is not adjacent to a selection gate transistor. In this case, it is preferred that the amount of step by step change of a verify voltage which is applied to a memory cell which is not adjacent to a selection gate transistor be set lower than that of a verify voltage which applied to a memory cell which is adjacent to selection gate transistor. In other words, it is preferred that the amount of step by step change of a verify voltage which is applied to a memory cell which is adjacent to a selection gate transistor be set larger than that of a verify voltage which applied to a memory cell which is not adjacent to selection gate transistor. This is because in a memory cell which is adjacent to a selection gate transistor, an increase of a threshold level caused by electron injection by GIDL is generated in addition to an increase of a threshold level of a memory cell which is generated by memory cell interference. In addition, with regards to a memory cell which is adjacent to a selection gate transistor, in the case where programming is performed in the order from the memory cell which is connected to the word line closer to the source side, it is preferred that the amount of step by step change of a verify voltage which is applied to a memory cell which is adjacent to a selection gate transistor on the source side be set larger than that of a verify voltage which applied to a memory cell which is adjacent to a selection gate transistor on the bit line side.

According to the first embodiment of this invention as explained above, in the nonvolatile semiconductor memory device of a multi-level (multi-bit) method, by setting verify voltages in step by step so that each step become lower than a normal verify voltage, data programming becomes completed earlier regarding to memory cells which requires a small number of programming pulses.

In this way, even if the threshold level of a memory cell which requires a small number of programming pulses shifts to a higher voltage due to, for example, the memory interference, that shift amount is cancelled out. Therefore it is accordingly possible to make the threshold level distribution fit to the threshold range corresponding to data to be programmed.

Second Embodiment

The second embodiment of the present invention not only switches step by step the verify voltage which is lower than a normal verify voltage according to the number of step-ups of a programming voltage Vpgm pulse the same as in the first embodiment but also uses the programming method described below. The programming method which is used in the second embodiment of the present invention controls a bit line voltage at the time of applying a programming voltage to a voltage between 0V and the power supply voltage Vdd in order to narrow a threshold distribution after succeeding to set a slightly lower threshold level than the target threshold level. In the present invention this programming method is called a second programming method and the programming method used in the first embodiment is called a first programming method.

Figure 16:
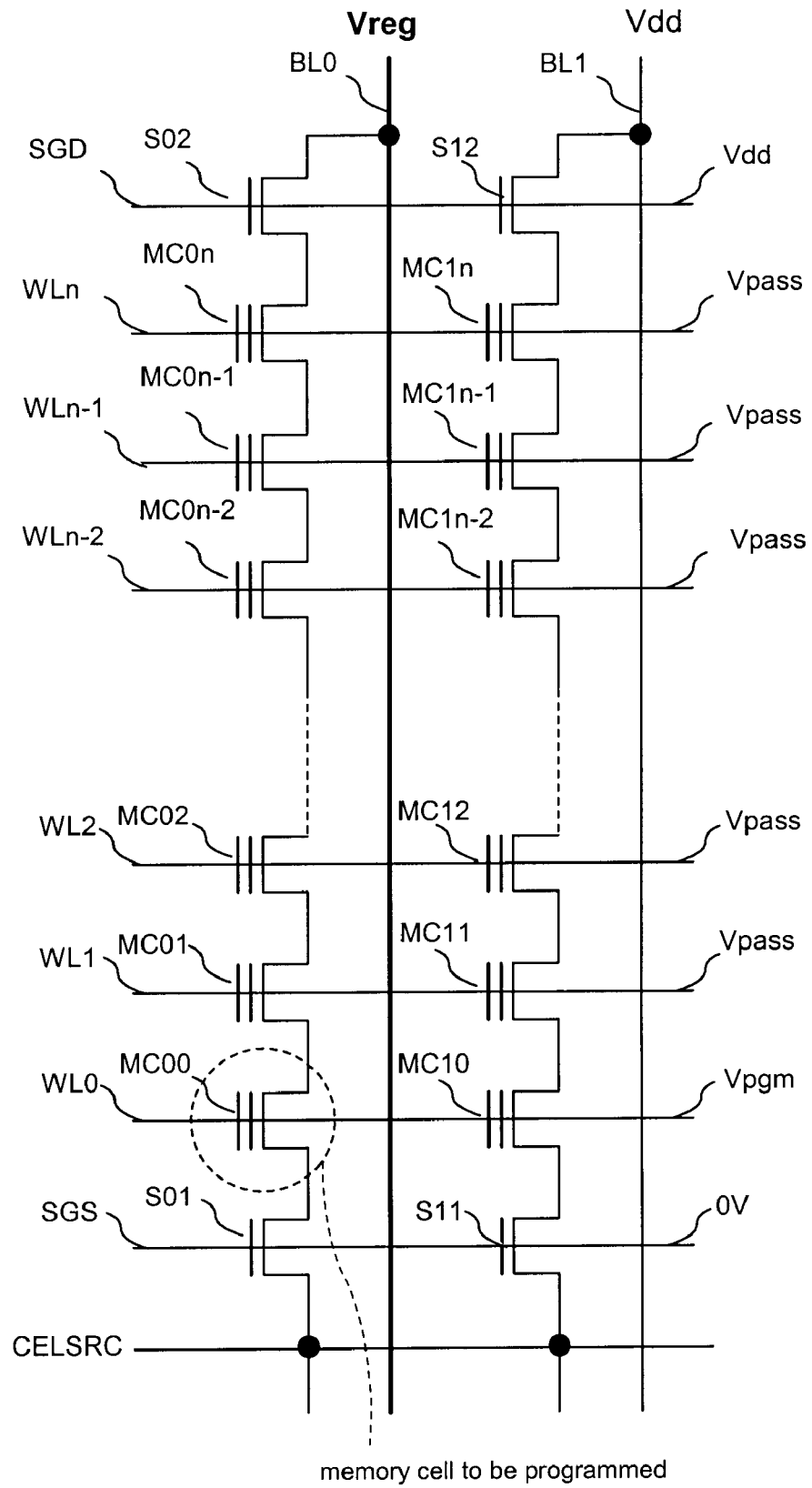
FIG. 16 is a circuit diagram which shows one example of the voltage application conditions in a case where a programming method of one embodiment of this invention is used.

FIG. 16 is a drawing for explaining a voltage application pattern in the case of using the second programming method. The second programming method can be applied to a memory cell connected to any word line as in the first programming method. Here, it is supposed that the memory cell MC00 shown in FIG. 16 is to be programmed. In the second programming method, a verify voltage is divided basically into two steps, a normal verify voltage (Vr) and a low verify voltage (VL) which is lower than the normal verify voltage. In the first programming method a bit line of the memory cell to be programmed is controlled so that it becomes 0V. Then, electrons are injected into a floating gate of a memory cell which is to be programmed by a voltage difference between a programming voltage between 14V-20V which is applied to a selected word line and a channel voltage of 0V.

In the second programming method, when the threshold level of a memory cell which is to be programmed exceeds this low verify voltage (VL), the voltage of the bit line BL0 is controlled to a programming control voltage (Vreg) from 0V as shown in FIG. 17(*b*). The programming control voltage (Vreg) is set at a medium voltage between 0V and Vdd. Then, the amount of electrons injected into the floating gate of a memory cell to be programmed under the application of Vreg becomes smaller than in the first programming method. This is because the application of Vreg realizes the reducing of the voltage difference between the programming voltage between 14V-20V, which is applied to the selected word line and a channel voltage Vreg. In this way, application of a programming voltage pulse and verification is repeated until the verify voltage is reached and the threshold level of the memory cell to be programmed is set within the target threshold level range. As a result, the controllability of a memory cell threshold level is improved and the threshold distribution is finally narrowed.

FIG. 17(*a*) is a drawing which shows a shift in a threshold level under the second programming method. FIG. 17(*b*) is a drawing which shows a bit line voltage being controlled to a medium voltage Vreg between 0V and Vdd when the threshold level of a memory cell to be programmed exceeds the low verify voltage (VL) under the second programming method. The threshold distribution until this low verify voltage (VL) is reached is as shown on the left side as shown in FIG. 17(*a*). When the threshold level exceeds the low verify voltage (VL) the bit line is controlled to a programming control voltage (Vreg), which is a medium voltage between 0V and Vdd as shown in FIG. 17(*b*). When a programming voltage pulse is applied in this state, the increase in the amount of electrons injected to the floating gate form the channel becomes more gradual and the application of the programming voltage pulse and verification is repeated slowly until the verify voltage (Vr) is reached. In this way, the change in voltage of a memory cell which is to be programmed becomes more gradual. Finally, the threshold distribution is set in a narrower distribution range as shown on the right side shown in FIG. 17(*a*).

In the second embodiment of the present invention, it is possible to divide not only the verify voltage (Vr) but also the low verify voltage of the second programming method into multi-steps according to the number of step-ups of a programming voltage Vpgm.

Figure 18:
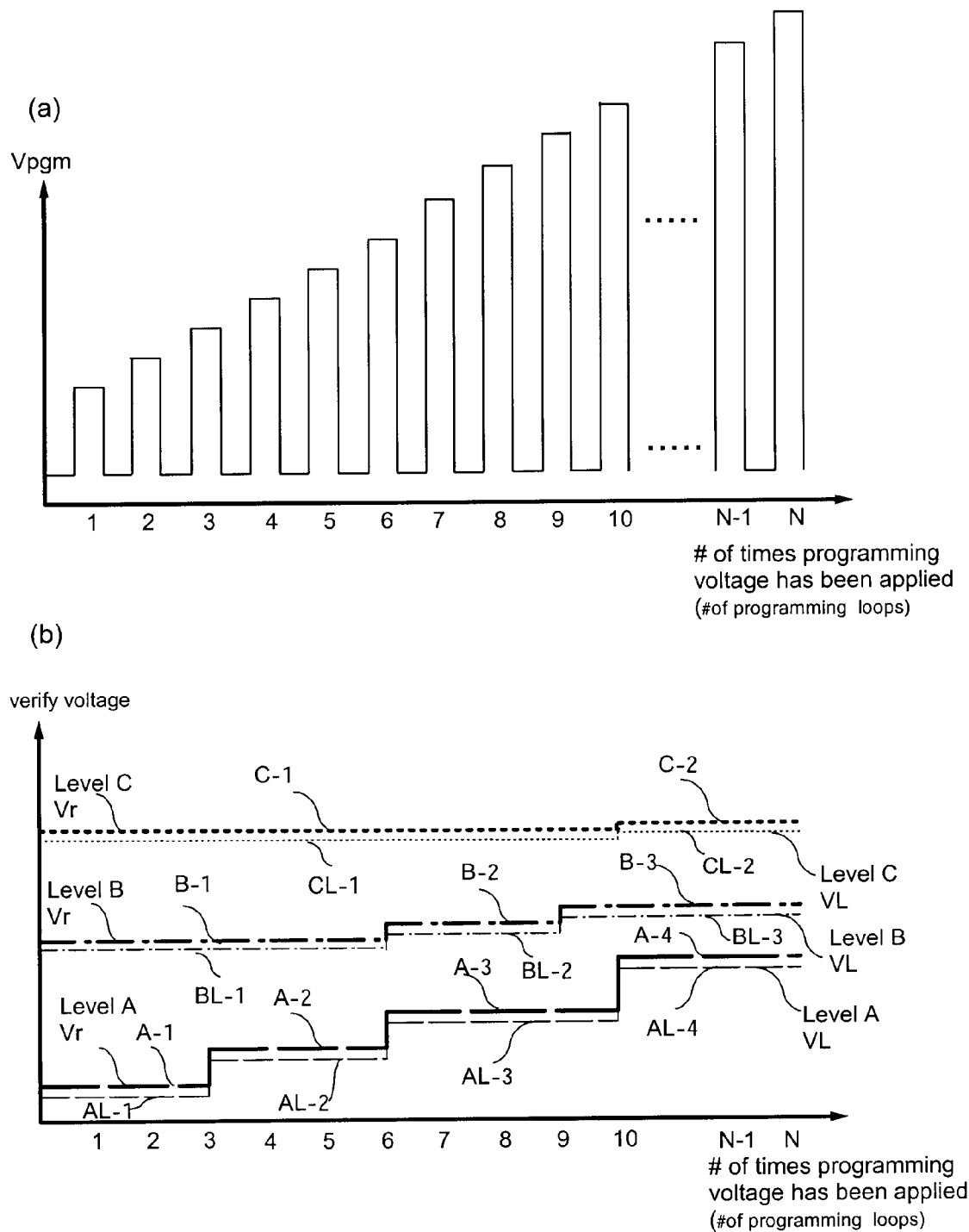
FIG. 18($a$) is a drawing which shows a step-up programming method related to one embodiment of this invention, and ($b$) is a drawing which shows a low verify voltage and a verify voltage related to one embodiment of the present invention.

Using an example shown in FIG. 18(*b*) with regards to Level A the verify voltage (Vr) is divided into four verify voltages from a first verify voltage to a fourth verify voltage. The first verify voltage (A-1) is used after each of the first to the third application of the programming voltage Vpgm pulse, the second verify voltage (A-2) is used after each of the fourth to the sixth application of the programming voltage Vpgm pulse, the third verify voltage (A-3) is used after each of the seventh to the tenth application of the programming voltage Vpgm pulse and the fourth verify voltage (A-4) is used after the eleventh application of the programming voltage Vpgm. In addition, similarly, the low verify voltage (VL) is divided into four voltages. The first low verify voltage (AL-1) is used after each of the first to the third application of the programming voltage Vpgm pulse, the second low verify voltage (AL-2) is used after each of the fourth to the sixth application of the programming voltage Vpgm pulse, the third low verify voltage (AL-3) is used after each of the seventh to the tenth application of the programming voltage Vpgm pulse and the fourth low verify voltage (AL-4) is used after the eleventh application of the programming voltage Vpgm.

The verify voltage (Vr) for Level B is divided into three verify voltages from a first verify voltage to a third verify voltage. The first verify voltage (B-1) is used after each of the first to the sixth application of the programming voltage Vpgm pulse, the second verify voltage (B-2) is used after each of the seventh to the ninth application of the programming voltage Vpgm pulse and the third voltage (B-3) is used after the tenth application of the programming voltage Vpgm pulse. In addition, the low verify voltage (VL) is divided into three low verify voltages from a first low verify voltage to a third low verify voltage. The first low verify voltage (BL-1) is used after each of the first to the sixth application of the programming voltage Vpgm pulse, the second low verify voltage (BL-2) is used after each of the seventh to the ninth application of the programming voltage Vpgm pulse and the third low verify voltage (BL-3) is used after the tenth application of the programming voltage Vpgm pulse.

For Level C, a verify voltage (Vr) is divided into 2 steps, a first verify voltage and a second verify voltage. The first verify voltage (C-1) is used after each of the first to the tenth application of the programming voltage Vpgm pulse and the second voltage (C-2) is used after the eleventh application of the programming voltage Vpgm pulse. In addition, the low verify voltage (VL) is divided into two low verify voltages, a first low verify voltage and a second low verify voltage. The first low verify voltage (CL-1) is used after each of the first to the tenth application of the programming voltage Vpgm pulse and the second low verify voltage (CL-2) is used after the eleventh application of the programming voltage Vpgm pulse.

Furthermore, the second embodiment of this invention is not limited to the examples shown in FIGS. 18(*a*) and (*b*). For example, a number of variations can be imagined. Only one low verify voltage may be defined to Level B and/or only one low verify voltage may be defined to Level C. Furthermore, they may be divided into more steps than stated above.

In addition, the difference between the low verify voltage and the verify voltage may be different between Level A, Level B, and Level C or it may be the same. Also, the difference between the low verify voltage and the verify voltage in each division may be different or the same in the same Level. In addition, a low verify voltage division and a verify voltage division may be different. For example, in Level A, the low verify voltage was divided into the first application to the third application, the fourth application to the sixth application, the seventh application to the tenth application and from the eleventh application by the number of pulse applications of Vpgm, however, a verify voltage may be divided into the first application to the fourth application, the fifth application to the tenth application and from the eleventh application.

In addition, the voltage Vreg may be set according to a low verify voltage when a threshold level of a memory cell exceeds this low verify voltage. For example, when the low verify voltage is (AL-1) the voltage Vreg which is applied to a bit line may be set higher than when the low verify voltage is (BL-1). By such a setting, it is possible to finely control the amount of electrons. For example, in the case where few electrons are injected into a floating gate and a verify voltage is low, the amount of electrons injected after a low verify voltage is exceeded is reduced.

Next, apart from the initial setting data of a low verify voltage (VL) and the voltage generator circuit 9 generating a low verify voltage (VL), the structure of a means to realize the second embodiment of this invention shown in FIGS. 18(*a*) and (*b*) is the same as in the first embodiment of this invention. The initial setting data related to a programming operation is stored for example in the ROM fuse 122 shown in the block diagram in FIG. 1. The initial data which is stored is data such as threshold level data, low verify voltage (VL) data corresponding to each threshold level, verify voltage (Vr) data corresponding to a threshold level, the number of step-ups of a programming voltage Vpgm which switches a low verify voltage (VL) corresponding to a threshold level, the number of step-ups of a programming voltage Vpgm which switches a verify voltage (Vr) corresponding to a threshold level, a low verify voltage (VL) value and a verify voltage (Vr) value. In the present specification, the number of step-ups of a programming voltage Vpgm which switches a low verify voltage corresponding to a threshold level is called "the number of step-ups for switching a low verify voltage" or "the step-up number for VL switching." In addition, the number of step-ups of a programming voltage Vpgm which switches a verify voltage corresponding to a threshold level is called "the number of step-ups for switching a verify voltage" or "the step-up number for Vr switching."

In the example in FIGS. 18(a) and (b) the data of the step-up number for VL switching, which is transferred from the ROM fuse 122 to the parameter register 4, is as follows. For the threshold level Level A, because a low verify voltage is switched when the number of step-ups is 3, 6, and 10, data which shows the values 3, 6 and 10 is transferred to the parameter register 4. For the threshold level Level B, because a low verify voltage is switched when the number of step-ups is 6, and 9, data which shows the values 6 and 9 is transferred to the parameter register 4. For the threshold level Level C, because a low verify voltage is switched when the number of step-ups is 10, data which shows the value 10 is transferred to the parameter register 4. The data of this step-up number for VL switching is transferred to the comparison circuit 16 and stored. This comparison circuit 16 may be included within the control signal generator circuit 8.

The data of the step-up number for Vr switching is the same as the example explained in the first embodiment.

Alternatively, the data corresponding to the low verify voltages (VL) of each of the threshold levels Level A, B and C which is stored in the ROM fuse 122 is transferred to the control signal generator circuit 8 via the parameter register 4 and stored. When the data corresponding to the low verify voltages of each of the threshold levels Level A, B and C is explained using the example shown in FIG. 18 (b), for the threshold level Level A, the data shows that there are 4 low verify voltages, the first low verify voltage is AL-1 (for example 0V), the second low verify voltage is AL-2 (for example 0.2V), the third low verify voltage is AL-3 (for example 0.4V) and the fourth low verify voltage is AL-4 (for example 0.6V). For the threshold level Level B, the data shows that there are 3 low verify voltages, the first low verify voltage is BL-1 (for example 1.4V), the second low verify voltage is BL-2 (for example 1.5V) and the third low verify voltage is BL-3 (for example 1.6V). For the threshold level Level C, the data shows that there are 2 low verify voltages, the first low verify voltage is CL-1 (for example 2.5V) and the second low verify voltage is CL-2 (for example 2.6V).

The data corresponding to each of the verify voltages of the threshold levels Level A, B and C which is stored in the ROM fuse 122 is the same as the example explained in the first embodiment of this invention.

A counter circuit arranged in the control signal generator circuit 8 stores a value which counts the number of pulses (counting the number of either the leading edges or the trailing edges) when a programming voltage which is generated by the voltage generator circuit 9, is stepped up. This count value is transferred to the comparison circuit 16 and stored. This comparison circuit 16 may be included within the control signal generator circuit 8.

With regards to each of the threshold levels Level A, B and C, the comparison circuit 16 compares the count value with data related to the step-up number for VL switching and data related to the step-up number for Vr switching and transfers the result to the control signal generator circuit 8. The control signal generator circuit 8 generates a signal which controls a low verify voltage (VL) and a verify voltage (Vr) from this comparison result. The voltage generator circuit 9 generates a low verify voltage and a verify voltage based on the control signal which is transferred from the control signal generator circuit 8.

The amount by which a threshold level shifts due to the GIDL phenomenon or the memory cell interference becomes larger as the threshold of the memory cell becomes lower and that amount becomes smaller as the threshold of the memory cell becomes higher. Consequently, in the above example, it is preferable that the step up height of a low verify voltage and a verify voltage with regards to Level A be the largest and the height of a low verify voltage and a verify voltage with regards to Level B be the medium and the height of a low verify voltage and a verify voltage with regards to Level C be the smallest.

The relationship between a low verify voltage with regards to each of the threshold levels Level A, B and C and the number of times a programming voltage Vpgm pulse is applied and the relationship between a verify voltage (Vr) of each of the threshold levels Level A, B and C and the number of times a programming voltage Vpgm pulse is applied is shown in table 2. Further, the count value given in table 2 is only an example and not limited to this. The number of times a verify voltage is switched, the value of each verify voltage and the number of step-ups for switching a verify voltage can all be varied. In addition, as long as the low verify voltage of each level is set lower than the verify level of each level and as long as the number of step-ups for switching is chosen in accordance with the characteristics of a memory cell, the same effects can be obtained.

TABLE 2

|  |  | first | second | third | fourth |
|---|---|---|---|---|---|
| Level A low verify | low verify voltage | AL-1 | AL-2 | AL-3 | AL-4 |
|  | program loop number | 1-3 | 4-6 | 7-10 | 11 or more |
| Level A verify | verify voltage | A-1 | A-2 | A-3 | A-4 |
|  | program loop number | 1-3 | 4-6 | 7-10 | 11 or more |
| Level B low verify | low verify voltage | BL-1 | BL-2 | BL-3 |  |
|  | program loop number | 1-6 | 7-9 | 10 or more |  |
| Level B verify | verify voltage | B-1 | B-2 | B-3 |  |
|  | program loop number | 1-6 | 7-9 | 10 or more |  |
| Level C low verify | low verify voltage | CL-1 | CL-2 |  |  |
|  | program loop number | 1-10 | 11 or more |  |  |
| Level C verify | verify voltage | C-1 | C-2 |  |  |
|  | program loop number | 1-10 | 11 or more |  |  |

The second embodiment of the present invention shown above can be applied to a memory cell connected to any word line. In particular, the application of the second embodiment of the present invention may be restricted to programming the word line WL0, which is adjacent to SGS as shown in FIG. 4 and which is easily affected by the GIDL phenomenon, the remaining word lines WL1-WLn may be programmed using a normal low verify voltage and verify voltage.

In addition, the application of the second embodiment of this invention may be restricted to the word lines WL0 and WLn, which are adjacent to SGS/SGD as shown in FIG. 4 and FIG. 8 and which are easily affected by the GIDL phenomenon, the remaining word lines WL1-WLn-1 may be programmed using a normal low verify voltage and a verify voltage.

Figure 19:
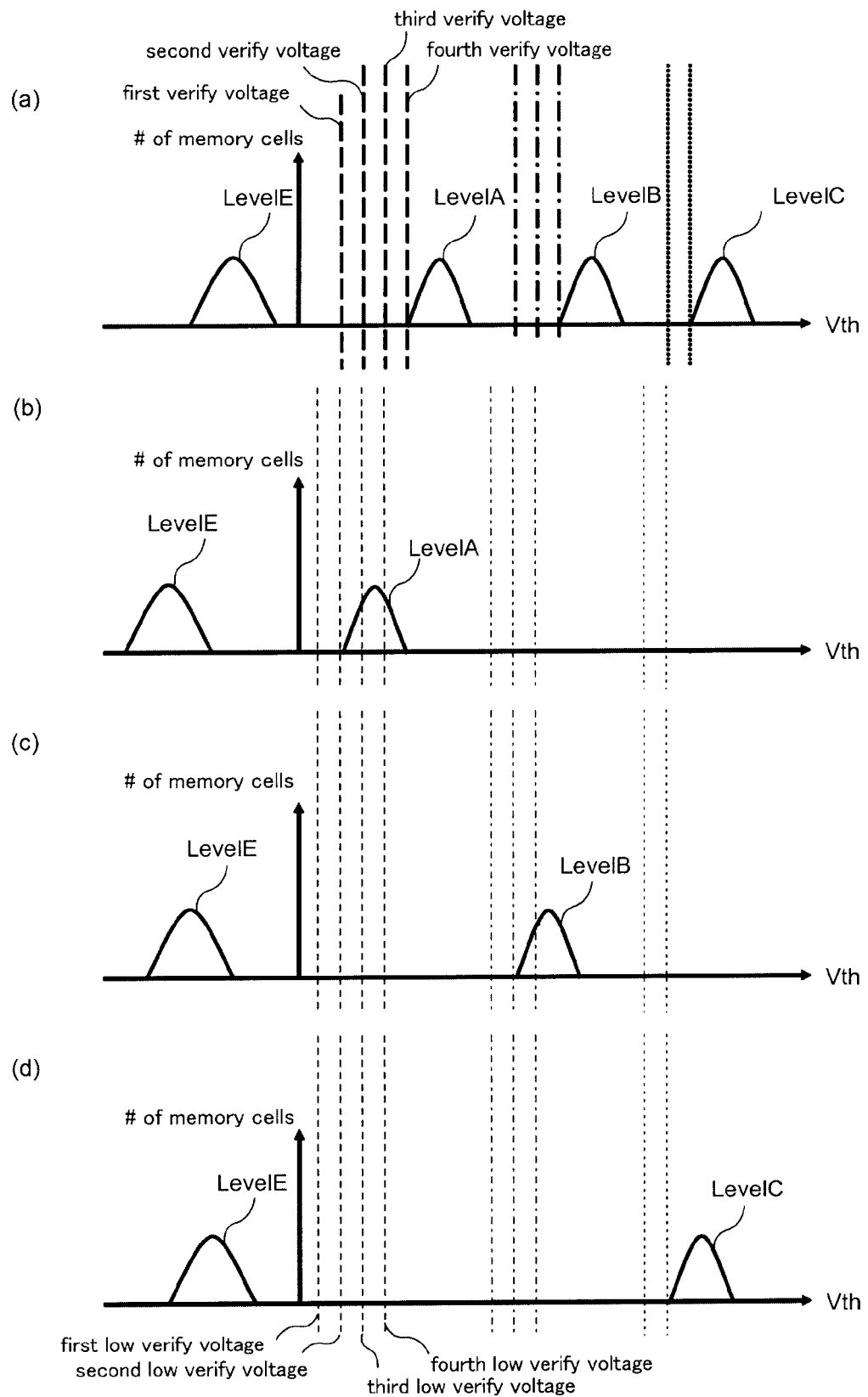
FIG. 19($a$) is a drawing which shows an entire threshold distribution of memory cells which are adjacent to SGS after all programming has finished according to one embodiment of the present invention, ($b$) is a drawing which shows a threshold distribution of a memory cell immediately after a low verify of Level A has finished according to one embodiment of the present invention, ($c$) is a drawing which shows a threshold distribution of a memory cell immediately after a low verify of Level B has finished according to one embodiment of the present invention, and ($d$) is a drawing which shows a threshold distribution of a memory cell immediately after a low verify of Level C has finished according to one embodiment of the present invention

FIG. 19(b) is a drawing which shows the threshold distribution of the memory cells to which Level A threshold level data is to be programmed immediately after a low verify has finished and immediately before (immediately after programming 3 step-ups in FIG. 13 (b)) a Level A first verify voltage (A-1) is switched to a second verify voltage (A-2), said memory cells being connected to the word line WL0, which is adjacent to SGS according to the second embodiment of the present invention.

FIG. 19(c) is a drawing which shows the threshold distribution of the memory cells to which Level B threshold level data is to be programmed immediately after a low verify has finished and immediately before (immediately after programming 6 step-ups in FIG. 13(b)) a Level B first verify voltage (B-1) is switched to a second verify voltage (B-2), said memory cells being connected to the word line WL0, which is adjacent to SGS according to the second embodiment of the present invention.

In addition, FIG. 19(d) is a drawing which shows the threshold distribution of the memory cells to which Level C threshold level data is to be programmed immediately after a low verify has finished and immediately before (immediately after programming 10 step-ups in FIG. 13(b)) a Level C first verify voltage (C-1) is switched to a second verify voltage (C-2), the said memory cells being connected to the word line WL0, which is adjacent to SGS according to the second embodiment of this invention.

Furthermore, as to the threshold Level E, the threshold distribution of the memory cells in an erasure state, in which no programming operation is done, is shown in FIG. 19(d).

FIG. 19(a) is a drawing which shows the threshold distribution of the memory cells after all programming has finished to the memory cells connected to the word line WL0, which is adjacent to SGS. These are the same for threshold distributions of memory cells on the word line WLn, which is adjacent to SGD.

According to the second embodiment of the present invention, the threshold level of a memory cell immediately after a low verify has finished is distributed in the range of lower voltage than the target threshold distribution as shown in FIG. 19(b). However, after the threshold level of a memory cell to be programmed exceeds a low verify voltage, the voltage of a bit line to be programmed is controlled to a medium voltage, which is between 0V and Vdd. In this way, even if the threshold level of a memory cell shifts to a higher voltage due to the GIDL phenomenon or the memory cell interference, the threshold distribution becomes narrower and is hardly different from the target threshold distribution shown in FIG. 19(a).

In addition, in the case where data programming is performed in order from the memory cells closer to SGS towards the memory cells which are closer to SGD, because data programming to the memory cells connected to the word line WL0 is completed earlier than data programming to the memory cells connected to the word line WLn and the amount of shift of the threshold distribution of the memory cells connected to WL0 becomes larger than the amount of shift of the threshold distribution of the memory cells connected to WLn, regarding each verify level corresponding to Level A, B and C, it is preferred that the voltage level for the memory cells on the word line WL0, which is adjacent to SGS be set lower than the voltage for the memory cells on the word line WLn, which is adjacent to SGD.

According to the second embodiment of the present invention explained above, in the nonvolatile semiconductor memory device of the multi-level memory method, by switching step by step the verify voltage which is lower than a normal verify voltage, and also by switching step by step the low verify voltage which is lower than a normal low verify voltage, as to the memory cells the data programming to which is completed at a comparatively low programming voltage the low verify for such memory cells is completed earlier at a lower verify level compared to the data programming of the prior art.

In this way, even if the threshold level of a memory cell the data programming to which is completed earlier shifts to a higher voltage by, for example, the GIDL phenomenon or the memory cell interference, it is accordingly possible to cancel out that shift and to make the threshold level distribution fit to the threshold range corresponding to data to be programmed and it is possible to further narrow the threshold distribution. In the present specification, the example of programming 4 values is used. However because each threshold distribution can be made narrower than in the prior art, the second embodiment of the present invention can also be effective for programming 8 values or 16 values.

In addition, as stated above, the present embodiment can be applied not only to a memory cell connected to the word line which is adjacent to a selection gate transistor but also to a memory cell which is not adjacent to a selection gate transistor. In this case, it is preferred that the amounts of the step-by-step change of a low verify voltage and a verify voltage which are applied to a memory cell which is not adjacent to a selection gate transistor be set smaller than a memory cell which is adjacent to selection gate transistor. In other words, it is preferred that the amount of step-by-step change of a low verify voltage and a verify voltage which are applied to a memory cell which is adjacent to a selection gate transistor be set larger than a memory cell which is not adjacent to selection gate transistor. This is because in a memory cell which is adjacent to a selection gate transistor, a threshold level shift caused by the electron injection by the GIDL phenomenon is generated in addition to a threshold level shift by the memory cell interference. In addition, with regards to a memory cell which is adjacent to a selection gate transistor, in the case where programming is performed in the order from the memory cell which is connected to the word line closer to the source line CELSRC, it is preferred that the amount of step-by-step change of a verify voltage which is applied to a memory cell which is adjacent to a selection gate transistor on the source line be set larger than that of a memory cell which is adjacent to a selection gate transistor on the bit line side.

Third Embodiment

In the second embodiment of the present invention, the step-up number for VL switching and the step-up number for Vr switching are defined for a low verify voltage (VL) and a verify voltage (Vr) respectively. That is, as shown in FIG. 18(b), when the number of applications of a programming voltage Vpgm becomes equal to one of the step-up number for VL switching and the step-up number for Vr switching, a low verify voltage (VL) or a verify voltage (Vr) steps up. As a third embodiment of the present invention, an embodiment in which a low verify voltage (VL) steps up but a verify voltage (Vr) is kept substantially constant is disclosed.

Figure 21:
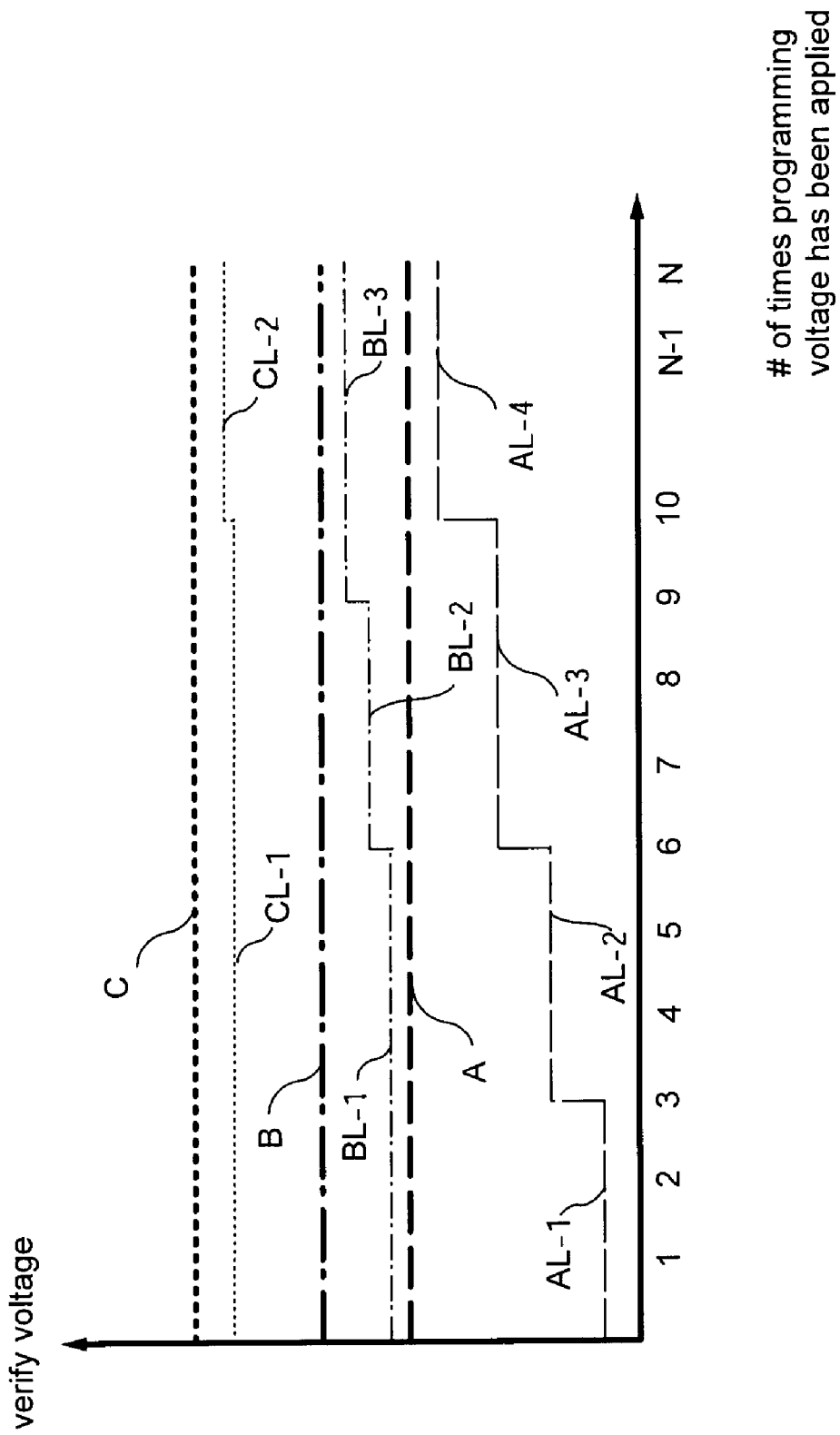
FIG. 21 is a drawing which shows a low verify voltage and a verify voltage related to one embodiment of this invention.

FIG. 21 shows an example of a shift between a low verify voltage (VL) and a verify voltage (Vr) in the third embodiment of this invention. That is, there are four low verify voltages with regards to the threshold level Level A. A first low verify voltage (AL-1) is used after each programming voltage Vpgm pulse application from a first application to a third application, a second low verify voltage (AL-2) is used after each programming voltage Vpgm pulse application from a fourth application to a sixth application, a third low verify voltage (AL-3) is used after each programming voltage Vpgm pulse application from a seventh application to a tenth application and a fourth low verify voltage (AL-4) is used after each programming voltage Vpgm pulse application from a tenth application.

With regards to the low verify voltage of the threshold level Level B, a first low verify voltage (BL-1) is used after each programming voltage Vpgm pulse application from a first application to a sixth application, a second low verify voltage (BL-2) is used after each programming voltage Vpgm pulse application from a seventh application to a ninth application and a third low verify voltage (BL-3) is used after each programming voltage Vpgm pulse application from a tenth application.

With regards to the low verify voltage of the threshold level Level C, a first low verify voltage (CL-1) is used after each programming voltage Vpgm pulse application from a first application to a tenth application and a second low verify voltage (CL-2) is used after each programming voltage Vpgm pulse application from an eleventh application.

Although the low verify voltage stated above is divided the verify voltage with regards to the threshold levels Level A, B, and C are not divided. A voltage level called I A, B, and C is used after every application of the programming voltage Vpgm pulse.

The relationship between the low verify voltage (VL) of each of the threshold levels Level A, B and C shown in FIG. 21 and the number of applications of a programming voltage Vpgm pulse and the verify voltage (Vr) of each of the threshold levels Level A, B and C is shown in table 3. Furthermore, examples are shown in FIG. 21 and table 3, although there can be a wide variety in the number of VL switching step-ups, each low verify voltage value and the verify voltage value. In addition, as long as the low verify voltage of each threshold value is set lower than the verify voltage of each level, the number of VL switching step-ups can be chosen according to the characteristics of a memory cell.

TABLE 3

|  |  | first | second | third | fourth |
|---|---|---|---|---|---|
| Level A low verify | low verify voltage | AL-1 | AL-2 | AL-3 | AL-4 |
|  | program loop number | 1-3 | 4-6 | 7-10 | 11 or more |
|  | Level A verify |  |  | A |  |
| Level B low verify | low verify voltage | BL-1 | BL-2 | BL-3 |  |
|  | program loop number | 1-6 | 7-9 | 10 or more |  |
|  | Level B verify |  |  | B |  |
| Level C low verify | low verify voltage | CL-1 | CL-2 |  |  |
|  | program loop number | 1-10 | 11 or more |  |  |
|  | Level C verify |  | C |  |  |

Data the same as that shown in table 3 is stored in, for example, the ROM fuse 122. Then, this data is read, transferred to the parameter register 4, and stored by the operation of a power on reset circuit. This data is referred to when verifying at the time of programming.

Figure 23:
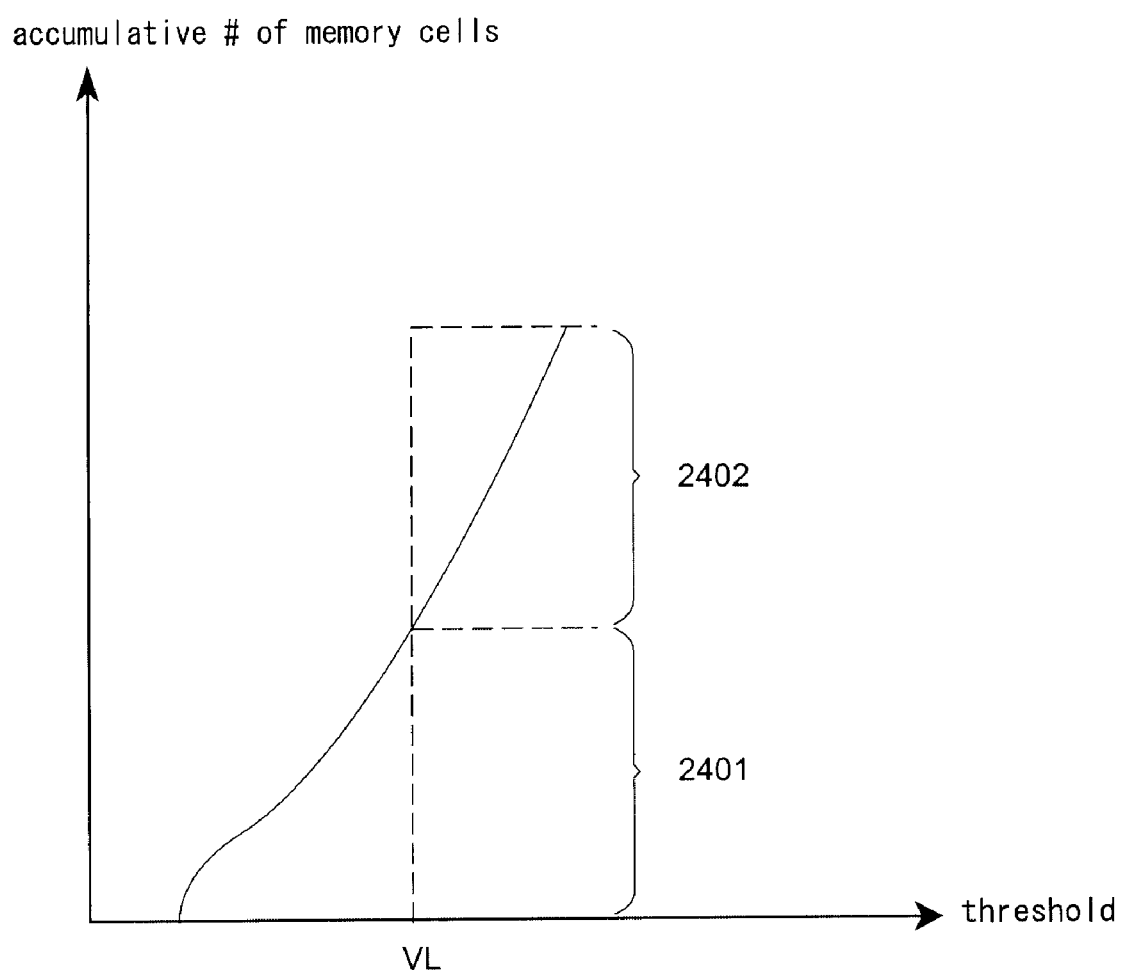
FIG. 23 is a drawing for explaining that it is possible to improve the controllability of a memory cell's threshold level in one embodiment of this invention.

The reason that the controllability of the threshold value of a memory cell is improved is explained referring to FIG. 22 and FIG. 23.

FIG. 22(a) shows an example of a shift of memory's threshold value by applying a programming voltage to a selected word line. In FIG. 22(a), the threshold distribution of memory cells before the application of programming voltage to a selected word line is given as the distribution 2201 ranging from V1 to V2. When a programming voltage is applied to a selected word line, the distribution shifts in the direction where the threshold voltage is higher and the distribution 2202 ranging from V3 to V4 is obtained.

FIG. 22(b) is a diagram which represents a threshold distribution of a memory cell using a method called a σ plot. In FIG. 22(a), the number of memory cells which has a threshold value is plotted against that threshold value. Alternatively, in FIG. 22(b), which uses a plot, the number of memory cells (or the number of cumulative memory cells) having a threshold value below each threshold value is plotted against that threshold value. Therefore, the curved line 2203, which is plotted against the distribution 2201 in FIG. 22(a), monotonically increases in a range from V1 to V2 and the curved line 2204, which is plotted against the distribution 2202, monotonically increases in a range from V3 to V4. The shift of the distribution 2201 to the distribution 2202 is represented by the shift of the curved line 2203 to the curved line 2204.

FIG. 23 is an example of a representation by a σ plot against a certain threshold distribution. In this case, the curved line of the σ plot representation is defined in the range which includes a low verify voltage (VL) of a certain threshold level. Consequently, this curved line can be divided into the part 2301 of memory cells having lower threshold levels than this low verify voltage (VL) and the part 2302 of memory cells having threshold levels which is not lower than the low verify voltage (VL).

Then, when a programming voltage is applied to a selected word line, the voltage of a bit line which is connected to a NAND cell unit having memory cells which form the part 2301, becomes 0V and the voltage of a bit line which is connected to a NAND cell unit having memory cells which form the part 2302 becomes a medium voltage, which is between 0V and Vdd. Therefore, the amount of shifts in threshold values of memory cells which forms the part 2302 becomes smaller than the amount of shifts in threshold values of memory cells which form the part 2301. As a result, the curved line of a threshold value after a programming voltage has been applied to the selected word line becomes defined by a range narrower than before application. As a result, the controllability of a memory cell's threshold value can be improved.

The operation of programming data to a memory cell in a nonvolatile semiconductor memory device related to one embodiment of the present invention will be explained below while referring to FIG. 24 and FIG. 25.

Figure 24:
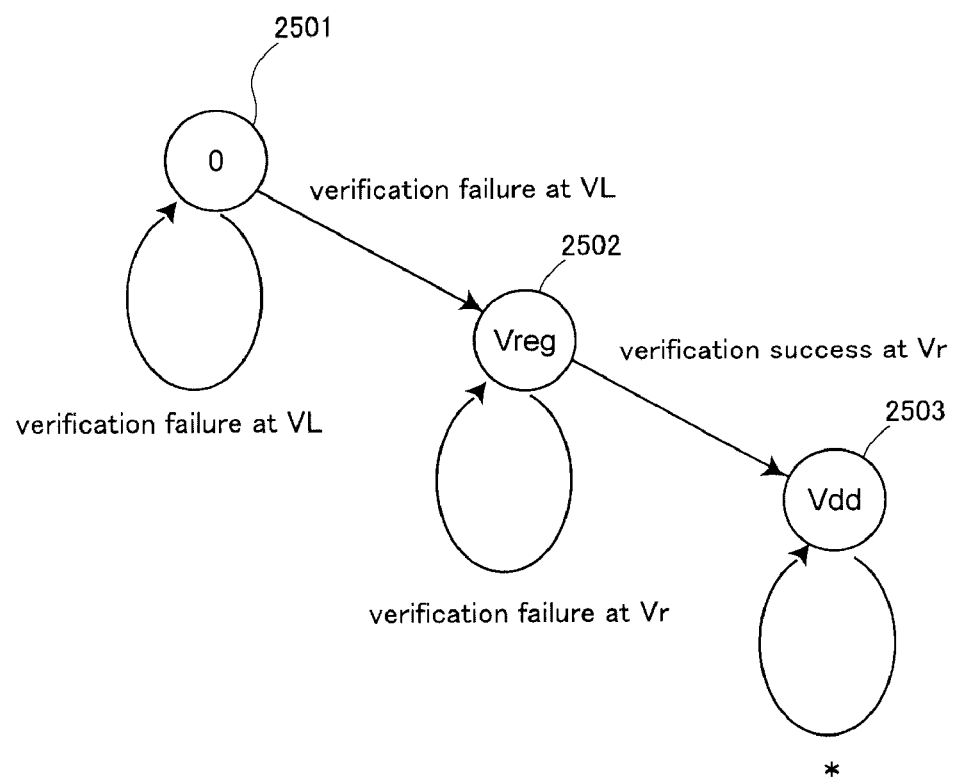
FIG. 24($a$) is an example drawing which shows a table for managing a voltage applied to a bit line used by a nonvolatile semiconductor memory device related to one embodiment of this invention and ($b$) is an example drawing of a shift in a change of a voltage applied to a bit line.

FIG. 24 is drawing which explains control of a voltage which is applied to a bit line. In the nonvolatile semiconductor memory device related to one embodiment of this invention, when a programming voltage is applied to selected word line, at least three types of voltage are applied to a bit line, i.e., 0, Vreg and Vdd. Consequently, a table similar to the table shown in FIG. 24(a) is managed by the control signal generator circuit 8, by a data register, or by the sense amplifier 13 for example. By managing the table, voltage to be applied to each bit line is managed.

The management of a table shown in FIG. 24(a) is performed in accordance with the state transition diagram shown in FIG. 24(b). At the initial state when data is programmed, a bit line voltage becomes 0V, which corresponds to the node 2401. As long as verification at a low verify voltage VL fails, the bit line voltage is presumed to be 0V. If the verification is successful at the low verify voltage VL, a state transition is performed from the node 2401 to the node 2402 and the bit line voltage becomes Vreg. Then, a verify voltage Vr is used at the time of verification. As long as the verification fails at the verify voltage Vr, the bit line voltage presumed to be Vreg. If the verification is successful at the verify voltage Vr, a state transition is performed from the node 2402 to the node 2403 and the bit line voltage becomes Vdd. Then, the bit line voltage becomes Vdd until programming is completed.

Figure 25:
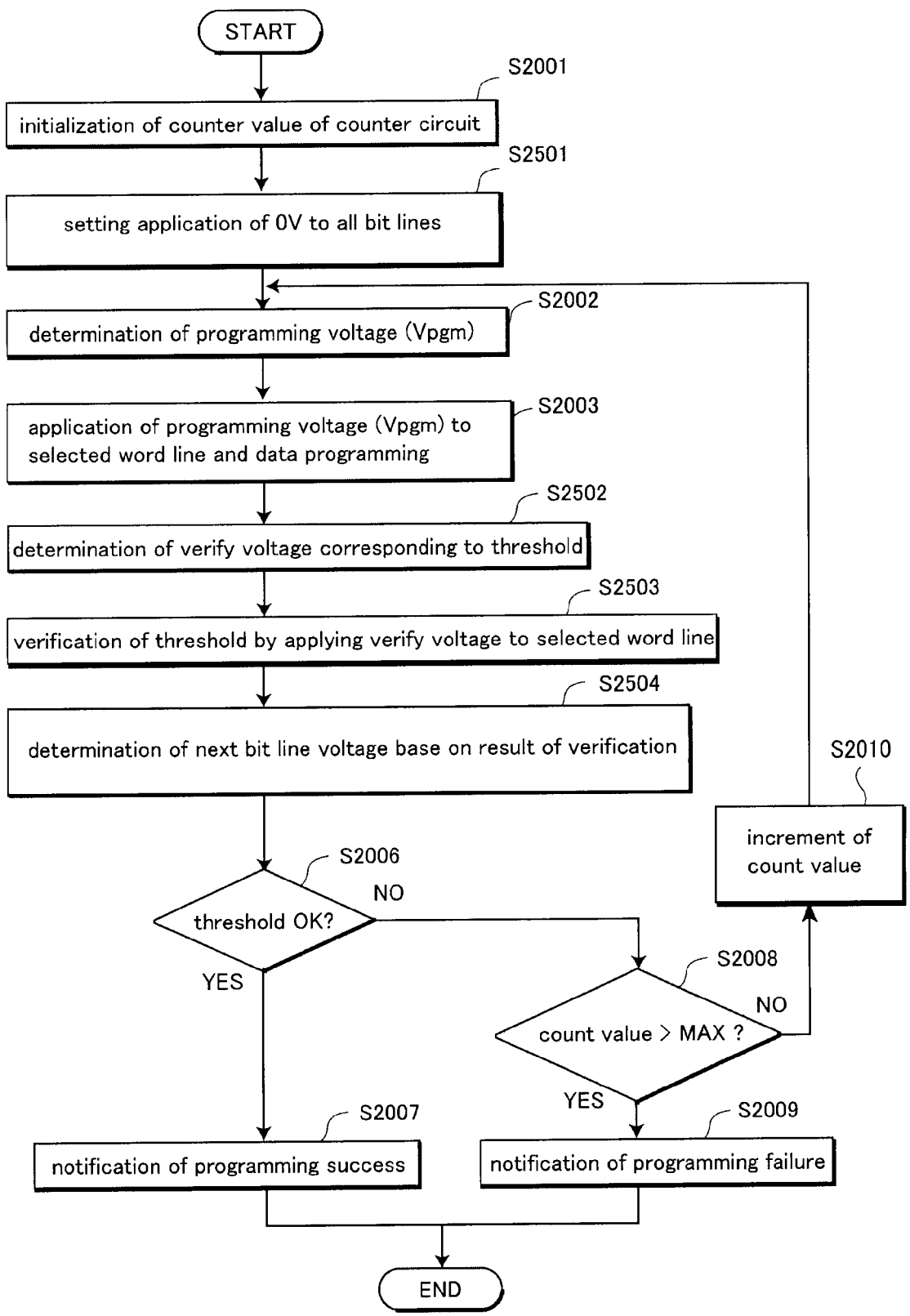
FIG. 25 is a flowchart of the processes of a nonvolatile semiconductor memory device related to one embodiment of this invention.

FIG. 25 is a flowchart which explains the process flow when data is programmed to a memory cell in a nonvolatile semiconductor memory device related to the present invention. Furthermore, the same symbols are attached to the steps in which the process flow is the same as in the flowchart in FIG. 20 which explains the process flow when data is programmed to a memory cell in the nonvolatile semiconductor memory device related to the present invention.

A count value of the counter circuit is initialized as a process in the step S2001. In the step S2501, all voltages of the bit lines connected to memory cells which are not to be left in the erasure state are set at 0V. Specifically, in the table shown in FIG. 24(*a*), the values of all the columns of the row of bit lines connected to memory cells which are not to be left in the erasure state are set to 0V. Next, the value of a programming voltage (Vpgm) is determined as a process in step S2002. The programming voltage (Vpgm) which is determined in step S2002 is applied to a selected word line and data is programmed to a memory cell as a process in step S2003.

The value of a verify voltage corresponding to a threshold level is decided as a process in step S2502. The verify voltage is determined depending on the threshold level of a memory cell in which data is programmed for either Level E, A, B or C or the comparison result gained by the comparison circuit which uses the count value of the counter circuit or whether a low verify is successful or not. In addition, the verify voltage may be determined based on the location of a selected word line and the present or future programming state of data in periphery memory cells.

Then, the verify voltage which is decided in step S2004 is applied to a selected word line and verification of the threshold level is performed as a process in step S2503. At this time, if a plurality of memory cells to which a plurality of thresholds respectively are connected to the selected word line exist, a plurality of verify voltages may be applied in order corresponding to each threshold level and verification performed.

A voltage which is applied to a bit line when data is next programmed (at the time of the process in step S2003) is determined in the process of step S2504 according to the state transition diagram in FIG. 24(*b*) based on a verification result.

The remaining steps are the same as in FIG. 20 therefore their explanation is omitted here.

In this way, according to one embodiment of the present invention, the controllability of the memory cell threshold can be improved by stepping up a low verify voltage and fixing a verify voltage.

In addition, it is possible to realize various usage examples and improved examples based on the explanation stated in the second embodiment of the present invention. For example, the third embodiment of the present invention may be used with a memory cell which is adjacent to a selection gate transistor and other embodiments may be used with other memory cells.

Fourth Embodiment

In the second embodiment of the present invention, as shown in FIG. 18(*b*), when the number of times a programming voltage Vpgm is applied becomes equal to one of t the step-up number for VL switching and the step-up number for Vr switching, a low verify voltage (VL) or a verify voltage (Vr) is stepped up. As a fourth embodiment of the present invention, an embodiment in which a low verify voltage (VL) is kept substantially constant and a verify voltage (Vr) is stepped up is disclosed.

Figure 26:
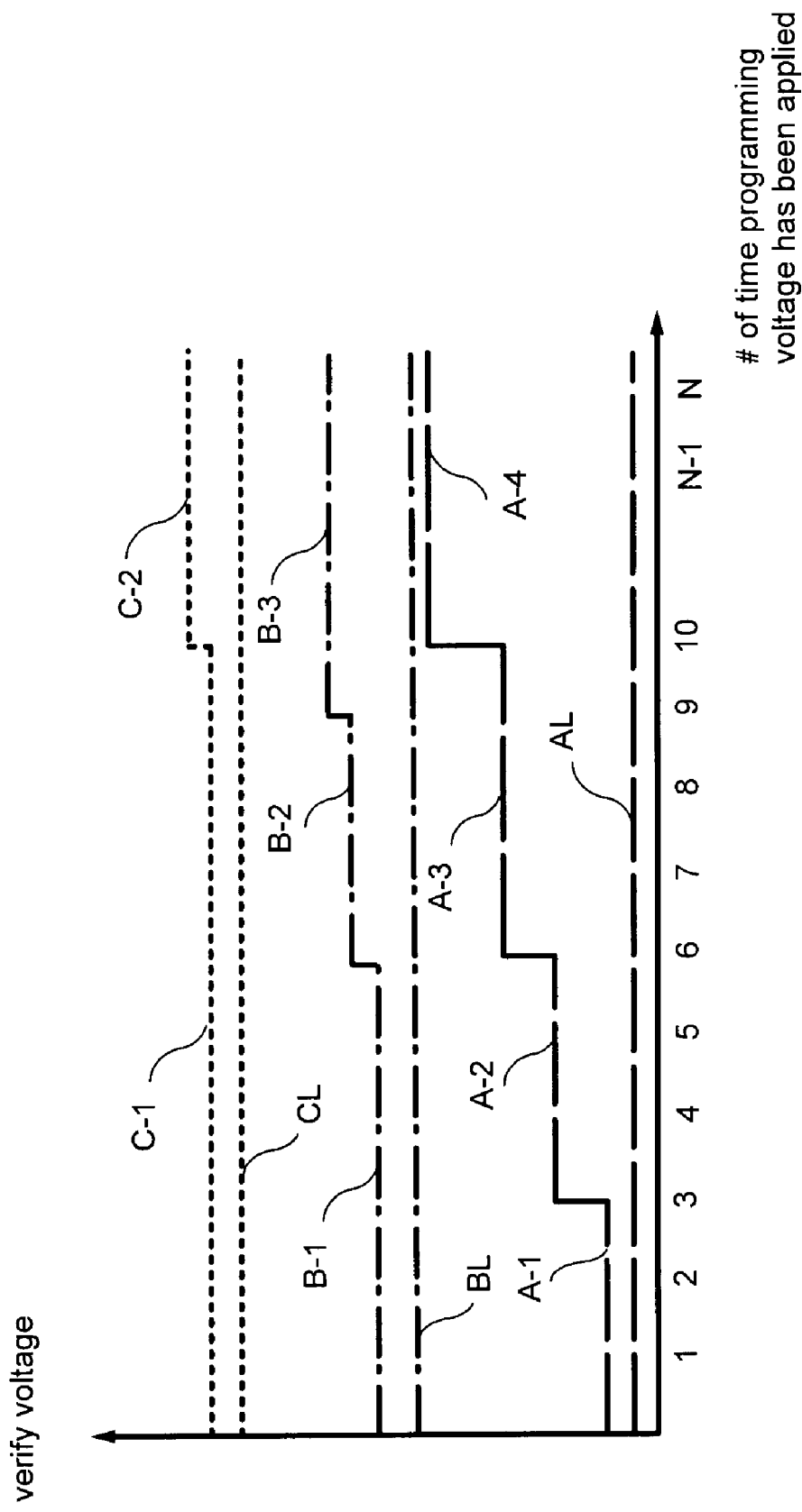
FIG. 26 is a drawing which shows a low verify voltage and a verify voltage related to one embodiment of this invention.

FIG. 26 shows one example of a shift between a low verify voltage (VL) and a verify voltage (Vr) in a fourth embodiment of the present invention. That is, there are four verify voltages with regards to the threshold level Level A. A first verify voltage (A-1) is used after each programming voltage Vpgm pulse application from a first application to a third application, a second verify voltage (A-2) is used after each programming voltage Vpgm pulse application from a fourth application to a sixth application, a third verify voltage (A-3) is used after each programming voltage Vpgm pulse application from a seventh application to a tenth application and a fourth verify voltage (A-4) is used after each programming voltage Vpgm pulse application from a tenth application.

With regards to the verify voltage of the threshold level Level B, a first verify voltage (B-1) is used after each programming voltage Vpgm pulse application from a first application to a sixth application, a second verify voltage (B-2) is used after each programming voltage Vpgm pulse application from a seventh application to a ninth application and a third verify voltage (B-3) is used after each programming voltage Vpgm pulse application from a tenth application.

With regards to the verify voltage of the threshold level Level C, a first verify voltage (C-1) is used after each programming voltage Vpgm pulse application from a first application to a tenth application and a second verify voltage (C-2) is used after each programming voltage Vpgm pulse application from an eleventh application.

Although there are a plurality of verify voltages as stated for one or more of among the target threshold levels, the low verify voltage with regards to each of threshold levels Level A, B, and C are not plural. In this embodiment of the present invention, voltage levels called AL, BL, and CL are used after every application of the programming voltage Vpgm pulse for each target threshold levels.

The relationship between the verify voltage (Vr) of each of the threshold levels Level A, B and C shown in FIG. 26 and the number of applications of a programming voltage Vpgm pulse and the low verify voltage (VL) of each of the threshold levels Level A, B and C is shown in table 4. Furthermore, examples are shown in FIG. 26 and table 4, although there can be a wide variety in the number of Vr switching step-ups, each verify voltage value and the low verify voltage value. In addition, as long as the low verify voltage of each threshold value is set lower than the verify voltage of each level, the number of Vr switching step-ups can be chosen according to the characteristics of a memory cell.

TABLE 4

|  |  | first | second | third | fourth |
|---|---|---|---|---|---|
| Level A low verify |  |  |  | AL |  |
| Level A verify | verify voltage | A-1 | A-2 | A-3 | A-4 |
|  | program loop number | 1-3 | 4-6 | 7-10 | 11 or more |
| Level B low verify |  |  |  | BL |  |
| Level B verify | verify voltage | B-1 | B-2 | B-3 |  |
|  | program loop number | 1-6 | 1-9 | 10 or more |  |
| Level C low verify |  |  |  | CL |  |
| Level C verify | verify voltage | C-1 | C-2 |  |  |
|  | program loop number | 1-10 | 11 or more |  |  |

Data the same as that shown in table 4 is held in, for example, the ROM fuse 122. Then, this data is read, transferred to the parameter register 4, and stored by the operation of a power on reset circuit. This data is referred to when verifying at the time of programming.

Figure 27:
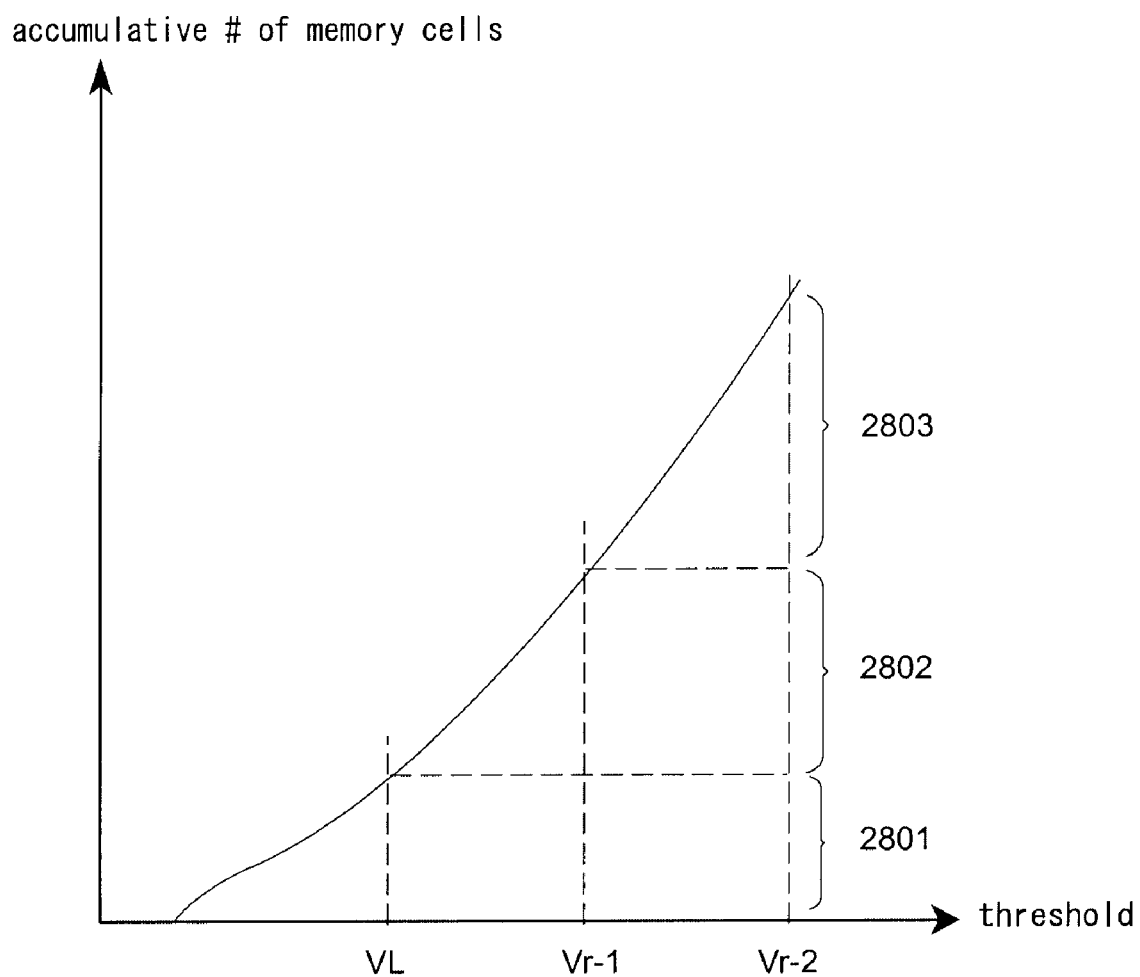
FIG. 27 is a drawing for explaining that it is possible to improve the control of a memory cell's threshold level in one embodiment of this invention.

FIG. 27 is a drawing which explains by using a σ plot the reason that the controllability of the threshold value of a memory cell can be improved in this embodiment of the present invention. It is presupposed that there is a low verify voltage VL and a verify voltage which is to be stepped up, Vr-1 and Vr-2. Then, a curved line which shows the number of cumulative cells is divided into the part 2701, which is lower than VL, the part 2702, which is more than VL but less Vr-1, and the part 2703, which is more than Vr-1 but less than Vr-2.

Because the voltage of a bit line which is connected to a NAND cell unit having memory cells which form the part 2701, becomes 0V, when a programming voltage Vpgm is applied to a selected word line, the threshold level of memory cells of the part 2701 moves more than those of memory cells which form the parts 2702 and 2703.

In addition, as the data programming at a certain target threshold operation progresses, the number of memory cells which become ON at the time of verification increases and the number of NAND cell units which make a current flow from a bit line to a source line CELSRC increases. That is, a current which flows into the source line CELSRC increases and the voltage of the source line CELSRC increases by the existence of electrical resistance within the common source line. As a result, at the time of verification, a phenomenon occurs whereby the threshold level of a memory cell apparently increases. This phenomenon becomes particularly noticeable when the threshold of a memory cell is distributed in a low voltage range.

Figure 28:
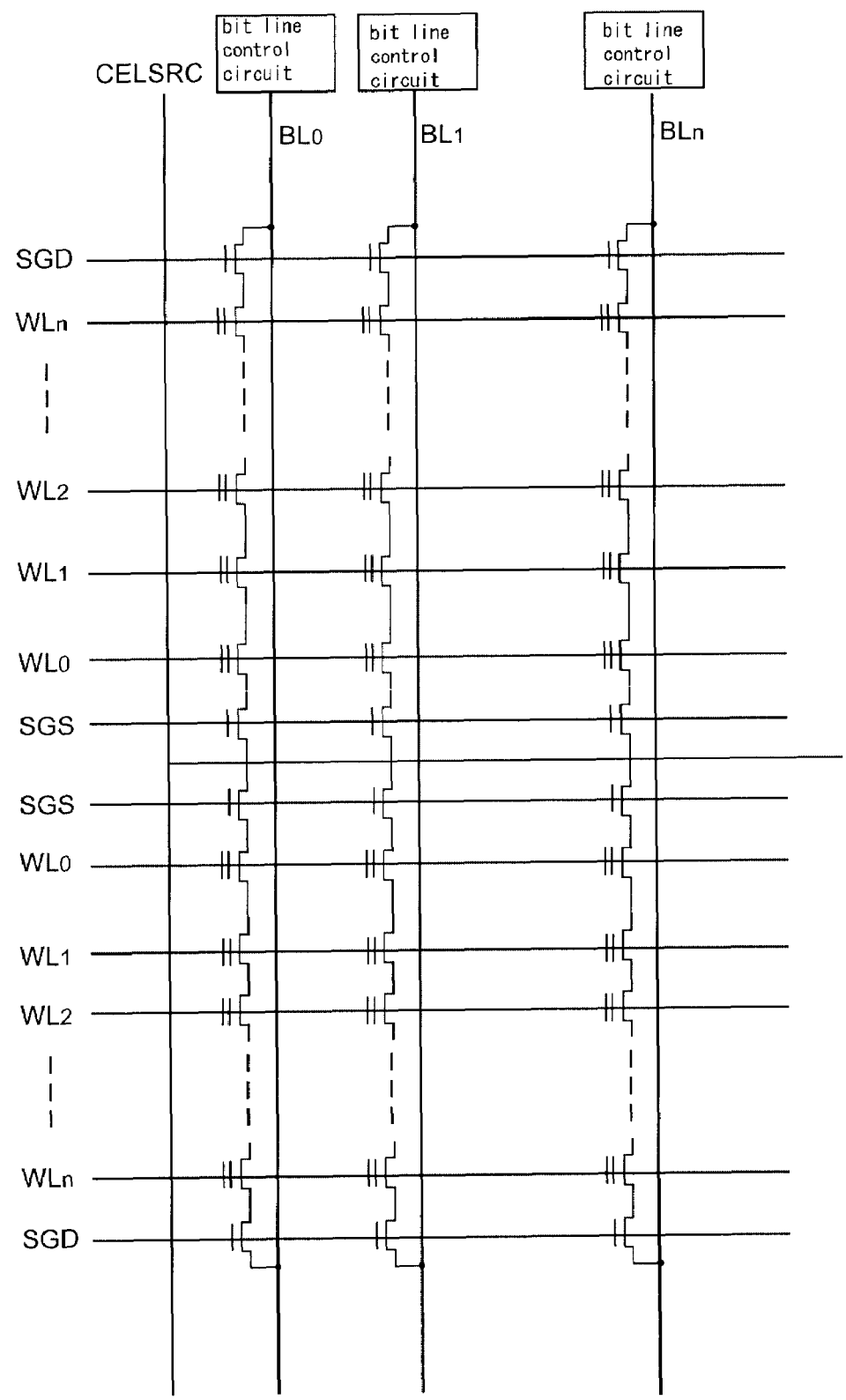
FIG. 28 is an equivalent circuit diagram in which a bit line of a memory cell and a bit line control circuit are connected one to one in one embodiment of this invention.
Figure 29:
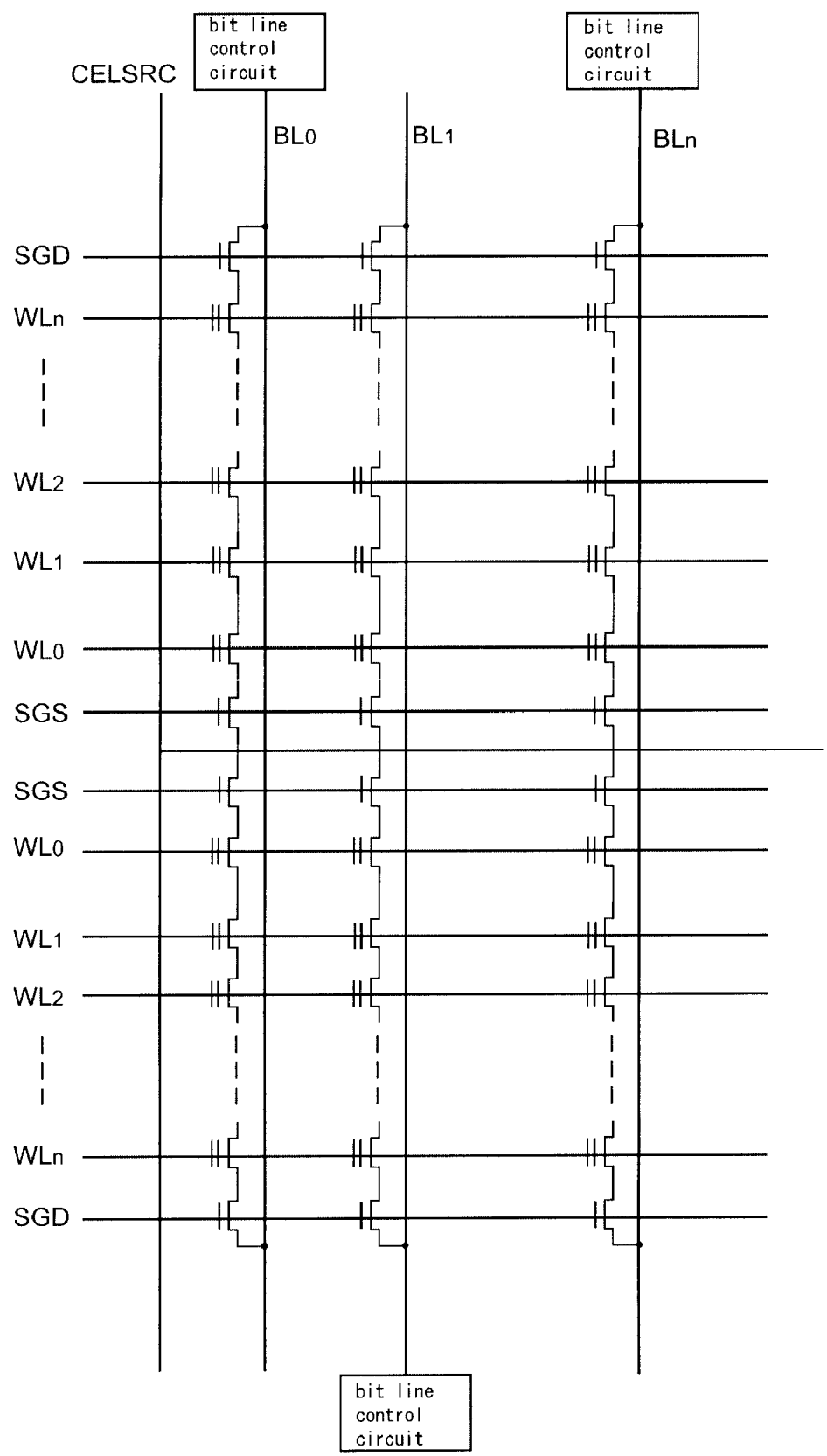
FIG. 29 is an equivalent circuit diagram in which a bit line of a memory cell and a bit line control circuit are connected one to one in one embodiment of this invention.

In addition, this phenomenon particularly occurs when a bit line and a bit line control circuit are connected one to one. In FIG. 28, each bit line control circuit is connected to the same one end part of each bit line. In FIG. 29, each bit line control circuit is arranged at alternate ends of each bit line.

A bit line and a bit line control circuit are connected one to one as shown In FIG. 28 and FIG. 29. At the time of verification, SGS is made "L" and SGD is made "H" and a NAND cell unit is charged via a bit line. Then, after SGD is made "L" and a verify voltage is applied to a selected word line and a pass voltage is applied to a non-selected word line. In this state, SGS and SGD are made "H" and a detection of a voltage shift in all the bit lines is performed by a sense amplifier of the bit line control circuit.

An example of a detection operation of a voltage shift of bit lines is explained. In this example the detection operation is carried out in two stages. First, memory cells whose threshold levels are apparently lower than the verify voltage level are detected and the bit lines connected to such memory cells are discharged to the voltage level of the source line CELSRC (for example the ground level). The first stage is done because if such memory cells are not detected and the bit lines connected to such memory cells are not discharged the current flow to the source line CELSRC becomes large. Second, only the voltage shift of bit lines connected to memory cells whose threshold levels are almost equal to the verify voltage level is detected. By discharging bit lines connected to memory cells whose threshold levels are apparently low, when the SGD and SGS are set to "H", the current flow from bit lines to source line CELSRC at the second stage is smaller than that at the first stage. Therefore at the second stage, the increase of the voltage level of the source line CELSRC, which is induced by the electric resistance of CELSRC, is prevented. However, as a programming operation progresses, the current flow from bit lines to the source line CELSRC increases even at the second stage. This is because the threshold levels of memory cells to be programmed go higher as a programming operation progresses and the number of bit lines discharged at the first stage decreases. By this, as a programming operation progresses, the threshold levels of the memory cells to which data programming is done go gradually higher.

However, by stepping up a verify voltage, as a programming operation progresses, the number of memory cells which becomes ON by applying the verify voltage can be kept constant or decreasing at the second stage. So it is possible to perform verification in accordance with a rise in the voltage of the source line CELSRC. As a result, a rise of the memory threshold level can be cancelled out.

Therefore, by fixing a low verify voltage and by stepping up a verify voltage it is possible to improve the controllability of a memory cell threshold level.

In addition, it is possible to realize various usage examples and improved examples based on the explanation stated in the second embodiment of the present invention. For example, the fourth embodiment of the present invention may be used with a memory cell which is adjacent to a selection gate transistor and other embodiments may be used with other memory cells.

(Change in Selected Word Line Voltage with Time)

A change with time in a selected word line of a nonvolatile semiconductor memory device related to some embodiments of the present invention will be explained below.

Figure 30:
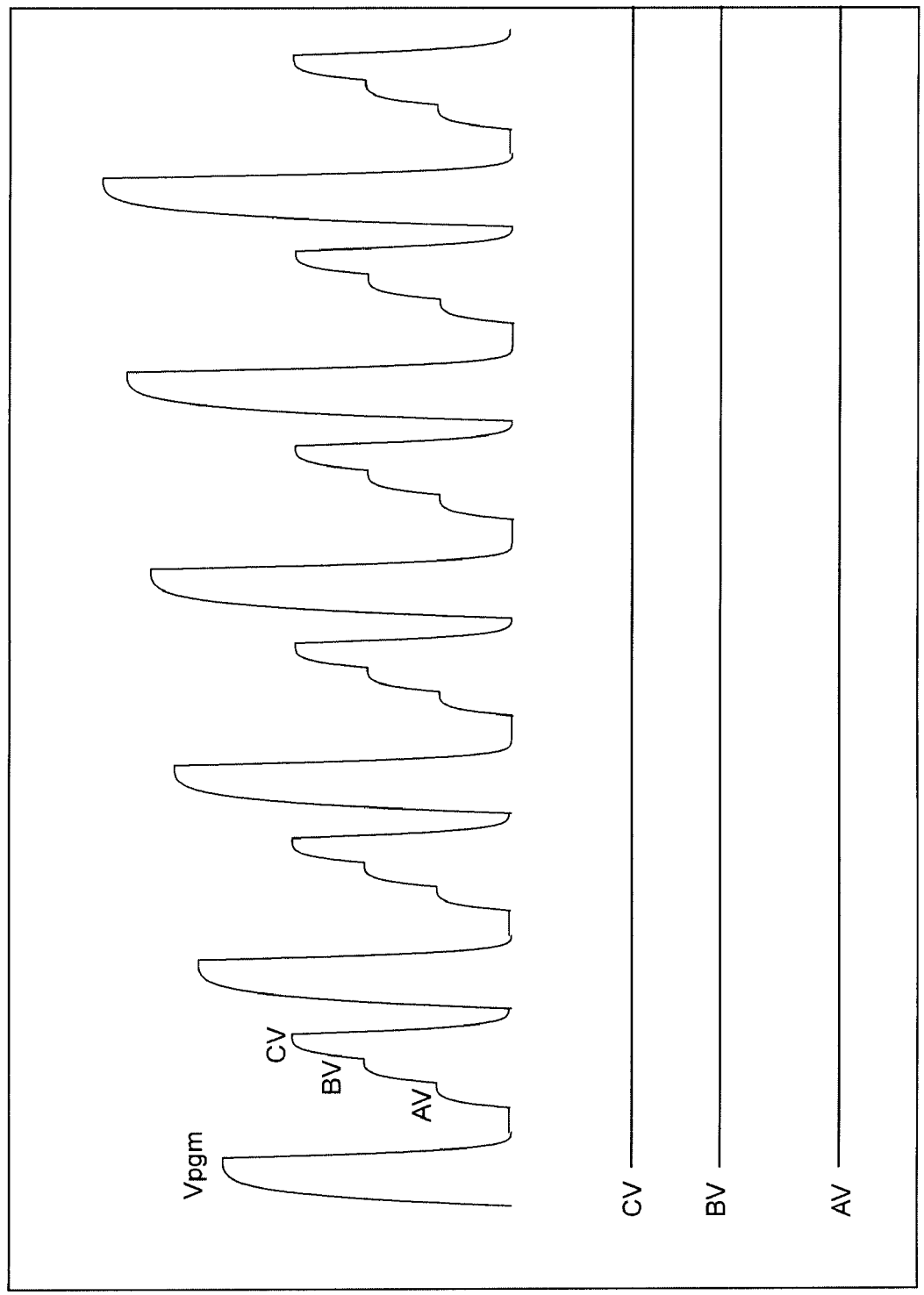
FIG. 30 is an example drawing of a change of a voltage which is applied to a word line in one embodiment of this invention.

FIG. 30 shows one example of a voltage change corresponding to the time of a selected word line in the case where a low verify voltage is not used, a verify voltage is not stepped up and where a voltage Vpgm which is applied to a word line is stepped up. Four valued data is programmed into a memory cell. Threshold levels which correspond to each of these is called Level E, Level A, Level B and Level C and the voltage value of the threshold levels Level A, Level B and Level C is described as AV, BV and CV. In this case, Vpgm is applied to a word line and data is programmed to a memory cell. After this, AV, BV and CV are applied in order as a verify voltage. If a verification fails, next Vpgm which has been stepped up is applied to a selected word line and AV, BV and CV are applied in order as a verify voltage.

Figure 31:
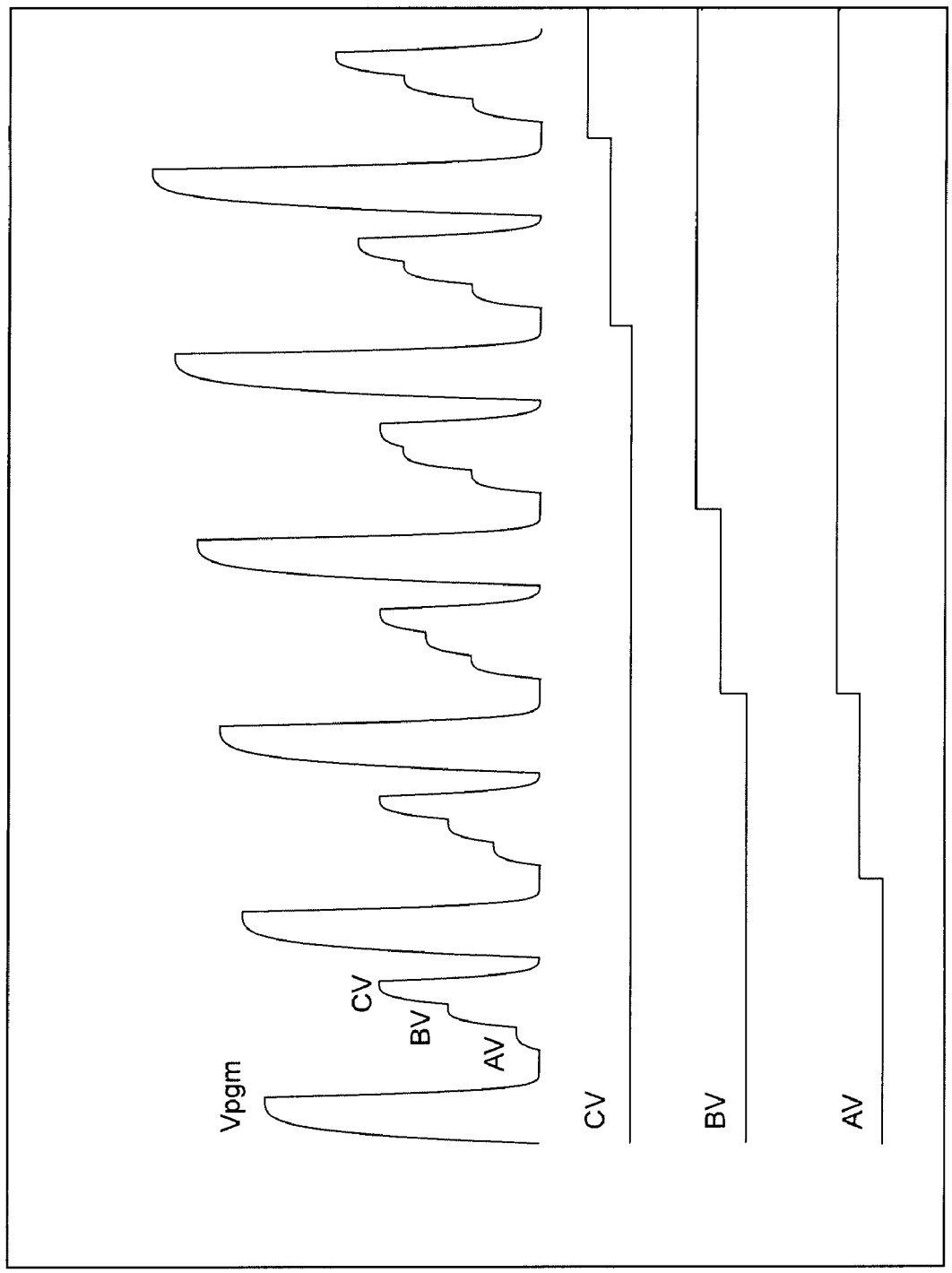
FIG. 31 is an example drawing of a change of a voltage which is applied to a word line in one embodiment of this invention.

FIG. 31 shows one example of a voltage change corresponding to the time of a selected word line in the case where a low verify voltage is not used but a verify voltage is stepped up and where a voltage Vpgm which is applied to a word line is stepped up. As in FIG. 30, four valued data is programmed into a memory cell. In this case, Vpgm is applied to a word line and data is programmed to a memory cell. After this, AV, BV and CV are applied in order as a verify voltage. If a verification fails, next Vpgm which has been stepped up is applied and AV, BV and CV are applied in order as a verify voltage. At this time, after the second application of Vpgm, AV is stepped up and after the third application of Vpgm AV and BV are stepped up and after the fourth and fifth application of Vpgm, CV is stepped up. Therefore, FIG. 31 shows one example of a voltage change in a word line of the first embodiment of the present invention.

Figure 32:
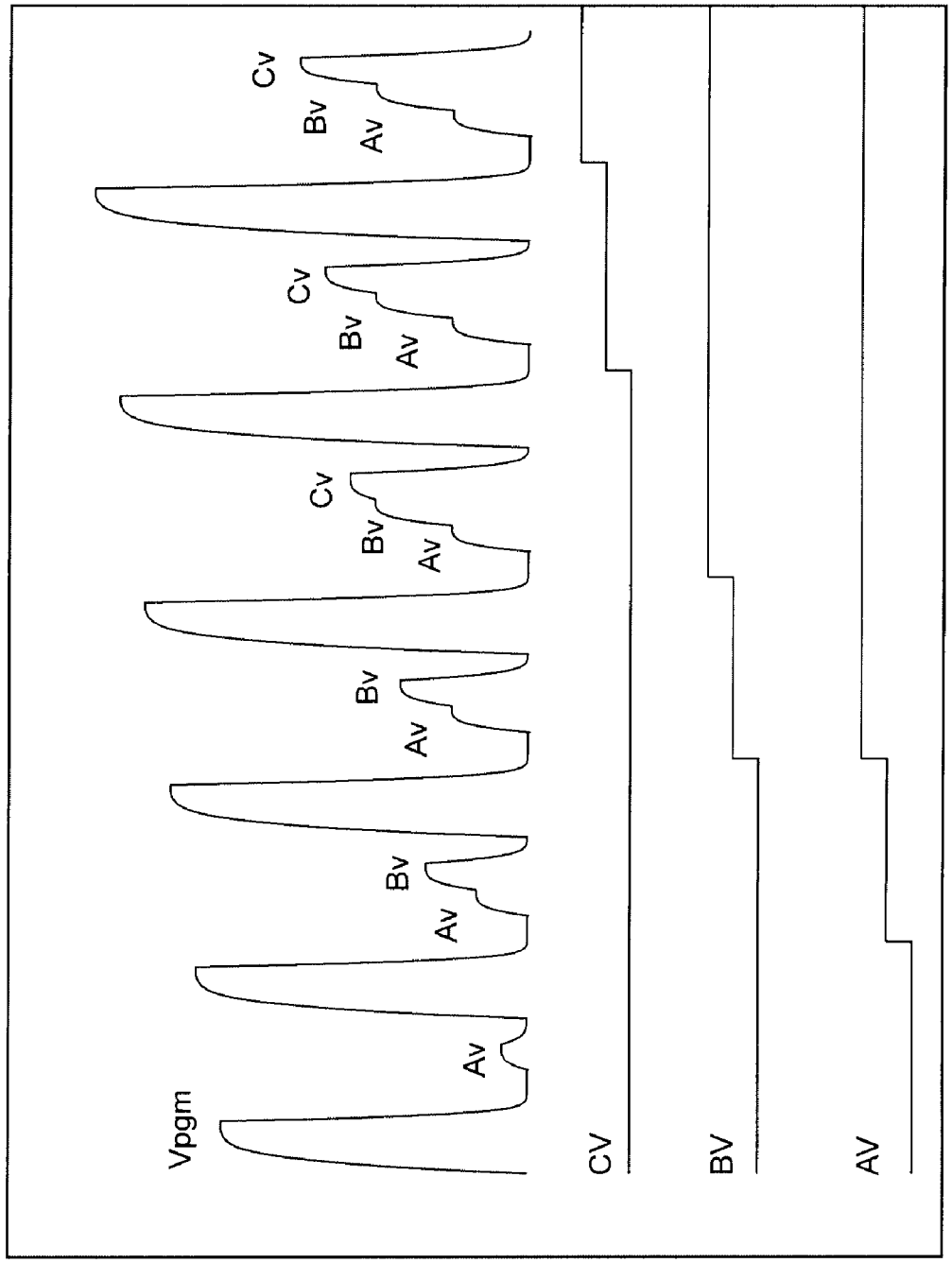
FIG. 32 is an example drawing of a change of a voltage which is applied to a word line in one embodiment of this invention.

FIG. 32 is a variation of the change in FIG. 31. As in FIG. 31, a memory cell is programmed with four valued data. In this example, the application of a verify voltage corresponding to one part of a threshold among a plurality of threshold values is omitted according to a programming voltage Vpgm value. That is, while a programming voltage Vpgm is low, data can be programmed to a memory cell corresponding to a low threshold level but data can not be programmed corresponding to a high threshold level. Consequently, while a programming voltage Vpgm is low, the application of a verify voltage corresponding to a high threshold value is omitted. In addition, in the case where a memory cell which is programmed with data corresponding to a high threshold level does not exist, because there is no need to apply a verify voltage corresponding to this high threshold value, it can be omitted.

In FIG. 32 after a first application of Vpgm, only AV is applied, after a second and third application of Vpgm, AV and BV are applied and after a fourth and subsequent applications of Vpgm, AV, BV and CV are applied.

Figure 33:
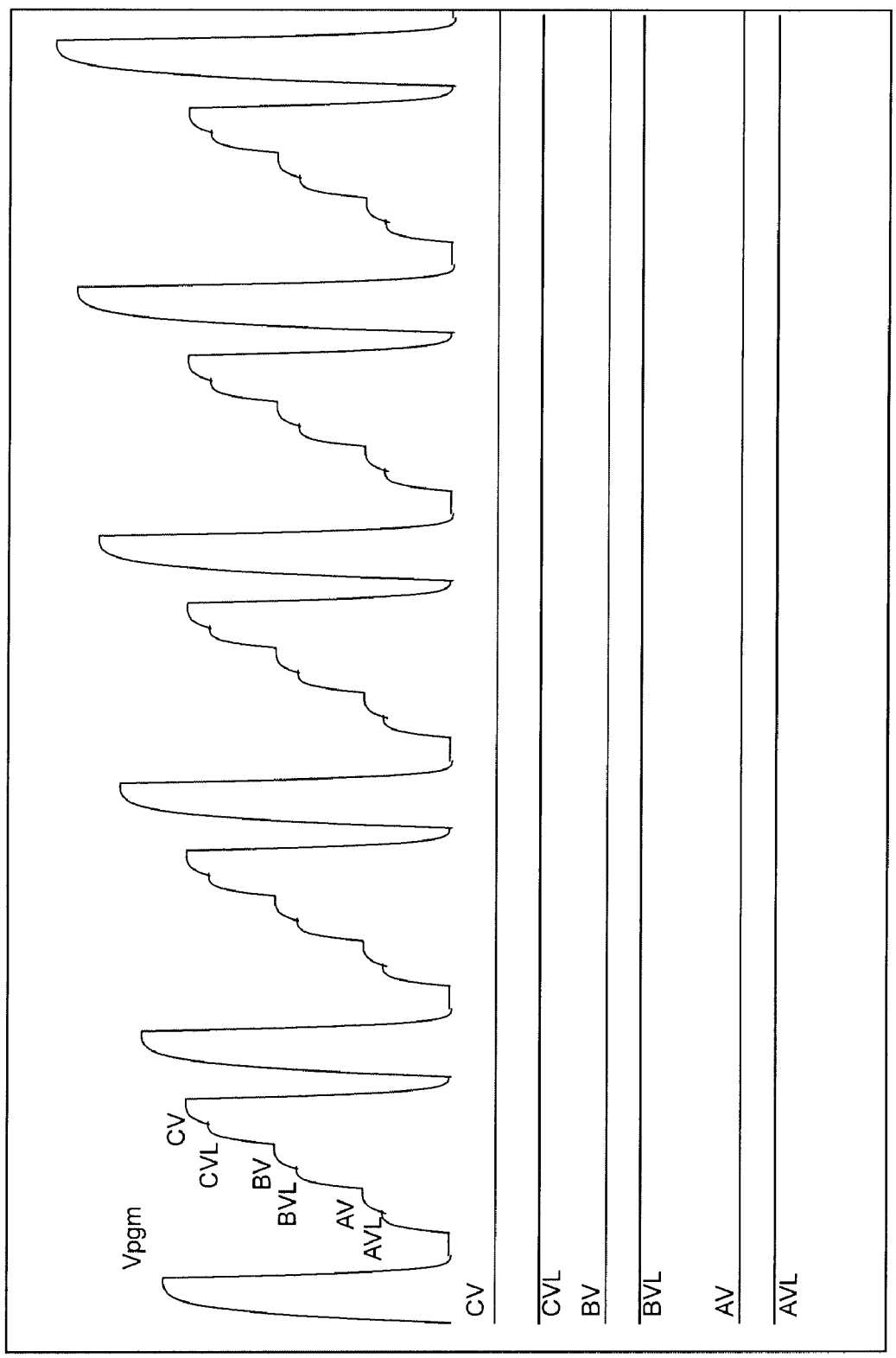
FIG. 33 is an example drawing of a change of a voltage which is applied to a word line in one embodiment of this invention.

FIG. 33 shows an example of a voltage change according to the time of selected word line in the case where a low verify voltage is used, a verify voltage is not stepped up and Vpgm which is applied to a selected word line is stepped up. Four valued level data is programmed to a memory cell as in FIG. 30. In FIG. 33 a voltage Vpgm is applied to a word lien and data is programmed to a memory cell. After this, a low verify voltage AVL, a verify voltage AV and a low verify voltage BVL are applied as a verify voltage, BV is applied as a verify voltage CVL is applied as a low verify voltage and CV is applied as a verify voltage.

Figure 34:
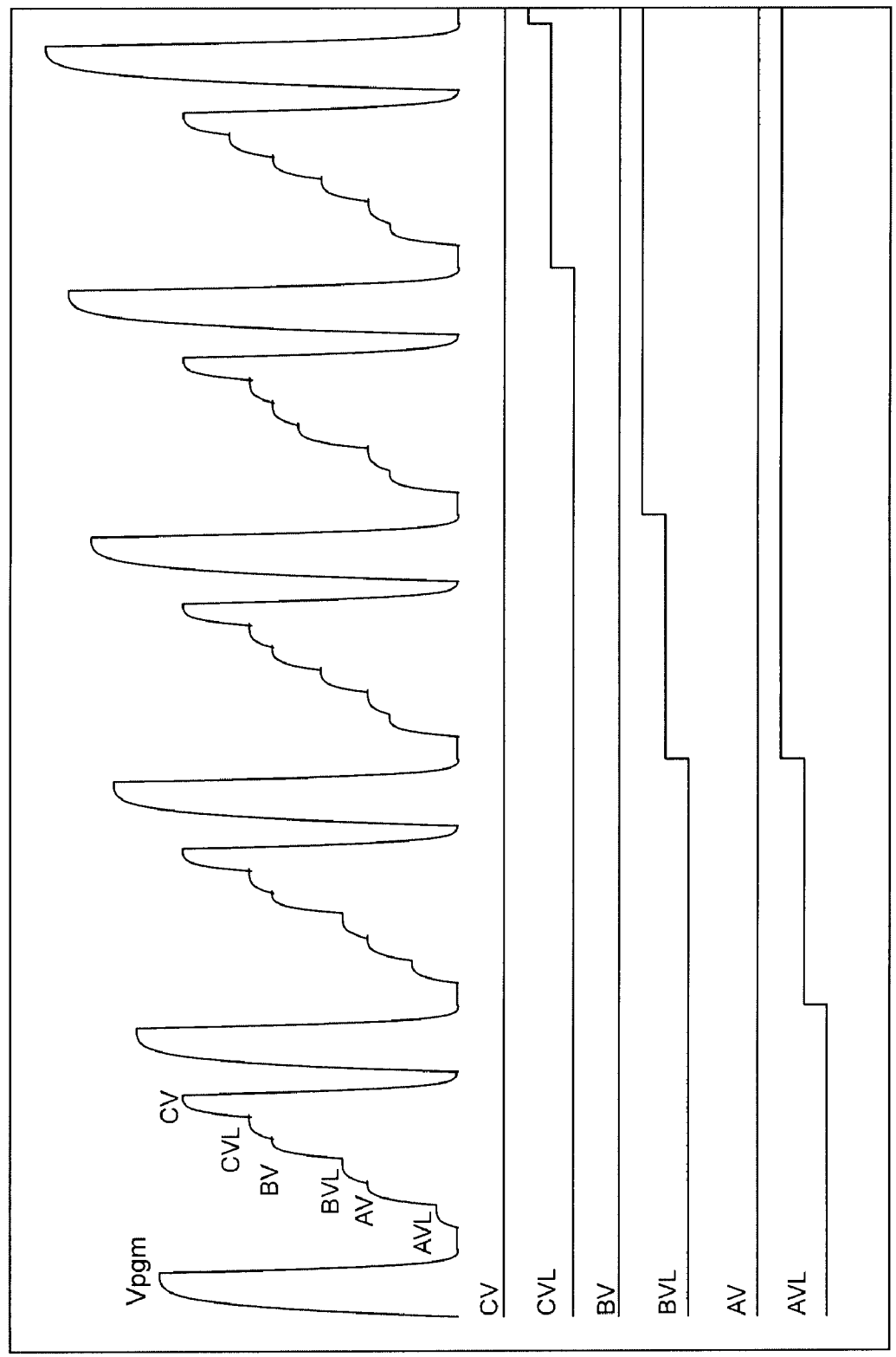
FIG. 34 is an example drawing of a change of a voltage which is applied to a word line in one embodiment of this invention.

FIG. 34 shows an example of a change according to the time of selected word line in the case where a low verify voltage is stepped up, a verify voltage is not stepped up and Vpgm which is applied to a selected word line is stepped up. Four valued data is programmed to a memory cell as in FIG. 30. In this case, as in FIG. 33, a low verify voltage AVL, a verify voltage AV and a low verify voltage BVL are applied as a verify voltage, BV is applied as a verify voltage CVL is applied as a low verify voltage and CV is applied as a verify voltage. However, in FIG. 34, after a second application of Vpgm, AVL is stepped up, after a third application of Vpgm, AVL and BVL are stepped up, after a fourth application of Vpgm, BVL is stepped up and after a fifth application of Vpgm, CVL is stepped up. Therefore, FIG. 34 shows one example of a voltage change of a selected word line in the fourth embodiment of the present invention.

Figure 35:
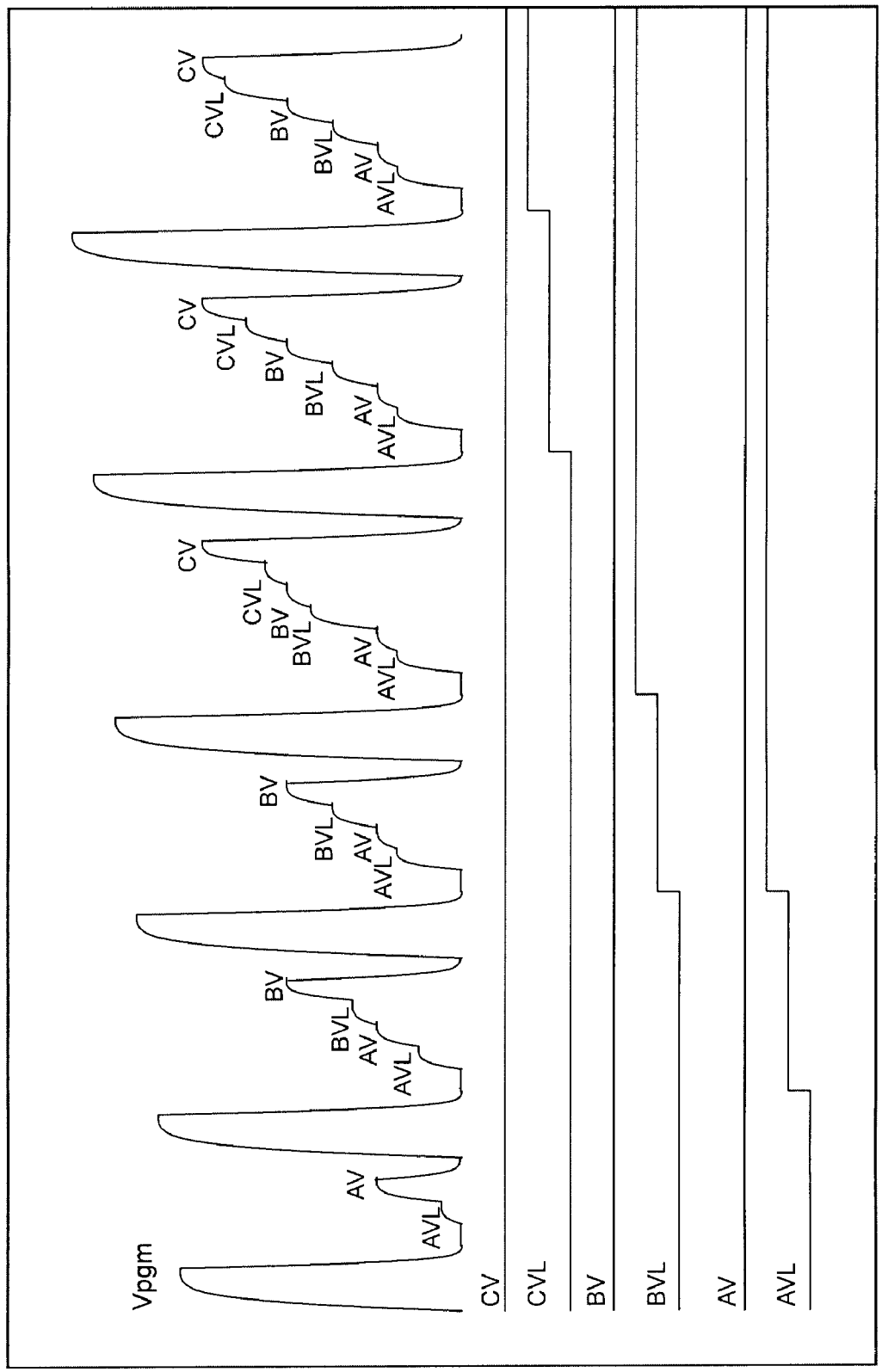
FIG. 35 is an example drawing of a change of a voltage which is applied to a word line in one embodiment of this invention.

FIG. 35 is a variation of the change in FIG. 34. Four valued data is programmed to a memory cell as in FIG. 30. In this example, the application of a verify voltage corresponding to a threshold value of one part among a plurality of threshold levels is omitted according to a programming voltage Vpgm value. That is, while a programming voltage Vpgm is low, data corresponding to a low threshold level can be programmed to a memory cell but data corresponding to a high threshold level can not be programmed. Consequently, the application of a verify voltage corresponding to a high threshold level is omitted. In addition, in the case where a memory cell which is programmed with data corresponding to a high threshold level does not exist, because there is no need to apply a verify voltage corresponding to this high threshold value, it can be omitted.

In FIG. 35, in a first application of Vpgm, AVL and AV are applied, after a second and third application of Vpgm, AVL, AV, BVL and BV are applied, after a fourth and subsequent application of Vpgm, AV, BV and CV are applied. The stepping up of AVL, BVL and CVL is the same as in the case in FIG. 34.

Figure 36:
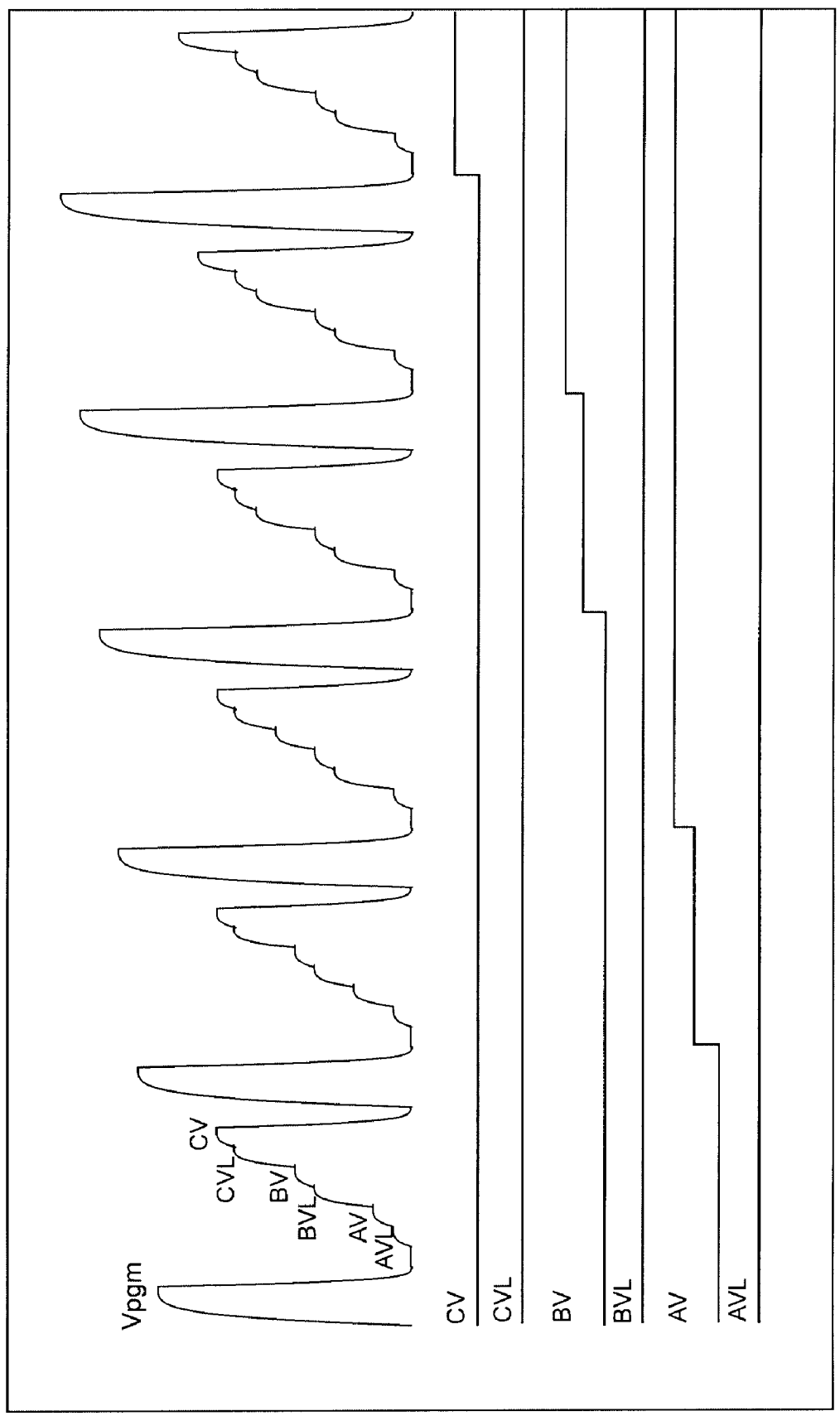
FIG. 36 is an example drawing of a change of a voltage which is applied to a word line in one embodiment of this invention.

FIG. 36 shows an example of a change according to the time of selected word line in the case where a low verify voltage is not stepped up, a verify voltage is stepped up and Vpgm which is applied to a selected word line is stepped up. Four valued data is programmed to a memory cell as in FIG. 30. In FIG. 36, the verify voltages AV, BV and CV are stepped up as in FIG. 32, however, the low verify voltages AVL, BVL and CVL are not stepped up. Therefore, FIG. 36 can be said to correspond to the third embodiment of the present invention.

Figure 37:
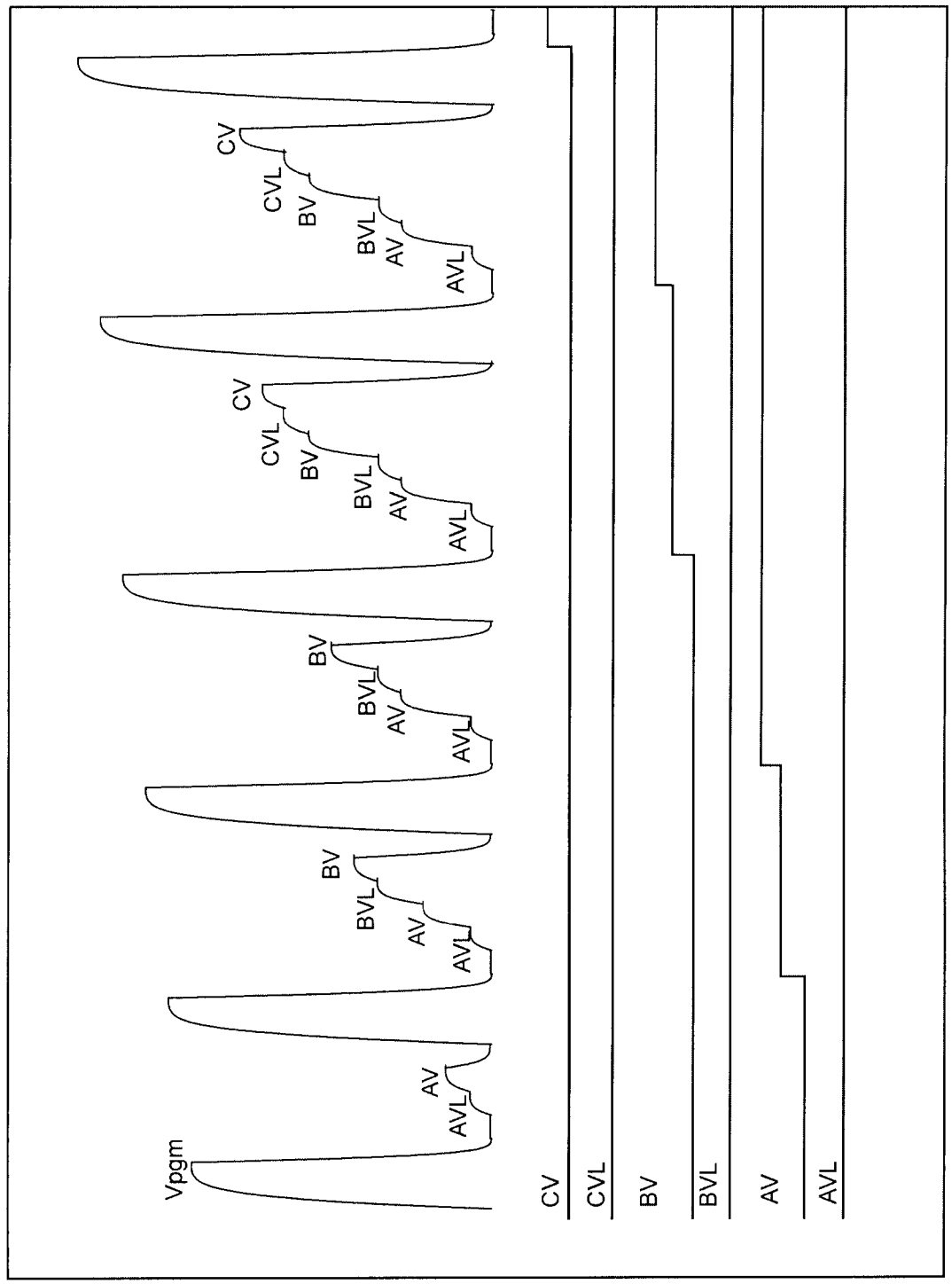
FIG. 37 is an example drawing of a change of a voltage which is applied to a word line in one embodiment of this invention.

FIG. 37 is a variation of FIG. 36. Four valued data is programmed to a memory cell as in FIG. 30. In this example, the application of a low verify voltage and a verify voltage corresponding to a threshold value of one part among a plurality of threshold levels is omitted according to a programming voltage Vpgm value. That is, while a programming voltage Vpgm is low, data corresponding to a low threshold level can be programmed to a memory cell but data corresponding to a high threshold level can not be programmed. Consequently, the application of a verify voltage corresponding to a high threshold level is omitted. In addition, in the case where a memory cell which is programmed with data corresponding to a high threshold level does not exist, because there is no need to apply a verify voltage corresponding to this high threshold value, it can be omitted.

Furthermore, in an actual nonvolatile semiconductor memory device, for example, there is a case where a low verify voltage or a verify voltage of the threshold level Level A becomes 0V, ad when a time change of a selected word line voltage as in FIG. 30 to FIG. 37, is measured, there are cases where the application of verify voltage of 0V or a low verify voltage of 0V does not arise. In addition, in FIG. 30 to FIG. 37, cases where a low verify voltage and a verify voltage are applied in ascending order of a threshold level, however, in an actual nonvolatile semiconductor memory device, there may be cases where they are applied in a different order.

Other Embodiments

An example of a verify voltage which is stepped up and data which is programmed to a memory cell was explained in detail mainly as a first embodiment of the present invention. A low verify voltage and a verify voltage which are stepped up and data which is programmed to a memory cell has been explained in detail mainly as a second embodiment in the present invention. As a third embodiment of the present invention, a low verify voltage which is kept substantially constant, a verify voltage which is stepped up and data which is programmed to a memory cell has been mainly explained in detail. As a fourth embodiment of the present invention, a low verify voltage which is stepped up, a verify voltage which is kept substantially constant and data which is programmed to a memory cell has been mainly explained in detail.

As initially stated, the present invention should not be interpreted as being limited to these embodiments. For example, with regards to Level A, a low verify voltage may not be stepped up and a verify voltage may be stepped up as in the third embodiment of the present invention, for Level B, a low verify voltage and a verify voltage may both be stepped up as in the second embodiment of the present invention and for Level C, a verify voltage may be stepped up and a low verify voltage may not be used as in the first embodiment of the present invention. That is, an embodiment in which a verify voltage is applied may be different according to a threshold level.

In addition, in the case of using a low verify voltage, the case in which one Vreg value is used has been explained above, however, a plurality of Vreg values may be set. Also, one from a plurality of Vreg is selected and may be applied to a bit line according to the number of times a programming voltage Vpgm is applied to a selected word line.

In addition, with regards to one word line, the second embodiment of the present invention may be used for a verify voltage at the time of applying an initial programming voltage Vpgm from a first application to, for example, a third application, a third embodiment of the present invention may be used for a verify voltage at the time of applying a medium ten programming voltage Vpgm, for example, from a fourth application to a tenth application and a first embodiment of the present invention may be used for a verify voltage at the time of a tenth and all subsequent applications of a programming voltage Vpgm. That is, embodiments in which a verify voltage is applied can be different according to the number of times a memory cell is programmed.

In addition, with regards to one block, embodiments in which a verify voltage is applied may be different according to the position of a word line.

In addition, embodiments in which a verify voltage is applied may be different according to the length of overall operation time of a nonvolatile semiconductor memory device.

In addition, according to one embodiment of the present invention, it is possible to provide a nonvolatile semiconductor memory device arranged with a memory cell array including a plurality of electrically reprogrammable nonvolatile memory cells each having a plurality of threshold levels corresponding to a plurality of programming data respectively; a voltage generator circuit which generates a plurality of verify voltage pulses of a first programming method and a plurality of verify voltage pulses of a second programming method, said plurality of verify voltage pulses being applied to corresponding said nonvolatile memory cells; a counter circuit which counts the number of times said programming voltage pulse is applied to corresponding said nonvolatile memory cell; a storage circuit which stores a plurality of data corresponding to said verify voltage pulses of said first programming method and a plurality of data corresponding to said verify voltage pulses of said second programming method, said plurality of data being set for each of corresponding said threshold levels, the number of times said programming voltage pulse of said first programming method is applied, the number of times said programming voltage pulse of said second programming method is applied, said number of times being standards for switching a plurality of said verify voltage pulses; a comparison circuit which outputs a first comparison result, said result showing a comparison of the number of times said programming voltage pulse is applied for each corresponding said threshold level with said standards of said first programming method, and a second comparison result, said result showing a comparison of the number of times said programming voltage pulse is applied for each corresponding said threshold level with said standards of said second programming method, and; a control circuit which controls said plurality of verify voltage pulses of said first programming method step by step based on said first comparison result, said plurality of verify voltage pulses of said second programming method step by step based on said second comparison result, and the voltage of a bit line in said memory cell array based on a verification result of the first programming method.

In the second embodiment of the present invention, the number of the verify voltages in the first programming method may be more than or equal to two while there is only one verify voltage in the second programming method. Alternatively, there is only one verify voltage in the first programming method, while the number of the verify voltages in the second programming method may be more than or equal to two.

In addition, according to an embodiment of the present invention, in the nonvolatile semiconductor memory device stated above, it is possible that a memory cell in which a plurality of verify voltages of a first programming method are to be switched and/or a memory cell in which a plurality of verify voltages of a second programming method are to switched, are nonvolatile memory cells adjacent to a selection gate transistor.

In addition, according to one embodiment of the present invention, in the nonvolatile semiconductor memory device stated above, the control circuit can control the amount of change of a nonvolatile memory cell which is not adjacent to a selection gate transistor so that it is less than the amount of change of a nonvolatile memory cell which is adjacent to a selection gate transistor among the change amount of a voltage at the time of switching a plurality of verify voltages of a first programming method and/or a plurality of verify voltages of a second programming method.

Also, according to one embodiment of the present invention, in the nonvolatile semiconductor memory device stated above, in a nonvolatile memory cell which is commonly connected to a word line, it is possible to set a higher threshold level of a nonvolatile memory cell which is adjacent to the nonvolatile memory cell in which a plurality of verify voltages of a first programming method are to be switched and/or a memory cell in which a plurality of verify voltages of a second programming method are to switched, in the case where programming is not completed.

Also, according to one embodiment of the present invention, in the nonvolatile semiconductor memory device stated above, the nonvolatile memory cell in which a plurality of verify voltages of a first programming method are to be switched and/or a memory cell in which a plurality of verify voltages of a second programming method are to switched can be a nonvolatile memory cell in which the order of setting of a threshold level of the nonvolatile memory cell is before all other nonvolatile memory cells or one part.

Also, according to one embodiment of the present invention, in the nonvolatile semiconductor memory device stated above, it is possible to apply 0V to a bit line which is connected to nonvolatile memory cell in which a verify voltage of a first programming method is switched and a threshold level is set, and a voltage between 0V and a program forbidden voltage to a bit line which is connected to nonvolatile memory cell in which a verify voltage of a second programming method is switched and a threshold level is set.

What is claimed is:

1. A nonvolatile semiconductor memory device comprising;
 a memory cell array including a plurality of electrically reprogrammable nonvolatile memory cells each having a plurality of threshold levels corresponding to a plurality of programming data respectively;

a voltage generator circuit which generates a plurality of programming voltage pulses and a plurality of verify voltage pulses which are applied to said nonvolatile memory cells;

a counter circuit which counts the number of times said programming voltage pulse is applied to corresponding said nonvolatile memory cell;

a storage circuit which stores data corresponding to said plurality of verify voltage pulses which are set for each of corresponding said threshold levels and the number of times said programming voltage pulse is applied, the number of times said programming voltage pulse is applied being standards for switching a plurality of said verify voltage pulses;

a comparison circuit which compares the number of times said programming voltage pulse is applied with said standards and generates a comparison result;

a control circuit which controls said plurality of verify voltage pulses step by step based on said comparison result.

2. The nonvolatile semiconductor memory device according to claim 1 wherein, said control circuit controls a voltage change amount at the time of switching a plurality of said verify voltage pulses so that said amount changes according to said threshold level.

3. The nonvolatile semiconductor memory device according to claim 2 wherein, the smaller said threshold level is, the larger the amount of voltage change becomes at the time of switching said plurality of verify voltage pulses.

4. The nonvolatile semiconductor memory device according to claim 1 wherein, said control circuit changes an amount of voltage change at the time of switching said plurality of verify voltage pulses according to a positional relationship between said nonvolatile memory cell and a selection gate transistor.

5. The nonvolatile semiconductor memory device according to claim 4 wherein, said control circuit controls said amount of voltage change of a nonvolatile memory cell which is adjacent to said selection gate transistor so that said amount of voltage change is larger than said amount of voltage change of a nonvolatile memory cell which has a different position.

6. The nonvolatile semiconductor memory device according to claim 1 wherein, said nonvolatile memory cell in which said plurality of verify voltage pulses are to be switched, is a nonvolatile memory cell adjacent to a selection gate transistor.

7. The nonvolatile semiconductor memory device according to claim 1 wherein, said nonvolatile memory cell in which said plurality of verify voltage pulses are to be switched is a nonvolatile memory cell in which the order of setting of a threshold level of said nonvolatile memory cell is before all or a part of other nonvolatile memory cells to be programmed.

8. The nonvolatile semiconductor memory device according to claim 7 wherein, the earlier in the order said nonvolatile memory cell is set with a threshold voltage, the lower the verify voltage pulse which is used among said plurality of verify voltage pulses.

9. A nonvolatile semiconductor memory device having;

a memory cell array including a plurality of electrically reprogrammable nonvolatile memory cells each having a plurality of threshold levels corresponding to a plurality of programming data respectively;

a voltage generator circuit which generates a plurality of verify voltage pulses of a first programming method and a verify voltage pulse of a second programming method, said plurality of verify voltage pulses being applied to corresponding said nonvolatile memory cells;

a counter circuit which counts the number of times said programming voltage pulse is applied to corresponding said nonvolatile memory cell;

a storage circuit which stores a first data corresponding to said plurality of verify voltage pulses of said first programming method, and the number of times said programming voltage pulse of said first programming method is applied, said first data being set for each of corresponding said threshold levels, and said number of times being standards for switching a plurality of said verify voltage pulses;

a comparison circuit which outputs a first comparison result, said result showing a comparison of the number of times said programming voltage pulse is applied for each corresponding said threshold level with said standards of said first programming method, and;

a control circuit which controls said plurality of verify voltage pulses of said first programming method step by step based on said first comparison result, and the voltage of a bit line in said memory cell array based on a verification result of the first programming method.

10. The nonvolatile semiconductor memory device according to claim 9 wherein, any of said plurality of verify voltage pulses of said first programming method has a lower level than said verify voltage pulse of said second programming method.

11. The nonvolatile semiconductor memory device according to claim 9 wherein, a bit line voltage is controlled so that a voltage difference between a channel and a control gate in the case where a programming voltage pulse is applied to a nonvolatile memory cell, said nonvolatile memory cell being set with a threshold level using a verify voltage pulse of said first programming method becomes larger than a voltage difference between a channel and a control gate in the case where a programming voltage pulse is applied to a nonvolatile memory cell, said nonvolatile memory cell being set with a threshold level using a verify voltage pulse of said second programming method.

12. The nonvolatile semiconductor memory device according to claim 11 wherein, 0V is applied to a bit line which is connected to a nonvolatile memory cell in the case where a programming voltage pulse is applied to a nonvolatile memory cell, said nonvolatile memory cell being set with a threshold level using a verify voltage pulse of said first programming method, and a voltage between 0V and a program forbid voltage is applied to bit line which is connected to a nonvolatile memory cell in the case where a programming voltage pulse is applied to a nonvolatile memory cell, said nonvolatile memory cell being set with a threshold level using a verify voltage pulse of said second programming method.

13. The nonvolatile semiconductor memory device according to claim 9 wherein, said control circuit changes an amount of voltage change at the time of switching said plurality of verify voltage pulses according to a positional relationship between said nonvolatile memory cell and a selection gate transistor.

14. The nonvolatile semiconductor memory device according to claim 9 wherein, said nonvolatile memory cell in which said plurality of verify voltage pulses of said first programming method are to be switched is a nonvolatile memory cell adjacent to a selection gate transistor.

15. The nonvolatile semiconductor memory device according to claim 14 wherein, said amount of change of a nonvolatile memory cell which is adjacent to said selection gate transistor is controlled so that said amount is larger than said amount of change of a nonvolatile memory cell which has a different position among a change amount of a voltage at the time of controlling said plurality of verify voltage pulses of said first programming method.

16. The nonvolatile semiconductor memory device according to claim 9 wherein, said voltage generator circuit is capable to generate further a plurality of verify voltage pulses of said second programming method, said storage circuit stores further as a part of second data corresponding to said plurality of verify voltage pulses of said second programming method, said number of times being standards for switching a plurality of said verify voltage level of said second programming method, said comparison circuit outputs a second result, said second result showing a comparison of the number of times said programming voltage pulses applied for each corresponding said threshold level with said standards of said second programming method, and said control circuit controls said plurality of verify voltage pulses of said second programming method step by step based on said second comparison result.

17. The nonvolatile semiconductor memory device according to claim 16 wherein, said nonvolatile memory cell in which said plurality of verify voltage pulses of said second programming method are to be switched is a nonvolatile memory cell adjacent to a selection gate transistor.

18. The nonvolatile semiconductor memory device according to claim 16 wherein, said amount of change of a nonvolatile memory cell which is adjacent to said selection gate transistor is controlled so that said amount is larger than said amount of change of a nonvolatile memory cell which has a different position among a change amount of a voltage at the time of controlling said plurality of verify voltage pulses of said first and second programming method.

19. A nonvolatile semiconductor memory device having;
a memory cell array including a plurality of electrically reprogrammable nonvolatile memory cells each having a plurality of threshold levels corresponding to a plurality of programming data respectively;
a voltage generator circuit which generates a verify voltage pulse of a first programming method and a plurality of verify voltage pulses of a second programming method, said plurality of verify voltage pulses being applied to corresponding said nonvolatile memory cells;
a counter circuit which counts the number of times said programming voltage pulse is applied to corresponding said nonvolatile memory cell;
a storage circuit which stores a data corresponding to said plurality of verify voltage pulses of said second programming method, and the number of times said programming voltage pulse of said second programming method is applied, said data being set for each of corresponding said threshold levels, and said number of times being standards for switching a plurality of said verify voltage pulses;
a comparison circuit which outputs a comparison result, said result showing a comparison of the number of times said programming voltage pulse is applied for each corresponding said threshold level with said standards of said second programming method, and;
a control circuit which controls said plurality of verify voltage pulses of said second programming method step by step based on said comparison result, and the voltage of a bit line in said memory cell array based on a verification result of the first programming method.

20. The nonvolatile semiconductor memory device according to claim 10 wherein, a bit line voltage is controlled so that a voltage difference between a channel and a control gate in the case where a programming voltage pulse is applied to a nonvolatile memory cell, said nonvolatile memory cell being set with a threshold level using a verify voltage pulse of said first programming method becomes larger than a voltage difference between a channel and a control gate in the case where a programming voltage pulse is applied to a nonvolatile memory cell, said nonvolatile memory cell being set with a threshold level using a verify voltage pulse of said second programming method.

* * * * *